United States Patent [19]
Komiya et al.

[11] Patent Number: 5,844,767
[45] Date of Patent: Dec. 1, 1998

[54] LEVEL CONVERTING CIRCUIT FOR CONVERTING LEVEL OF AN INPUT SIGNAL, INTERNAL POTENTIAL GENERATING CIRCUIT FOR GENERATING INTERNAL POTENTIAL, INTERNAL POTENTIAL GENERATING UNIT GENERATING INTERNAL POTENTIAL HIGHLY RELIABLE SEMICONDUCTOR DEVICE AND METHOD OF

[75] Inventors: Yuichiro Komiya; Tsukasa Ooishi; Hideto Hidaka; Mikio Asakura, all of Hyogo, Japan

[73] Assignee: Mitsubishi Denki Kabushiki Kaisha, Tokyo, Japan

[21] Appl. No.: 675,760

[22] Filed: Jul. 3, 1996

[30] Foreign Application Priority Data

| Jul. 20, 1995 | [JP] | Japan | ................................. | 7-184446 |
| Nov. 28, 1995 | [JP] | Japan | ................................. | 7-309603 |

[51] Int. Cl.$^6$ ..................................................... G11C 13/00
[52] U.S. Cl. ................................ 365/189.01; 365/230.01; 365/226
[58] Field of Search ........................ 365/189.01, 230.01, 365/226, 227, 228

[56] References Cited

U.S. PATENT DOCUMENTS 5,193,073  3/1993  Bhuva ..................................... 365/226

FOREIGN PATENT DOCUMENTS

| 57-59690 | 12/1982 | Japan . |
| 2-37823 | 2/1990 | Japan . |
| 4-223713 | 8/1992 | Japan . |
| 4-269011 | 9/1992 | Japan . |

OTHER PUBLICATIONS

"An Efficient Back–Bias Generator with Hybrid Pumping Circuit for 1.5V DRAM's," by Yasuhiko Tsukikawa et al., Mitsubishi Electric Corporation, Itami, Japan.

*Primary Examiner*—Terrell W. Fears
*Attorney, Agent, or Firm*—McDermott, Will & Emery

[57] ABSTRACT

The level converting circuit includes a first current cutting circuit, a second current cutting circuit, a level shift circuit and an inverter. The first current cutting circuit includes two PMOS transistors connected to a node having a boosted potential Vpp. The second current cutting circuit includes two NMOS transistor connected to a ground node. The level shift circuits include two PMOS transistors and two NMOS transistors. Before a through current flows between the node having the boosted potential Vpp and the ground node, any of the transistor included in the first current cutting circuit and any of the transistors included in the second current cutting circuits are turned off. Therefore, through current between the node having the boosted potential Vbb and the ground node can be prevented.

54 Claims, 71 Drawing Sheets

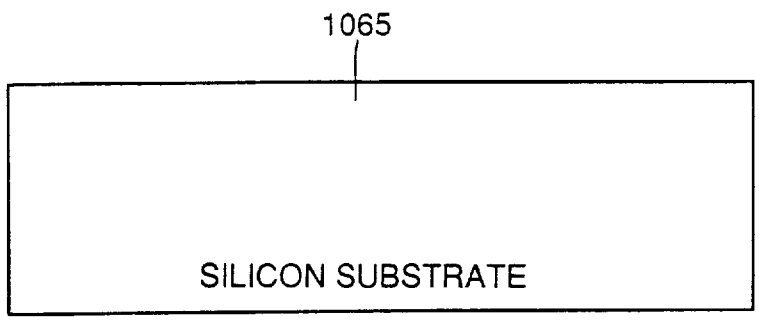
FIG.35 (a) PRIOR ART
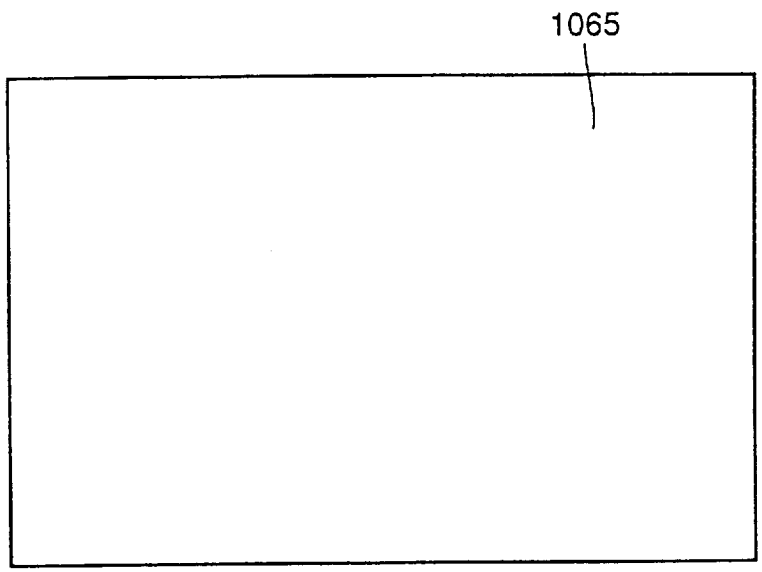
FIG.35 (b) PRIOR ART

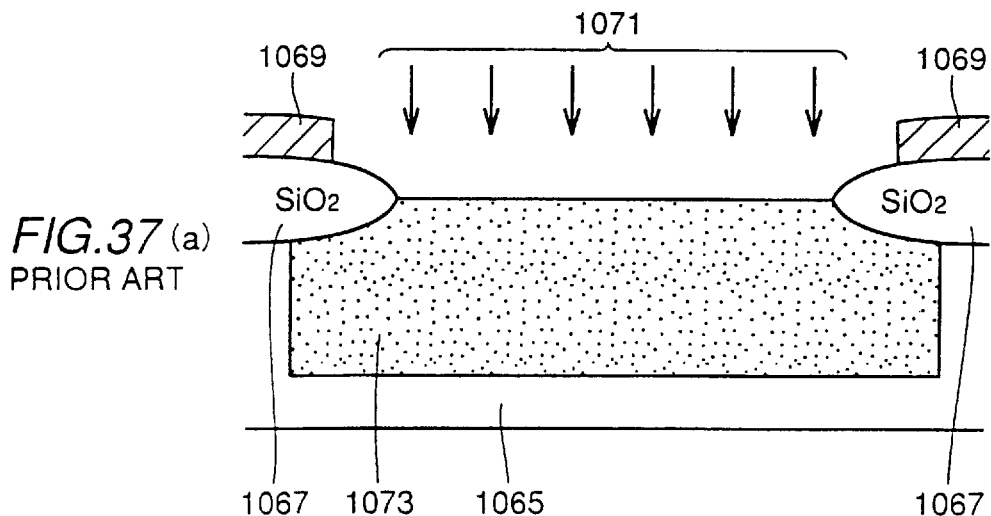
FIG.37 (a) PRIOR ART
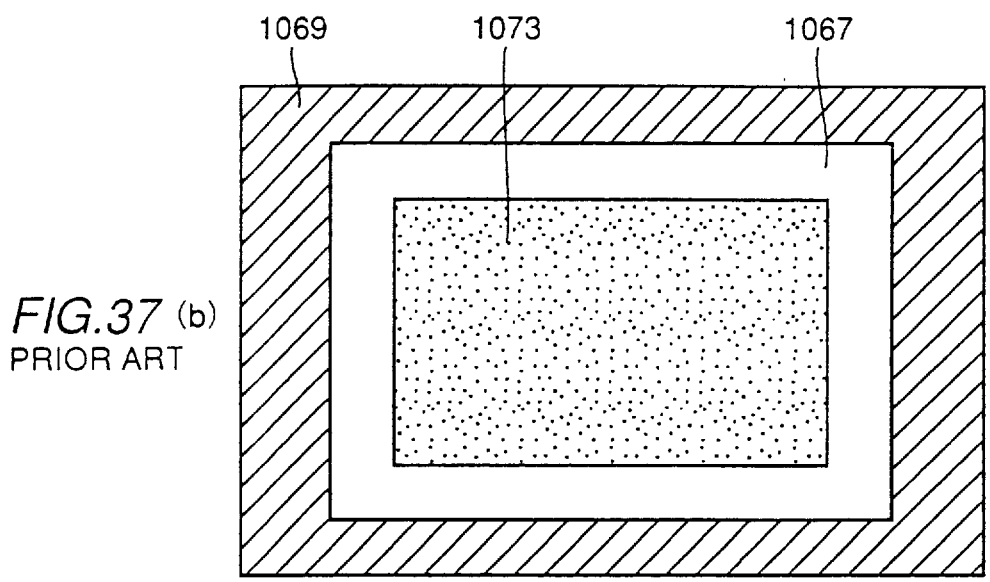
FIG.37 (b) PRIOR ART 1067 1073 1065 1085 1079 1085 1067

1085 1079 1079 1085

«5,844,767»

LEVEL CONVERTING CIRCUIT FOR CONVERTING LEVEL OF AN INPUT SIGNAL, INTERNAL POTENTIAL GENERATING CIRCUIT FOR GENERATING INTERNAL POTENTIAL, INTERNAL POTENTIAL GENERATING UNIT GENERATING INTERNAL POTENTIAL HIGHLY RELIABLE SEMICONDUCTOR DEVICE AND METHOD OF

BACKGROUND OF THE INVENTION

1. Field of the Invention

The present invention relates to a level converting circuit for converting a level of an input signal, an internal potential generating circuit for generating an internal potential, an internal potential generating unit for generating an internal potential, a semiconductor device and method of manufacturing a transistor. More specifically, it relates to a level converting circuit capable of preventing through current, an internal potential generating circuit providing higher efficiency in generating internal potential, an internal potential generating unit facilitating setting of performance, a highly reliable semiconductor device and to a method of manufacturing a transistor having high breakdown voltage.

2. Description of the Background Art

Conventional level converting circuits are disclosed, for example, in Japanese Patent Laying-Open Nos. 4-223713, 4-269011 and 2-37823.

FIG. 75 is a schematic diagram showing a conventional level converting circuit.

Referring to FIG. 75, the conventional level converting circuit includes PMOS transistors 3 and 9, NMOS transistors 5 and 13, and an inverter 17. PMOS transistor 3 and NMOS transistor 5 are connected in series between a ground node and a node having boosted potential Vpp.

PMOS transistor 9 and NMOS transistor 13 are connected in series between the ground node and the node having boosted potential Vpp. PMOS transistor 3 has its gate connected to the drain of NMOS transistor 13. PMOS transistor 9 has its gate connected to the drain of NMOS transistor 5.

A signal IN is input to the gate of NMOS transistor 5. A signal IN inverted by inverter 17 is input to the gate of NMOS transistor 13. A node between PMOS transistor 9 and NMOS transistor 13 is an output node, and a level converted signal OUT is output therefrom.

The operation will be described. The signal IN is a clock signal setting power supply potential Vcc and ground potential GND to "H" (high) level and "L" (low) level, respectively. When the signal IN is at the "H" level, NMOS transistor 5 and PMOS transistor 9 turn on. Thus, the signal OUT having the level of the boosted potential Vpp is output. More specifically, the signal IN having the level of power supply potential Vcc is converted to be the signal OUT having the higher level, that is, the level of the boosted potential Vpp.

When the signal IN is at the "L" level, PMOS transistor 3 and NMOS transistor 13 turn on. Therefore, the signal OUT having the level of the ground potential is output.

However, in the conventional level converting circuits, sometimes PMOS transistor 3 and NMOS transistor 5 or PMOS transistor 9 and NMOS transistor 13 may simultaneously be turned on. When the signal IN is at "L" level, NMOS transistor 5 and PMOS transistor 9 are off. If the signal IN attains to the "H" level next, it is possible that PMOS transistor 9 and NMOS transistor 5 turn on before PMOS transistor 3 and NMOS transistor 13 turn off.

When the signal IN is at the "H" level, PMOS transistor 3 and NMOS transistor 13 are off. It is possible that PMOS transistor 3 and NMOS transistor 13 turn on before PMOS transistor 9 and NMOS transistor 5 turn off, when the next "L" level signal IN is input.

From the foregoing, the conventional level converting circuit experiences the problem that through current flows from the node having boosted potential Vpp to the ground node.

SUMMARY OF THE INVENTION

The present invention was made to solve such a problem, and its object is to provide a level converting circuit which can prevent through current.

Another object of the present invention is to provide an internal potential generating circuit capable of generating internal potential efficiently.

A further object of the present invention is to provide an internal potential generating unit which allows switching of performance easily.

A still another object of the present invention is to provide a highly reliable semiconductor device.

A still further object of the present invention is to provide a method of manufacturing a highly reliable transistor which is not broken even when a high voltage is applied.

The internal potential generating circuit in accordance with the first aspect of the present invention includes a level converting circuit for outputting, in accordance with a signal of a first level input as a pulse, a signal of a second level as a pulse, the level converting circuit being connected between a first node having the second level potential serving as a supply source of the second level signal output therefrom, and a second node having a third level potential. The level converting circuit includes a level shift circuit outputting the second level signal in accordance with the first level signal, including an input portion to which the first level signal is input and an output portion for outputting the second level signal in accordance with the input of the first level signal to the input portion. The input portion or the output portion is set to a state in which current flows through in accordance with transition of the first level signal. The level shift circuit further includes a first current cutting circuit connected between the level shift circuit and a first node, and a second current cutting circuit connected between the level shift circuit and a second node. The first current cutting means cuts current path between the first node and the input portion before the first level signal is input, and cuts current path between the first node and the output portion before input of the first level signal is stopped. The second current cutting means cuts current path between the second node and the output portion before the first level signal is input, and cuts the current path between the second node and the input portion before input of the first level signal is stopped. The internal potential generating circuit further includes a pumping circuit for intermittently outputting charges in accordance with the second level signal output as the pulse from the level converting circuit. The third node, which is the output node of the pumping circuit is set at the second level potential as an internal potential by the intermittently output charges, the first node and the third node being connected to each other. The pumping circuit includes a charge transmitting transistor having its control electrode connected to a fourth node of which potential changes in response to the signal of the second level output as the pulse from the level converting circuit. The charge transmitting transistor turns on when the potential at the fourth node attains to a fourth level in accordance with the output of the second level signal and outputs charges to the third node, with an absolute value of potential difference between the fourth level potential and the second level potential being greater than the absolute value of the threshold voltage of the charge transmitting transistor.

As described above, in the internal potential generating circuit in accordance with the first aspect of the present invention, the level converting circuit cuts current path between a first node having a second level potential and a second node having a third level potential, before a through current flows therethrough. Therefore, through current between the first and second nodes can be prevented.

Further, the charge transfer transistor of the pumping circuit turns on when it receives, at its control electrode, a fourth level potential and output charges to the third node. Therefore, the third node attains to the second level potential.

The absolute value of the difference between the fourth level potential and the second level potential is greater than the absolute value of the threshold voltage of the charge transfer transistor. The third node and the first node are connected, and the level converting circuit outputs the second level signal based on the second level potential at the third node.

Since the absolute value of the difference between the potential at the third node and a potential at the control electrode of the charge transmitting transistor is greater than the absolute value of the threshold voltage of the charge transmitting transistor, charges can be transmitted to the third node with high efficiency.

While the third node and the first node are connected, through current can be prevented between the first and second nodes, and hence internal potential can be generated efficiently.

Preferably, the pumping circuit includes a capacitor performing charge pumping operation, and the capacitor is a depletion transistor.

Since the capacitor performing charge pumping operation is a depletion transistor, a channel is always formed within the operational range of the internal potential generating circuit. Therefore, generation of a leak current caused when the channel disappears can be prevented.

According to a second aspect of the present invention, the internal potential generating circuit includes a level converting circuit for outputting, in accordance with a signal of a first level input as a pulse, a signal of a second level as a pulse. The level converting circuits is connected between a first node having a potential of the second level serving as a supply source of the second level signal output therefrom, and a second node having a potential of a third level. The level converting circuit includes an input portion connected between the first node and the second node, to which the first level signal is input, and an output portion connected between the first and second nodes for outputting the second level signal in response to an input of the first level signal to the input portion. The input portion includes a transistor of a first conductivity type for the input portion having one electrode connected to the first node, a transistor of a second conductivity type having one electrode connected to the second node and receiving at its control electrode the first level signal, a first current cutting circuit for the input portion connected between the other electrode of the transistor of the first conductivity type for the input portion and the third node, and a second current cutting circuit for the input portion connected between the other electrode of the transistor of the second conductivity type for the input portion and the third node. The first current cutting circuit for the input portion cuts a current path between the transistor of the first conductivity type for the input portion and the third node before the first level signal is input, and conducts the transistor of the first conductivity type for the input portion and the third node before the input of the first level signal is stopped. The second current cutting circuit for the input portion cuts a current path between the transistor of the second conductivity type of the input portion and the third node before input of the first level signal is stopped, and conducts the transistor of the second conductivity type for the input portion and the third node before the first level signal is input. The output portion includes a transistor of the first conductivity type for the output portion having one electrode connected to the first node, a transistor of the second conductivity type for the output portion having one electrode connected to the second node and receiving at its control electrode a signal obtained by inverting the first level signal, a first current cutting circuit for the output portion connected between the other electrode of the transistor of the first conductivity type for the output portion and a fourth node, and a second current cutting circuit for the output portion connected between the other electrode of the transistor of the second conductivity type for the output portion and the fourth node. The first current cutting circuit for the output portion cuts a current path between the transistor of the first conductivity type for the output portion and the fourth node before input of the first level signal is stopped, and conducts the transistor of the first conductivity type for the output portion and the fourth node before the input of the first level signal. The second current cutting circuit for the output portion cuts a current path between the transistor of the second conductivity type for the output portion and the fourth node before the first level signal is input, and conducts the transistor of the second conductivity type for the output portion and a fourth node before input of the first level signal is stopped.

The transistor of the first conductivity type for the input portion has its control electrode connected to the fourth node, while the transistor of the first conductivity type for the output portion has its control electrode connected to the third node. The internal potential generating circuit further includes a pumping circuit for intermittently output charges in response to the second level signal output as a pulse from the level converting circuit, a fifth node which is an output node of the pumping circuit being set to the second level potential as the internal potential by the charges intermittently output, and the first node and the fifth node are connected. The pumping circuit includes a charge transmitting transistor having its control electrode connected to the fifth node of which potential changes in response to the second level signal output as the pulse level converting circuit. The charge transmitting transistor turns on when the potential at the sixth node attains to the fourth level in response to the output of the second level signal, and outputs charges to the fifth node. The absolute value of the difference between the fourth level potential and the second level potential is greater than the absolute value of the threshold voltage of the charge transmitting transistor.

In the internal potential generating circuit in accordance with the second aspect of the present invention, the level converting circuit cuts the current path between the first node having the potential of the second level and the second node having the third level potential, before a through current flows therethrough. Therefore, through current between the first and second nodes can be prevented.

The charge transmitting transistor of the pumping circuit turns on when it receives at its control electrode the source level potential, and outputs charges to the fifth node. Consequently, the fifth node attains to the second level potential.

The absolute value of the difference between the fourth level potential and the second level potential is greater than the absolute value of the threshold voltage of the charge transmitting transistor. The fifth node and the first node are connected, and the level converting circuit outputs the second level signal based on the second level potential at the fifth node.

As described above, since the absolute value of the difference between the fifth node potential and the potential at the control electrode of the charge transmitting transistor is larger than the absolute value of the threshold voltage of the charge transmitting transistor, charges can be transmitted to the fifth node efficiently.

Further, while the fifth node and the first node are connected, through current between the first node and the second node can be prevented, and hence internal potential can be generated efficiently.

Preferably, the pumping circuit includes a capacitor performing charge pumping operation, and the capacitor is a depletion transistor.

Since the capacitor performing charge pumping operation is a depletion transistor, there is always a channel formed within the operational range of the internal potential generating circuit. Therefore, generation of a leak current caused by disappearance of a channel can be prevented.

According to a third aspect of the present invention, an internal potential generating unit includes a first internal potential generating circuit for outputting a first internal potential at a first node, a second internal potential generating circuit for outputting a second internal potential at the first node, a first driving signal generating circuit for generating a first driving signal as a pulse for driving the first internal potential generating circuit, a second driving signal generating circuit for generating a second driving signal as a pulse for driving the second internal potential generating circuit, and a control signal generating circuit for generating a control signal controlling the second driving signal generating circuit. The second driving signal generating circuit controls generation of the second control signal, in accordance with the control signal.

In the internal potential generating unit in accordance with the third aspect of the present invention, the second driving signal generating circuit controls generation of the second driving signal in accordance with the control signal from the control signal generating circuit. Therefore, on/off of the second internal potential generating circuit is controlled by the control signal. Therefore, performance of the internal potential generating unit can be easily switched simply by changing the level of the control signal.

According to a fourth aspect of the present invention, the internal potential generating unit includes a first internal potential generating circuit outputting a first internal potential at a first node, a second internal potential generating circuit outputting a second internal potential at the first node, a driving signal generating circuit for generating a driving signal for driving first and second internal potential generating circuits, and a control circuit for controlling driving of the second internal potential generating circuit by generating a control signal controlling input of the driving signal to the second internal potential generating circuit.

As described above, in the internal potential generating unit in accordance with the fourth aspect of the present invention, the control circuit controls driving of the second internal potential generating circuit by generating a control signal controlling input of the driving signal to the second internal potential generating circuit. More specifically, on/off of the second internal potential generating circuit is controlled by the control signal.

Therefore, performance of the internal potential generating unit can be easily switched simply by changing the level of the control signal.

According to a fifth aspect of the present invention, a semiconductor device includes first and second transistors, the first transistor including a control electrode and first and second electrodes. The first electrode includes a first impurity region and a second impurity region having lower concentration than the first impurity region, provided on the side of the second electrode, the level of the second impurity region along the longitudinal direction of the control electrode being determined by the length along the longitudinal direction of the control electrode of the insulating film formed on a side wall of the control electrode through anisotropic etching. The second transistor includes a control electrode and first and second electrodes. The second electrode includes a first impurity region and a second impurity region having lower concentration than the first impurity region provided on the side of the second electrode. The length of the second impurity region of the second transistor along the longitudinal direction of the control electrode is longer than the length of the second impurity region of the first transistor along the longitudinal direction of the control electrode.

As described above, in the semiconductor device in accordance with the fifth aspect of the present invention, the length of the second impurity region of the second transistor along the longitudinal direction of the control electrode is longer than the length of the second impurity region of the first transistor along the longitudinal direction of the control electrode. Therefore, even when a high voltage is applied to the second transistor, punch through is less likely as compared with the first transistor, and hence the second transistor is hard to be broken. Therefore, reliability of the semiconductor device having the second transistor can be improved.

According to a sixth aspect of the present invention, the semiconductor device includes a substrate potential generating circuit which starts its operation in response to an external signal for generating a substrate potential, a boosted potential generating circuit which starts its operation in response to an internal signal for generating a substrate potential, a boosted potential generating circuit which starts its operation in response to an internal signal for generating a boosted potential, and an internal signal generating circuit for generating an internal signal at a timing later than the input of the external signal.

As described above, in the semiconductor device in accordance with the sixth aspect of the present invention, internal signal is input to the boosted potential generating circuit at a timing later than the external signal input to the substrate potential generating circuit. Therefore, the boosted potential generating circuit starts its operation after the substrate potential generating circuit starts its operation. Therefore, a large boosted potential is not generated while the substrate potential is positive, and hence breakage of a transistor constituting the semiconductor device can be prevented. In other words, reliability of the semiconductor device can be improved.

According to a seventh aspect of the present invention, a method of manufacturing a transistor includes the steps of forming an insulating film on a surface of a control electrode and a region containing an impurity formed at the semiconductor substrate, performing anisotropic etching to leave the insulating film on a sidewall of the control electrode, forming a resist on a surface of the impurity containing region not covered by the insulating film on the sidewall, and introducing an impurity having higher concentration than that of the impurity containing region, to the impurity region where the resist is not formed, to form a high concentration portion in the impurity containing region.

As described above, in the method of manufacturing a transistor in accordance with the seventh aspect of the present invention, an insulating film is formed on the sidewall of the control electrode, a resist is formed on the surface of the impurity containing region not covered by the insulating film on the sidewall, and high concentration impurity is introduced to the impurity containing region. Therefore, as compared with an example in which insulating film only is formed on the sidewall of the control electrode and high concentration impurity is introduced to the impurity containing region, the distance between the highly doped impurity region and the edge of the control electrode can be made longer. Therefore, the transistor manufactured through this method experiences punch through at a higher voltage. That is, punch through is not likely, and transistor is hardly broken even if such high voltage is applied.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 35(*a*)–43(*b*) are illustrations showing first to ninth steps of manufacturing a general NMOS transistor.

DESCRIPTION OF THE PREFERRED EMBODIMENTS

The level converting circuit, the internal potential generating circuit and the internal potential generating unit in accordance with the present invention will be described with reference to the figures.

First Embodiment

Figure 1:
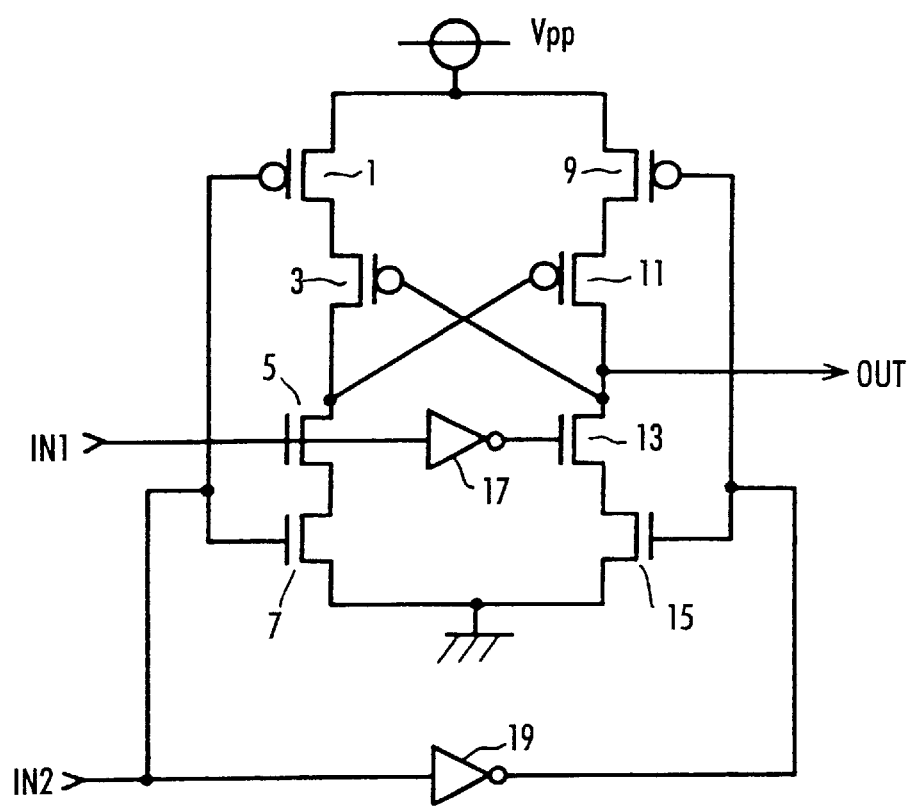
FIG. 1 is a circuit diagram showing a level converting circuit in accordance with a first embodiment of the present invention.

FIG. 1 shows, in detail, the level converting circuit in accordance with the first embodiment of the present invention.

Referring to FIG. 1, the level converting circuit in accordance with the first embodiment includes a PMOS transistor 1 for cutting current for an input portion, a PMOS transistor 3 for the input portion, an NMOS transistor 5 for the input portion, an NMOS transistors 7 for cutting current for the input portion, a PMOS transistor 9 for cutting current for an output portion, a PMOS transistor 11 for the output portion, an NMOS transistor 13 for the output portion, an NMOS transistor 15 for cutting current of the output portion, and inverters 17 and 19.

Here, PMOS transistor 1 for cutting current for the input portion, the PMOS transistor 3 for the input portion, the PMOS transistor 9 for cutting current for the output portion and PMOS transistor 11 for the output portion will be referred to as PMOS transistors 1, 3, 9 and 11, respectively.

The NMOS transistor 5 for the input portion, the NMOS transistor 7 for cutting current for the input portion, NMOS transistor 13 for the output portion and the NMOS transistor 15 for cutting current for the output portion will be referred to as NMOS transistors 5, 7, 13 and 15, respectively.

PMOS transistors 1 and 9 constitute a first current cutting circuit. PMOS transistors 3 and 11 and NMOS transistors 5 and 13 constitute a level shift circuit. PMOS transistor 3 and NMOS transistor 5 constitute the input portion.

Figure 75:
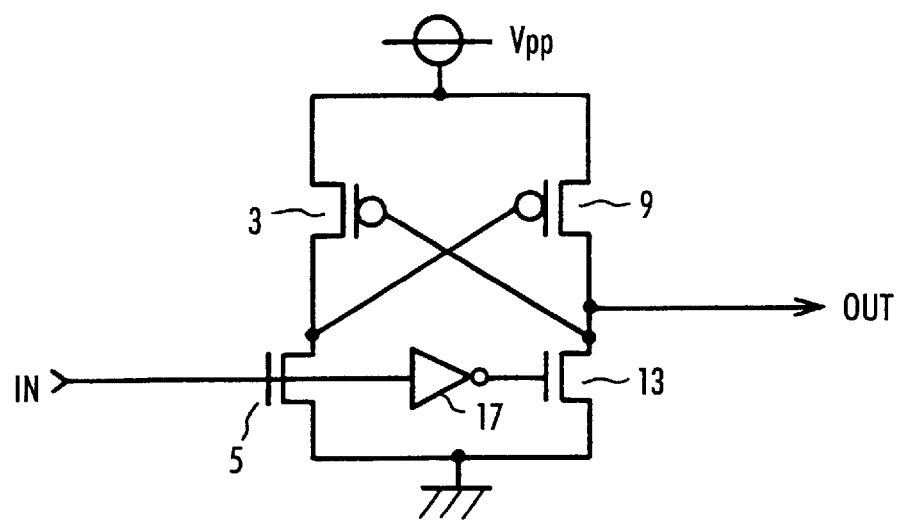
FIG. 75 is a circuit diagram showing a conventional level converting circuit.

PMOS transistor 11 and NMOS transistor 13 constitute an output portion. NMOS transistor 7 and NMOS transistor 15 constitute a second current cutting circuit. Here, portions corresponding to those shown in FIG. 75 will be referred to by the same reference characters, and description thereof is appropriately omitted.

PMOS transistor 1 is connected between a node having a boosted potential Vpp and PMOS transistor 3. PMOS transistor 9 is connected between the node having the boosted potential Vpp and PMOS transistor 11. NMOS transistor 7 is connected between NMOS transistor 5 and ground node. NMOS transistor 15 is connected between NMOS transistor 13 and the ground node.

Figure 22:
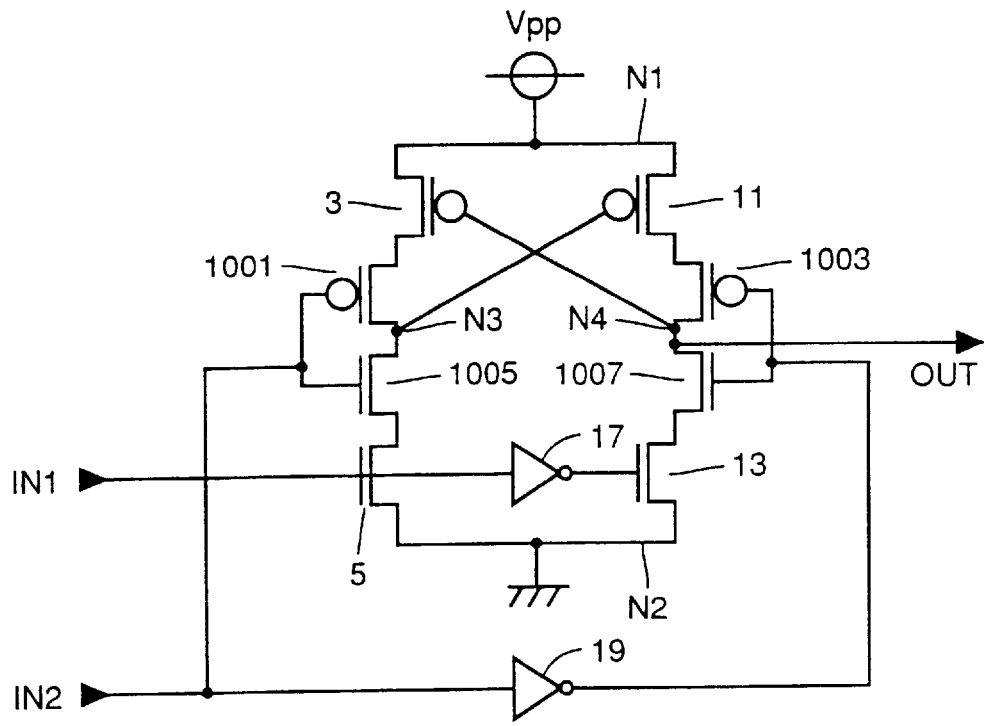
FIG. 22 is a circuit diagram showing a level converting circuit in accordance with a thirteenth embodiment of the present invention.

A signal IN1 input to NMOS transistor 5 corresponds to the signal IN shown in FIG. 22. A signal IN2 is input to the gates PMOS transistor 1 and NMOS transistor 7. The signal IN2 is inverted by inverter 19 and input to the gates of PMOS transistor 9 and NMOS transistor 15. The operation will be described with reference to a timing chart.

Figure 2:
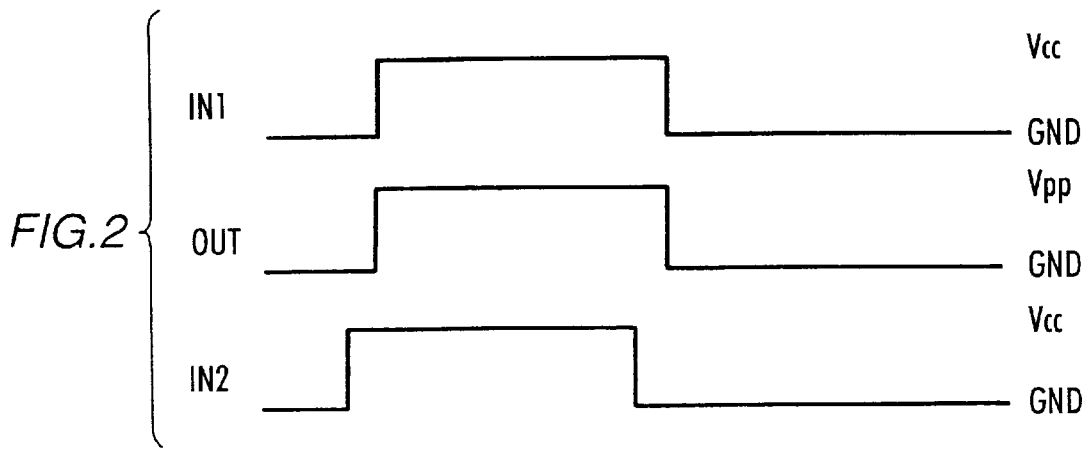
FIG. 2 is a timing chart illustrating the operation of the level converting circuit shown in FIG. 1.

FIG. 2 is a timing chart showing the operation of the level converting circuit shown in FIG. 1.

Referring to FIGS. 1 and 2, assume that the power supply potential Vcc is at the "H" level and the ground potential GND is at the "L" level. Before the signal IN1 at the "H" level is input to the gate of NMOS transistor 5, the signal IN2 at the "H" level is input to the gates of PMOS transistor 1 and NMOS transistor 7. Therefore, even when PMOS transistor 3 and NMOS transistor 5 simultaneously turn on in response to the input of the signal IN1 at the "H" level, PMOS transistor 1 turns on in advance, and hence through current between the node having the boosted potential Vpp and the ground node can be prevented.

Before the signal IN1 at the "H" level is input to the gate of NMOS transistor 5, the signal obtained by inverting the signal IN2, that is, a signal at the "L" level is input to the gates of PMOS transistor 9 and NMOS transistor 15. More specifically, even when PMOS transistor 11 and NMOS transistor 13 turn on simultaneously in response to the input of the signal IN1 at the "H" level, NMOS transistor 15 turns off in advance, and hence through current between the node at the boosted potential Vpp and the ground node can be prevented.

Before the signal IN1 at the "H" level which has been input to the gate of NMOS transistor 5 attains to the "L" level, the signal IN2 at the "H" level which has been input to the gate of PMOS transistor 1 and NMOS transistor 7 is set to the "L" level. More specifically, even when PMOS transistor 3 and NMOS transistor 5 turn on simultaneously in response to the signal IN1 changing from "H" to "L" level, NMOS transistor 7 turns off in advance, and hence through current between the node having the boosted potential Vpp and the ground node can be prevented.

Before the signal IN1 at the "H" level input to the gate of NMOS transistor 5 is set to the "L" level, the signal at the "L" level obtained by inverting the signal IN2 which has been input to the gates of PMOS transistor 9 and NMOS transistor 15 is set to the "H" level. More specifically, even when PMOS transistor 11 and NMOS transistor 13 turn on simultaneously in response to the signal IN1 changing from "H" to "L" level, PMOS transistor 9 turns off in advance, and hence the through current between the node having the boosted potential Vpp and the ground node can be prevented.

Meanwhile, when the signal IN1 at the "H" level is input, the potential of the signal OUT is the boosted potential Vpp which is higher than the power supply potential Vcc. Namely, the signal IN1 having the level of the power supply potential Vcc has been converted to the signal OUT having the boosted potential Vpp.

As described above, in the level converting circuit in accordance with the first embodiment, before the PMOS transistor 3 and NMOS transistor 5 or PMOS transistor 11 and NMOS transistor 13 simultaneously turn on, PMOS transistor 1 and NMOS transistor 15 or PMOS transistor 9 and NMOS transistor 7 turn off, and therefore, through current between the node having the boosted potential Vpp and the ground node can be prevented.

The same effects as described above can be obtained by adapting the timing to set the signal IN1 to "H" level to be identical with the timing to set the signal IN2 to "H" level, and by adapting the timing to set the signal IN1 to "L" level to be identical with the timing to set the signal IN2 to "L" level.

More specifically, in that case, even when PMOS transistor 3 and NMOS transistor 5 or PMOS transistor 11 and NMOS transistor 13 simultaneously turn on, PMOS transistor 1 and NMOS transistor 15 or PMOS transistor 9 and NMOS transistor 7 turn off simultaneously, and hence through current between the node having the boosted potential Vpp and the ground node can be prevented.

[Second Embodiment]

Figure 3:
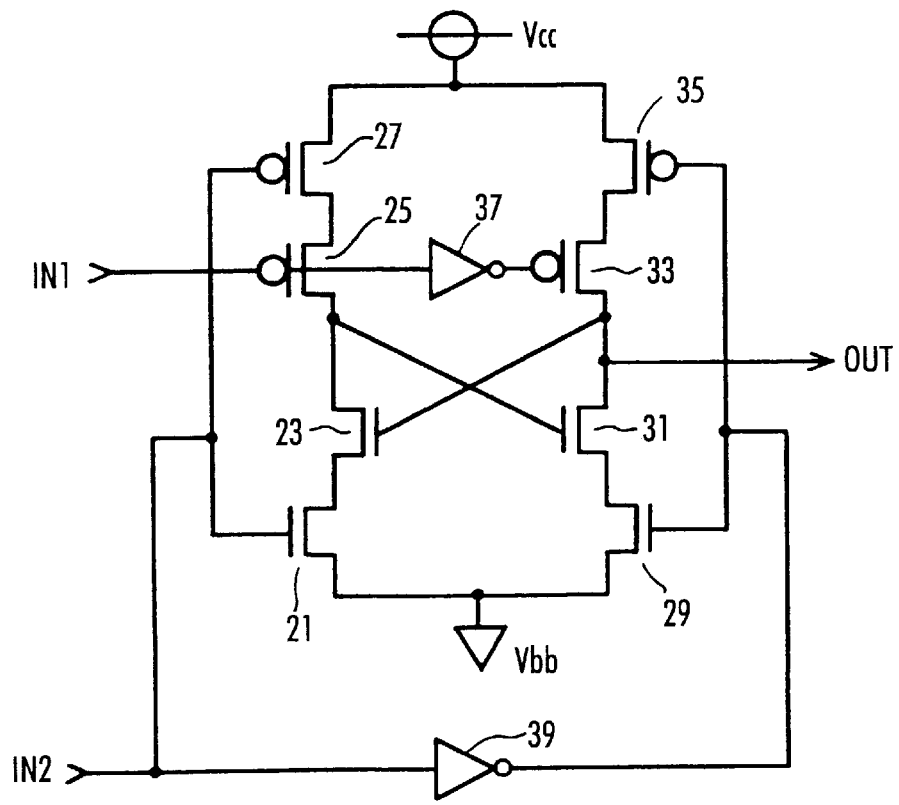
FIG. 3 is a circuit diagram showing a level converting circuit of in accordance with a second embodiment of the present invention.

FIG. 3 is a circuit diagram showing details of the level converting circuit in accordance with the second embodiment of the present invention.

The level converting circuit shown in FIG. 1 is for converting the level of the power supply potential Vcc to the level of the boosted potential Vpp which is higher. By contrast, the level converting circuit in accordance with the present embodiment is for converting the level of the ground potentia GND to a level of a lowered potential Vbb.

Referring to FIG. 3, the level converting circuit in accordance with the present embodiment includes an NMOS transistor 21 for cutting current for an input portion, an NMOS transistor 23 for the input portion, a PMOS transistor 25 for the input portion, a PMOS transistor 27 for cutting current for the input portion, an NMOS transistor 29 for cutting current for the output portion, an NMOS transistor 31 for the output portion, a PMOS transistor 33 for the output portion, a PMOS transistor 35 for cutting current for the output portion and inverters 37 and 39.

In the following, NMOS transistor 21 for cutting current for the input portion, NMOS transistor 23 for the input portion, NMOS transistor 29 for cutting current for the output portion, and NMOS transistor 31 for the output portion will be referred to as NMOS transistors 21, 23, 219 and 31.

PMOS transistor 27 for cutting current for the input portion, PMOS transistor 33 for the output portion and PMOS transistor 35 for the output portion will be referred to as PMOS transistors 27, 25, 33 and 35.

NMOS transistor 21 for cutting current at the input portion and NMOS transistor 29 for cutting current for the output portion constitute a first current cutting circuit. PMOS transistor 27 for cutting current for the input portion and PMOS transistor 35 for cutting current for the output portion constitute a second current cutting circuit.

PMOS transistor 25 for the input portion, NMOS transistor 23 for the input portion, PMOS transistor 33 for the output portion and NMOS transistor 31 for the output portion constitute a level shift circuit. PMOS transistor 25 for the input portion and NMOS transistor 23 for the input portion constitute the input portion. PMOS transistor 33 for the output portion and NMOS transistor 31 for the output portion constitute the output portion.

PMOS transistors 27 and 25 and NMOS transistors 23 and 21 are connected in series between a node having the power supply potential Vcc and a node having a lower potential Vbb. PMOS transistors 35 and 33 and NMOS transistors 31 and 29 are connected in series between the node having the power supply potential Vcc and a node having the lowered potential Vbb.

N channel transistor 23 has its gate connected to the drain of PMOS transistor 33. NMOS transistor 31 has its gate connected to the drain of PMOS transistor 25. A node between PMOS transistor 33 and NMOS transistor 31 is an output node, and a signal OUT is output therefrom. The signal IN1 is input to the gate of PMOS transistor 25. A signal IN1 inverted by inverter 37 is input to the gate of PMOS transistor 33. The signal IN2 is input to the gate of PMOS transistor 27 and NMOS transistor 21. The signal IN2 inverted by inverter 39 is input to the gates of PMOS transistor 35 and NMOS transistor 29. The operation of the level converting circuit in accordance with the present embodiment will be described with reference to the timing chart.

Figure 4:
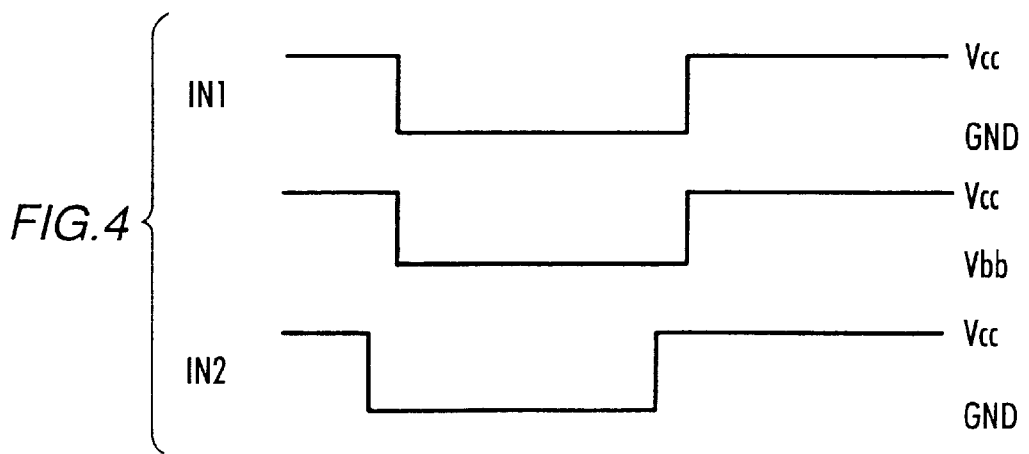
FIG. 4 is a timing chart illustrating the operation of the level converting circuit shown in FIG. 3.

FIG. 4 is a timing chart showing the operation of the level converting circuit in accordance with the second embodiment of the present invention. It is assumed that the power supply potential Vcc is the "H" level, and the ground potential GND is the "L" level.

Before a signal at the "L" level is input to the gates of PMOS transistor 25, the signal IN2 at the "L" level is input to the gates of PMOS transistor 27 and NMOS transistor 21. More specifically, even when PMOS transistor 25 and NMOS transistor 23 turn on simultaneously in response to the signal IN1 at the "L" level, NMOS transistor 21 turns off in advance, and hence through current between the node having the power supply potential Vcc and the node having the lowered potential Vbb can be prevented.

Before the signal IN1 at the "L" level is input to the gate of PMOS transistor 25, inverted signal IN2, that is, a signal at the "H" level is input to the gates of PMOS transistor 35 and NMOS transistor 29. More specifically, even when PMOS transistor 33 and NMOS transistor 31 turn on simultaneously in response to the input of the signal IN1 at the "L" level, PMOS transistor 35 turns off in advance, and hence through current between the node having the power supply potential Vcc and the node having the lowered potential Vbb can be prevented.

Before the signal IN1 at the "L" level which has been input to the gate of PMOS transistor 25 attains to the "H" level, the signal IN2 which is at the "L" level which has been input to the gates of PMOS transistor 27 and NMOS transistor 21 is set to the "H" level. More specifically, even when PMOS transistor 25 and NMOS transistor 23 simultaneously turn on in response to the signal IN1 changing from "L" level to "H" level, PMOS transistor 27 is turned off in advance, and hence through current between the node having the power supply potential Vcc and the node having the lowered potential Vbb can be prevented.

Before the signal IN1 at the "L" level which has been input to the gate of PMOS transistor 25 changes to the "H" level, the inverted signal IN2, that is, "L" level signal is input to the gates of PMOS transistor 35 and NMOS transistor 25. More specifically, even when PMOS transistor 33 and NMOS transistor 31 simultaneously turn on in response to the signal IN1 changing from "L" level to "H" level, NMOS transistor 29 turns off in advance, and hence through current between the node having the power supply potential Vcc and the node having the lower potential Vbb can be prevented.

Here, while the signal IN1 at the "L" level is input, the potential of the signal OUT is the lowered potential Vbb, which is lower than the ground potential GND. Namely, the signal IN1 having the ground potential GND has been converted to the signal OUT having the lowered potential Vbb.

As described above, in the level converting circuit in accordance with the second embodiment, before the PMOS transistor 25 and NMOS transistor 23 or PMOS transistor 33 and NMOS transistor 31 turn on simultaneously, NMOS transistor 21 and PMOS transistor 35 or NMOS transistor 29 and PMOS transistor 27 are turned off, and hence through current between the node having the power supply potential Vcc and the node having the lowered potential Vbb can be prevented.

Similar effects can be obtained by adapting the timing to set the signal IN1 to "L" level to be identical with the timing to set the signal IN2 to "L" level and by adapting the timing to set the signal IN1 to "H" level to be identical with the timing to set the signal IN2 to the "H" level. More specifically, simultaneously with turning on of PMOS transistor 25 and NMOS transistor 23 or PMOS transistor 33 and NMOS transistor 31, NMOS transistor 21 and PMOS transistor 35 or NMOS transistor 29 and PMOS transistor 27 turn on, and hence through current between the node having the power supply potential Vcc and the node having the lowered potential Vbb can be prevented.

[Third Embodiment]

Figure 5:
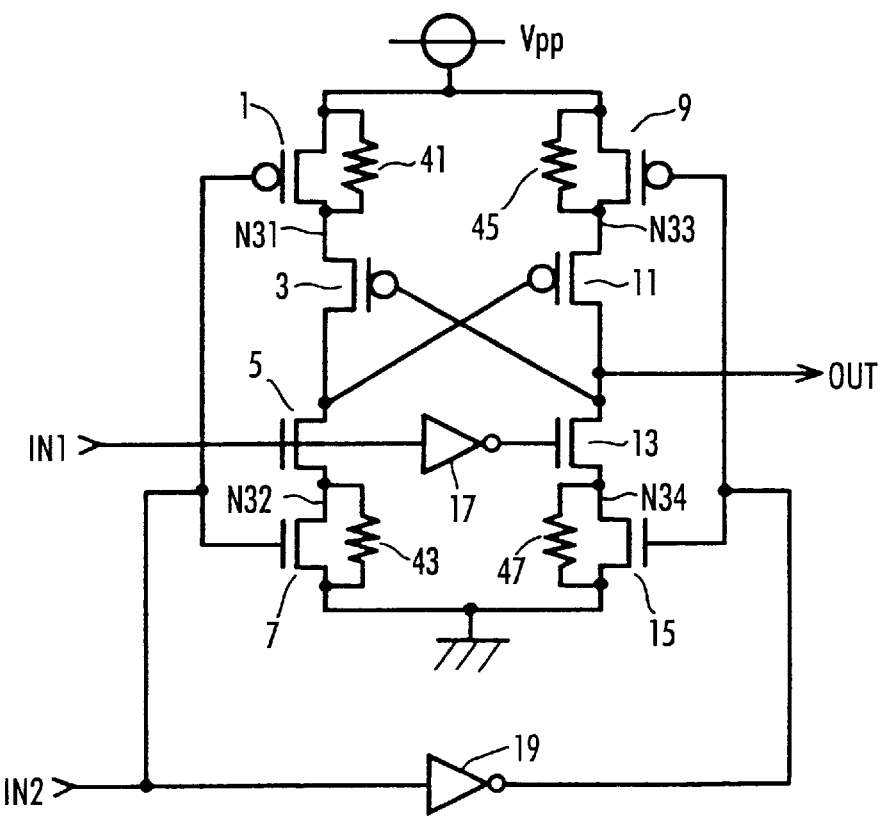
FIG. 5 is a circuit diagram showing a level converting circuit in accordance with a third embodiment of the present invention.

FIG. 5 is a schematic diagram showing details of the level converting circuit in accordance with the third embodiment of the present invention.

Referring to FIG. 5, the level converting circuit in accordance with the third embodiment includes a first resistor 41 for the input portion, a second resistor 43 for the input portion, a first resistor 45 for the output portion and a second resistor 47 for the output portion, connected parallel to PMOS transistor 1, NMOS transistor 7, PMOS transistor 9 and NMOS transistor 15, respectively, of the level converting circuit shown in FIG. 1.

Portions corresponding to those of FIG. 1 are denoted by the same reference characters, and description thereof is not repeated. The first resistor 41 for the input portion, the second resistor 43 for the input portion, the first resistor 45 for the output portion and the second resistor 47 for the output portion will be referred to as resistors 41, 43, 45 and 47, respectively.

If resistor 41 is not connected parallel to PMOS transistor 1, the potential at node N31 is not fixed when PMOS transistors 1 and 3 are off.

Therefore, it is susceptible to the influence of potential change at other nodes because of coupling or the like, caused by the potential change at other nodes. More specifically, node N31 is susceptible to noise, which may cause a latch up. Therefore, in the present embodiment, resistor 41 is connected parallel to PMOS transistor 1 to provide a leak path, so that the potential at node N31 is fixed to some extent.

From the same reason, resistors 43, 47 and 45 are connected parallel to NMOS transistor 7, NMOS transistor 15 and PMOS transistor 9, respectively.

As described above, in the level converting circuit in accordance with the third embodiment of the present invention, resistor 41, 43, 45 and 47 are connected parallel to PMOS transistor 1, NOMS transistor 7, PMOS transistor 9 and NMOS transistor 15, so that potential at nodes N31, N32, N33 and N34 are fixed. Therefore, influence of noise on nodes N31, N32, N33 and N34 can be prevented, thus eliminating a cause of a latch up or the like.

Similar effects as described above can be obtained by connecting resistors parallel to PMOS transistor 27, NMOS transistor 21, PMOS transistor 35 and NMOS transistor 29, respectively, shown in FIG. 3.

Figure 6:
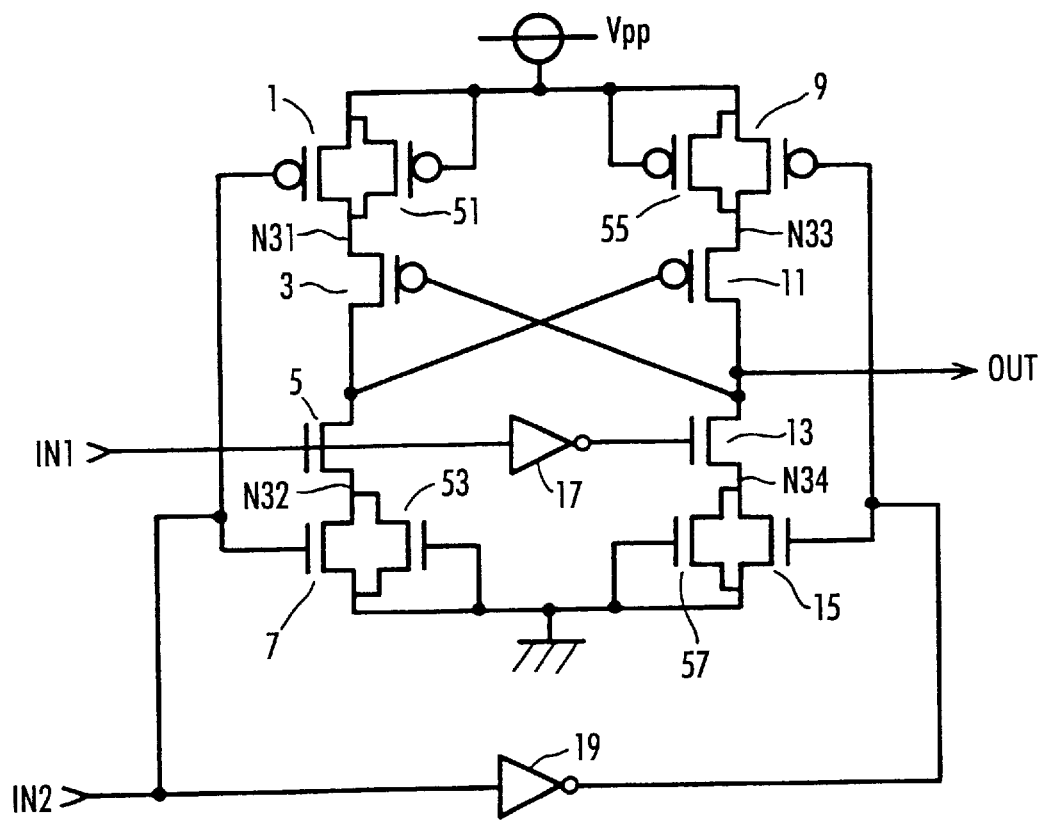
FIG. 6 is a circuit diagram showing a modification of the level converting circuit in accordance with the third embodiment of the present invention.

FIG. 6 is a schematic diagram showing a modification of the level converting circuit in accordance with the third embodiment of the present invention.

In the level converting circuit shown in FIG. 6, MOS transistors are used in place of resistors 41, 43, 45 and 47 of FIG. 5. More specifically, PMOS transistors 51 and 55 are connected to parallel to PMOS transistors 1 and 9, respectively.

NMOS transistors 53 and 57 are connected parallel to NMOS transistor 7 and 15, respectively. PMOS transistors 51 and 55 and NMOS transistors 53 and 57 are diode connected.

Therefore, nodes N31 and N33 are fixed at a potential higher than the boosted potential Vpp by the threshold voltage Vth. Nodes N32 and N34 are fixed at a potential lower than the ground potential by the threshold voltage Vth. The threshold voltage Vth represents the threshold voltage Vth of PMOS transistors 51, 55 and NMOS transistors 53, 57.

As structured in this manner, the same effect as in the third embodiment can be obtained in this modification of the level converting circuit of the third embodiment.

Similar effects as described above can be obtained by connecting PMOS transistors parallel to PMOS transistor 27, NMOS transistor 21, PMOS transistor 35 and NMOS transistor 29 of the level converting circuit shown in FIG. 3.

[Fourth Embodiment]

Figure 7:
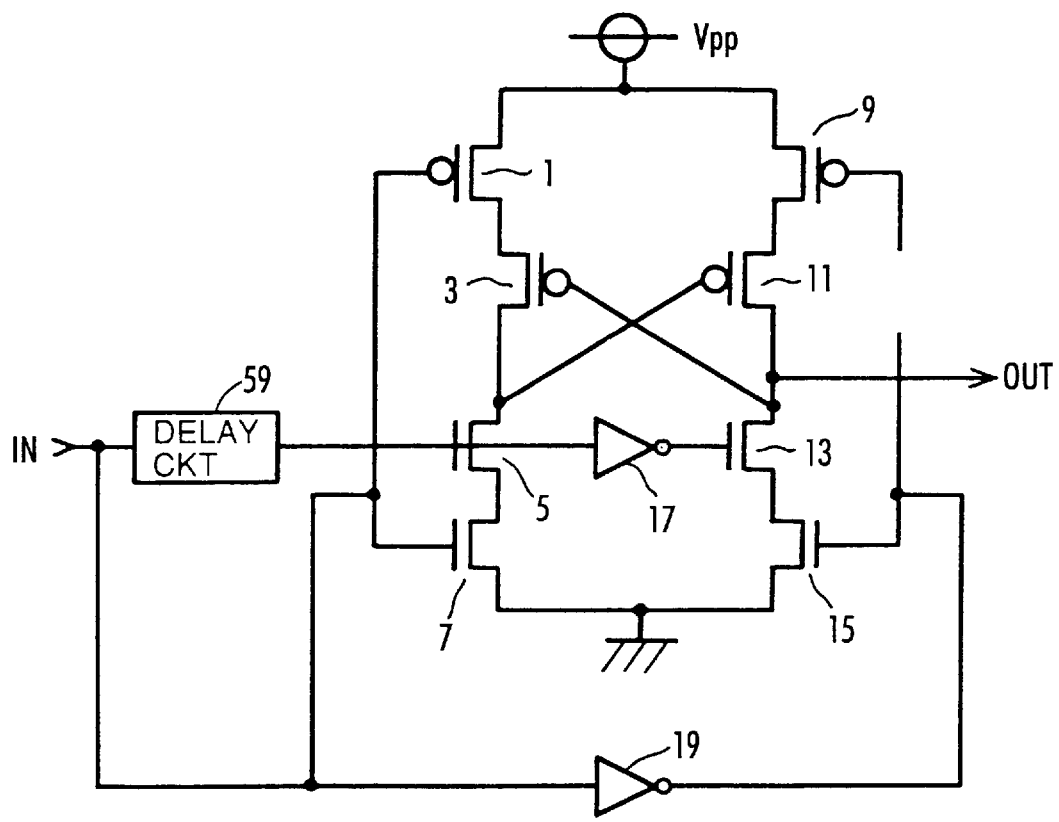
FIG. 7 is a circuit diagram showing a level converting circuit in accordance with a fourth embodiment of the present invention.

FIG. 7 is a circuit diagram showing details of the level converting circuit in accordance with the fourth embodiment of the present invention.

The present embodiment includes a delay circuit 59 in addition to the level converting circuit shown in FIG. 1. Portions corresponding to those of FIG. 1 are denoted by the same reference characters, and description thereof is not repeated.

To the gate NMOS transistor 5, the signal IN delayed by delay circuit 59 is input. To the gate of NMOS transistor 13, a signal obtained by inverting the delayed signal IN is input. To PMOS transistor 1 and NMOS transistor 7, the signal IN without delay is input. To the gates of PMOS transistor 9 and NMOS transistor 15, a signal obtained by inverting the signal IN without delay is input.

Since delay circuit 59 is provided, before the "H" level signal is input to the gate of NMOS transistor 5, the signal IN at the "H" level is input to the gates of PMOS transistor 1 and NMOS transistor 7. Since delay circuit 59 is provided, before the signal at "H" level is input to the gate of NMOS transistor 5, that is, before the signal IN at the "L" level is input to the gate of NMOS transistor 13, a signal at the "L" signal is input to the gates of PMOS transistor 9 and NMOS transistor 15.

Accordingly, even when PMOS transistor 3 and NMOS transistor 5 or PMOS transistor 11 and NMOS transistor 13 turn on simultaneously in response to the input of signal IN at the "H" level, PMOS transistor 1 and NMOS transistor 15 are turned off in advance, and hence through current between the node having the boosted potential Vpp and the ground node can be prevented.

Since delay circuit 59 is provided, before the signal IN at the "H" level which has been input to the gate of NMOS transistor 5 is set to "L" level, the signal IN at the "H" level which has been input to the gates of PMOS transistor 1 and NMOS transistor 7 is set to "L" level.

Since delay circuit 59 is provided, before the signal IN at the "H" level which has been input to the gate of NMOS transistor 5 is set to "L" level, that is, before the signal at the "L" level which has been input to the gate of NMOS transistor 13 is changed to the "H" level, the "L" level signal which has been input to the gate of PMOS transistor 9 and NMOS transistor 15 is set to "H" level.

Therefore, even when PMOS transistor 3 and NMOS transistor 5 or PMOS transistor 11 and NMOS transistor 13 simultaneously turn on in response to the input of the signal IN at the "L" level, PMOS transistor 9 and NMOS transistor 7 are turned off in advance, and hence through current between the node having the boosted potential Vpp and the ground node can be prevented.

As described above, in the level converting circuit in accordance with the fourth embodiment of the present invention, before PMOS transistor 3 and NMOS transistor 5 or PMOS transistor 11 and NMOS transistor 13 simultaneously turn on, PMOS transistor 1 and NMOS transistor 15 or PMOS transistor 9 and NMOS transistor 7 are turned off, and hence through current between the node having the boosted potential Vpp and the ground node can be prevented.

Further, in the level converting circuit in accordance with the fourth embodiment, delay circuit 59 is provided, and hence level converting circuit can be controlled by using only one signal (signal IN). Therefore, as compared with the embodiment shown in FIG. 1 in which the level converting circuit is controlled by using two signals (IN1, IN2), the number of signal lines can be reduced.

The embodiment can be applied to the level converting circuits shown in FIGS. 3, 5 and 6, and provides similar effects as described above.

[Fifth Embodiment]

Figure 8:
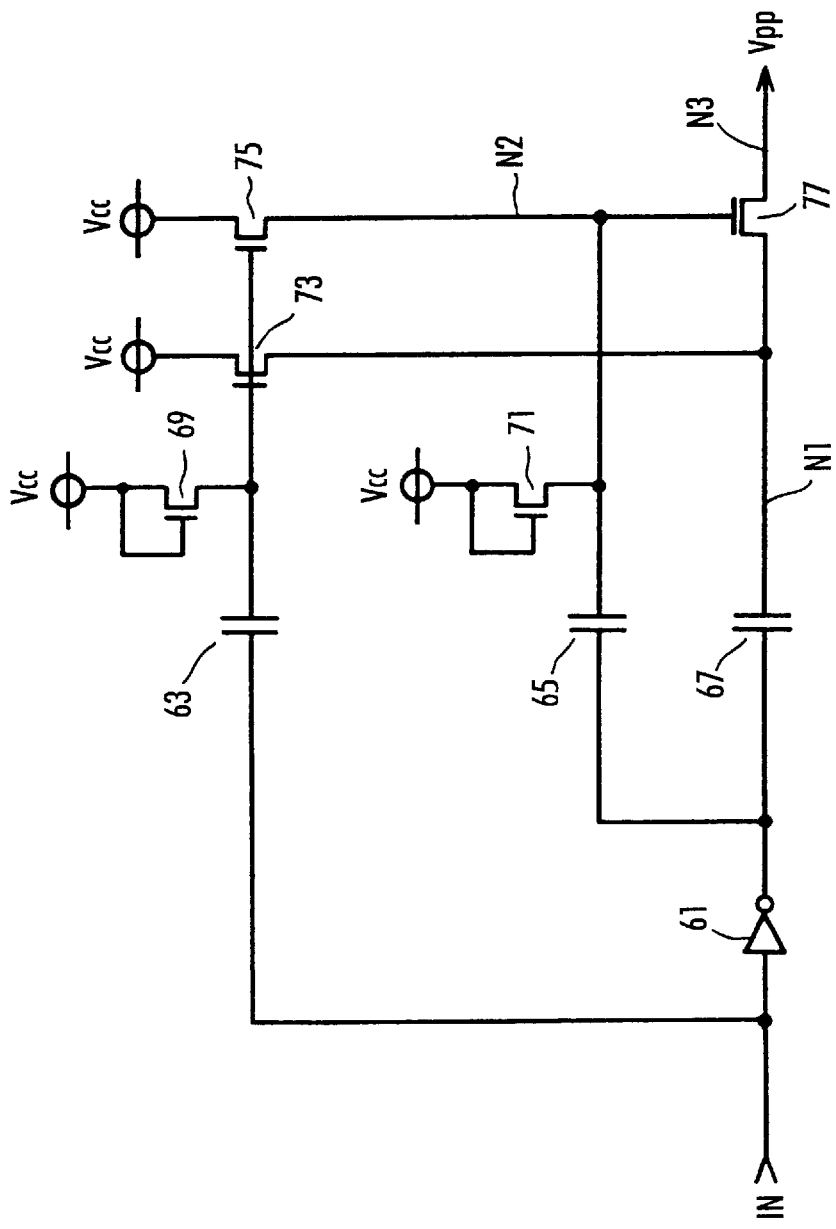
FIG. 8 is a circuit diagram showing a general boosted potential generating circuit.

FIG. 8 is a circuit diagram showing details of a general boosted potential generating circuit.

Referring to FIG. 8, a general boosted potential generating circuit includes an inverter 61, capacitors 63 to 67 and NMOS transistors 69 to 77. NMOS transistors 69 and 71 are diode connected.

A general boosted potential generating circuit generates a boosted potential Vpp in response to the signal IN. The signal IN is a clock signal of which "H" level and "L" level are the power supply potential Vcc and the ground potential GND. The operation will be described with reference to a timing chart.

Figure 9:
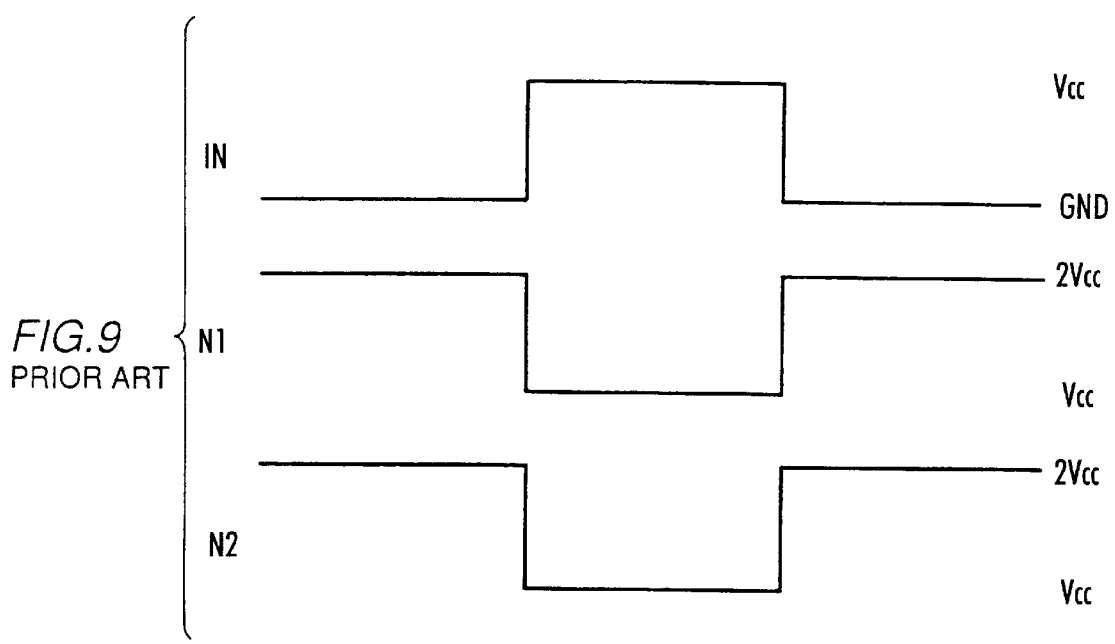
FIG. 9 is a timing chart illustrating the operation of the boosted potential generating circuit shown in FIG. 8.

FIG. 9 is a timing chart illustrating the operation of the general boosted potential generating circuit shown in FIG. 8.

Referring to FIGS. 8 and 9, if the signal IN attains to the "H" level, a potential at the "H" level is transmitted to capacitor 63. Therefore, NMOS transistors 73 and 75 turn on.

Meanwhile, when the signal IN is at the "H" level, an "L" level potential is transmitted to capacitors 65 and 67 through inverter 61. Therefore, the voltage at nodes N1 and N2 is lowered, and NMOS transistor 77 turns off. Through these operations, nodes N1 and N2 are precharged to the power supply potential Vcc. Before the potential at the "L" is transmitted to capacitors 65 and 67, the potential at nodes N1 and N2 is 2 Vcc.

When the signal IN attains to the "L" level, the "L" level potential is transmitted to capacitor 63. Thus, NMOS transistors 73 and 75 turn off.

Meanwhile, when the signal IN attains to the "L" level, the "H" level potential is transmitted to capacitors 65 and 67 through inverter 61. Therefore, nodes N1 and N2 are raised to 2 Vcc. Then, NMOS transistor 77 turns on and the potential at node N1 is output to node N3.

However, since the potential at nodes N1 and N2 is 2 Vcc, only a potential (2 Vcc—Vth) obtained by subtracting the threshold voltage Vth of NMOS transistor 77 from 2 Vcc can be transmitted to node N3. In general boosted potential generating circuit, the above described operation is repeated, so that the potential at node N3 is set to a boosted potential Vpp which is higher than the power supply potential Vcc.

The boosted potential generating circuit as the internal potential generating circuit in accordance with a fifth embodiment of the present invention was made to solve the above described problem.

Figure 10:
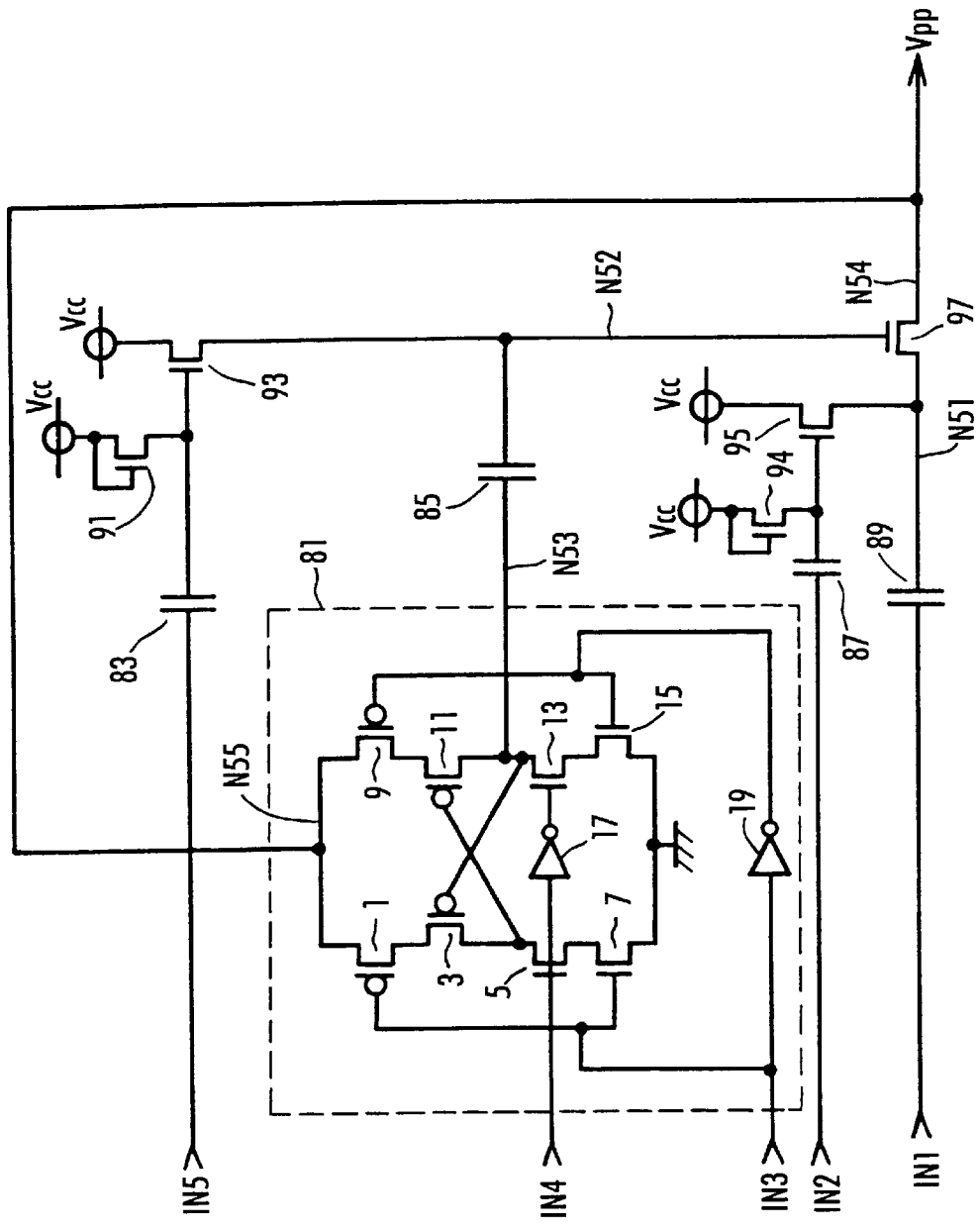
FIG. 10 is a circuit diagram showing a boosted potential generating circuit as an internal potential generating circuit in accordance with a fifth embodiment of the present invention.

FIG. 10 is a circuit diagram showing details of the boosted potential generating circuit as the internal potential generating circuit in accordance with the fifth embodiment of the present invention. Referring to FIG. 10, the boosted potential generating circuit in accordance with the present embodiment includes a level converting circuit 81, capacitors 83, 85, 87, 89 and NMOS transistors 91, 93, 94, 95 and 97. The level converting circuit 81 is the same as the level converting circuit shown in FIG. 1. Portions corresponding to those of FIG. 1 are denoted by the same reference characters and detailed description thereof is not repeated.

Capacitor 89 receives signal IN1. Capacitor 87 receives signal IN2. Capacitor 85 receives an output signal from level converting circuit 81. Level converting circuit 81 receives signals IN3 and IN4. Capacitor 83 receives signal IN5.

NMOS transistor 97 is connected between capacitor 89 and node N54. NMOS transistor 95 is connected between the node having the power supply potential Vcc and node N51, and has its gate connected to capacitor 87. Node N52 is connected to one capacitor 85, the gate of NMOS transistor 97 and one electrode of NMOS transistor 93. NMOS transistor 94 is connected between capacitor 87 and the node having Vcc, in diode manner.

NMOS transistor 93 has its gate connected to capacitor 83 and the other electrode connected to the node having the power supply potential Vcc. NMOS transistor 91 is connected between the node having the power supply potential Vcc and capacitor 83. NMOS transistor 91 is diode connected.

Nodes N54 and N55 are connected to each other. Here, signals IN4 and IN3 correspond to signals IN1 and IN2 of FIG. 1. Signals IN1 to IN5 are clock signals of which "H" level and "L" level are the power supply potential Vcc and the ground potential GND, respectively.

Figure 11:
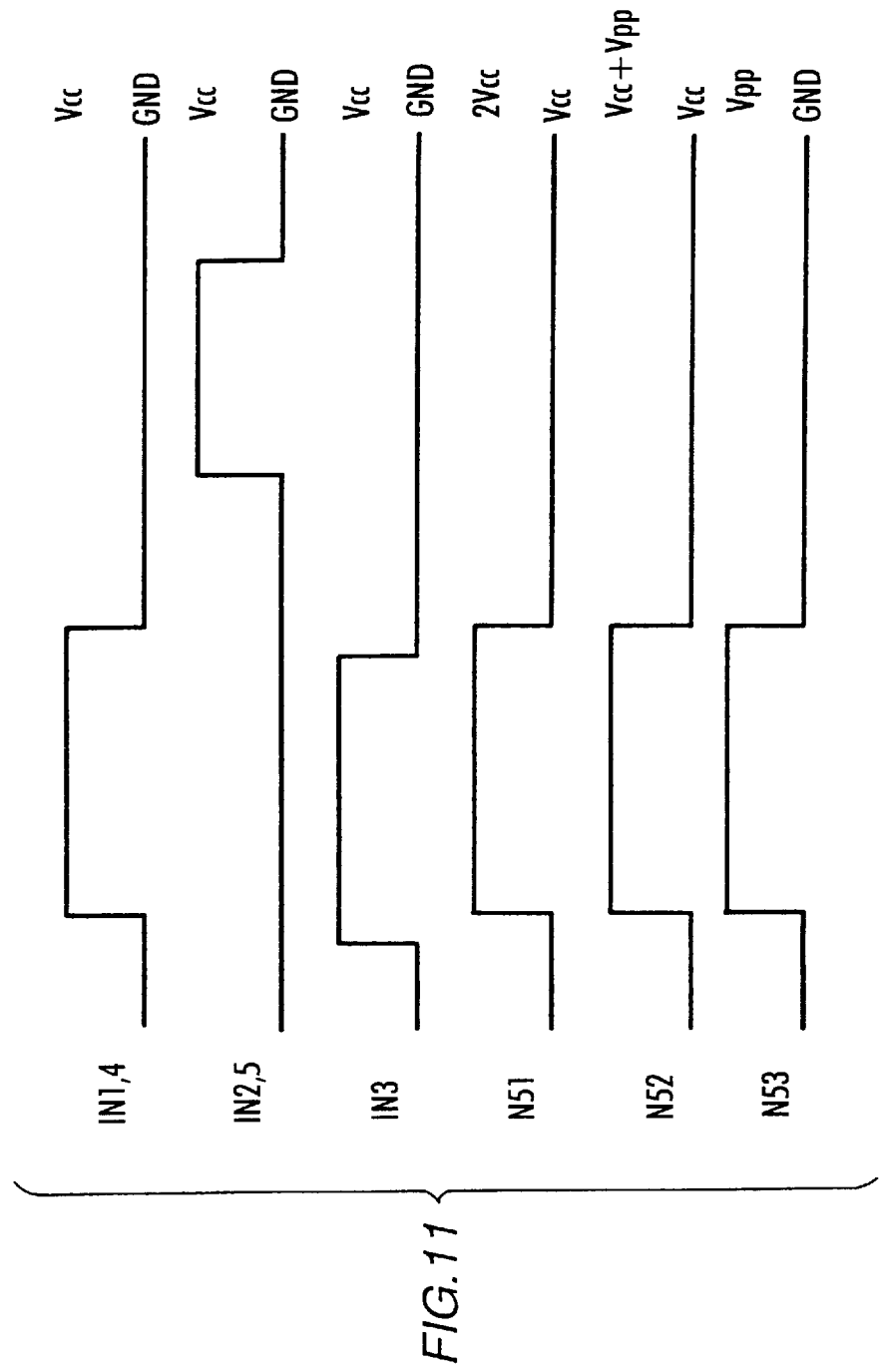
FIG. 11 is a timing chart illustrating the operation of the boosted potential generating circuit shown in FIG. 10.

FIG. 11 is a timing chart showing the operation of the boosted potential generating circuit of FIG. 10.

Referring to FIGS. 10 and 11, in a standby state, signals IN1 to IN5 are all at the "L" level. At this time, nodes N51 and N52 are precharged to the power supply potential Vcc, and NMOS transistor 97 is off.

Before the signals IN1 and IN4 at "H" level are input, the signal IN3 at "H" level is input to level converting circuit 81. Therefore, PMOS transistor 1 is rendered nearly off, and NMOS transistor 15 turns off. At this time, PMOS transistor 9 and NMOS transistor 17 are on. The signal IN4 at "H" level is input to level converting circuit 81, and NMOS transistor 5 and PMOS transistor 11 turn on, PMOS transistor 3 and NMOS transistor 13 turn off, so that level converting circuit 81 outputs the boosted potential Vpp which is the potential at node N55. Therefore, node N53 attains to the boosted potential Vpp. As already described with reference to FIG. 1, the through current between node N55 and the ground node is prevented.

When the signal IN1 attains to the "H" level, node N51 is boosted to 2 Vcc. At this time, in response to the potential at node N53 attaining to the boosted potential Vpp, by capacitor 85, the potential at node N52 is boosted to power supply potential Vcc+boosted potential Vpp. Thus, NMOS transistor 97 turns on, and the potential (2 Vcc) at node N51 is transmitted to node N54.

Then, before signals IN1 and IN4 are set to the "L" level, signal IN3 is set to the "L" level. Consequently, PMOS transistor 9 is rendered nearly off, and NMOS transistor 7 turns off. Further, PMOS transistor 1 and NMOS transistor 15 turns on.

When signal IN4 is set to "L" level, NMOS transistor 5 and PMOS transistor 11 turn off, and PMOS transistor 3 and NMOS transistor 13 turn on. Thus, the potential at node N53 is changed from the boosted potential Vpp to the ground potential GND.

Meanwhile, when the signal IN1 is set to the "L" level, the potential at node N51 is set to the power supply potential Vcc. At this time, by capacitor 85, in response to the potential at node N53 being changed to the ground potential GND, the potential at node N52 is set to the power supply potential Vcc. Then, NMOS transistor 97 is turned off.

Thereafter, when signals IN2 and IN5 are set to the "H" level, NMOS transistors 93 and 95 turn on, and precharge nodes N52 and N51 to the power supply potential Vcc. Then signals IN2 and IN5 are set to "L" level.

The boosted potential generating circuit repeats the above described operation, so as to set node N54 at the boosted potential Vpp which is higher than the power supply potential Vcc.

As described above, when the potential at node N51 is to be output to node N54, power supply potential Vcc+boosted potential Vpp is applied to the gate of NMOS transistor 97, by level converting circuit 81.

Therefore, the gate potential at NMOS transistor 97 is higher by more than the threshold voltage Vth, than the source potential Vpp of NMOS transistor 97, and hence the potential (2 Vcc) at node N51 is thoroughly transmitted to node N54. NMOS transistor 97 has its source connected to node N54, and the threshold voltage Vth is the threshold voltage of NMOS transistor 97.

Further, from the same reason as described with reference to FIG. 1, the through current flowing through level converting circuit 81 can be prevented, and hence efficiency of the boosted potential generating circuit can be improved. More specifically, as the nodes N54 and N55 are connected, if there is a through current flowing through level converting circuit 81, the boosted potential Vpp flows to the ground node, degrading the efficiency of the boosted potential generating circuit. However, in the boosted potential generating circuit in accordance with the fifth embodiment, such problem can be solved, and hence the boosted potential Vpp can be generated efficiently.

The level converting circuit shown in FIGS. 5, 6 and 7 may be used as the level converting circuit 81, and similar effects as described above can be obtained.

The boosted potential Vpp generated by such a boosted potential generating circuit can be used as the word line potential of a dynamic random access memory (DRAM). Further, when one sense amplifier is used for two sets of bit line pairs (shared sense amplifiers), the boosted potential Vpp may be used as a signal for controlling connection/ disconnection between the sense amplifier and the two sets of bit line pairs.

[Sixth Embodiment]

Figure 12:
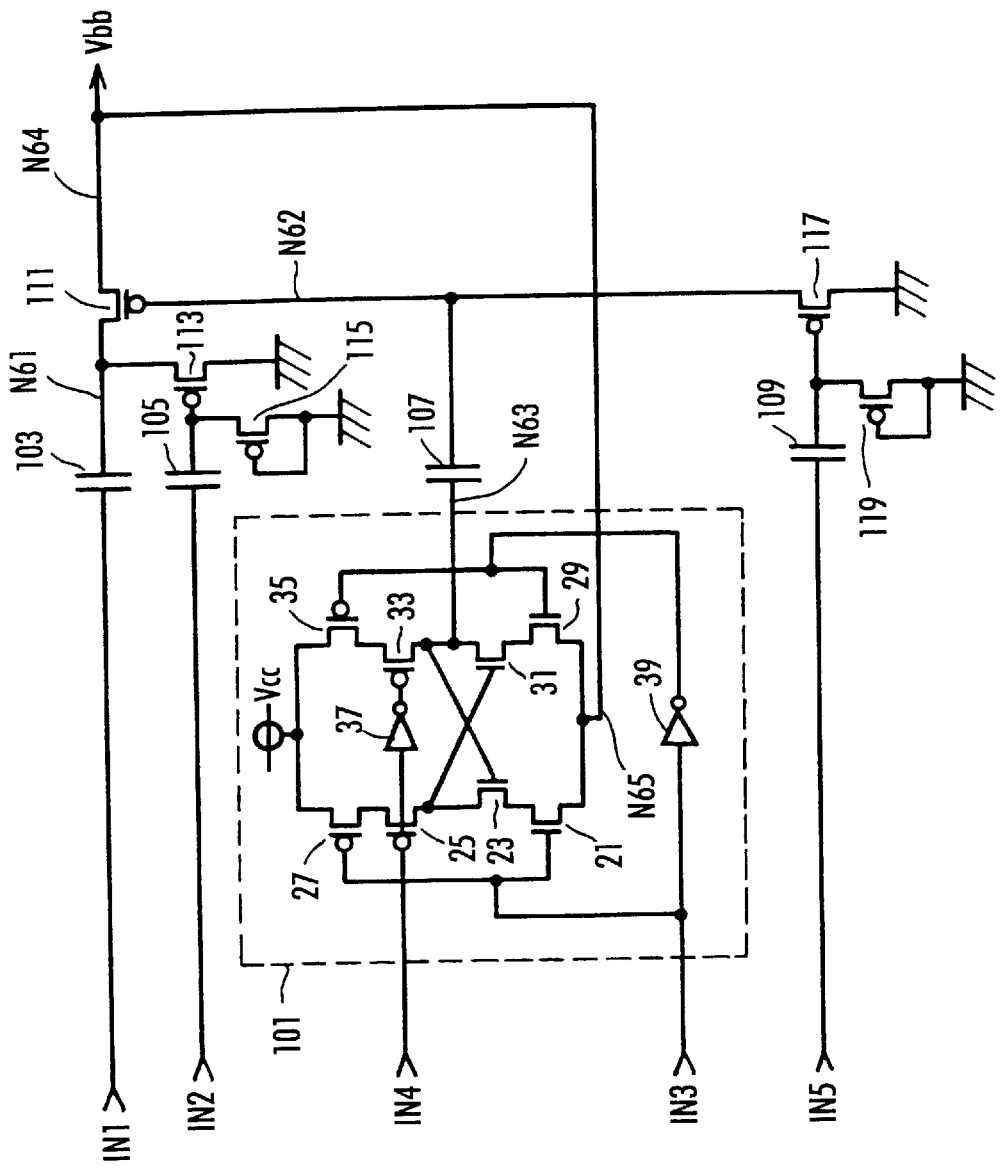
FIG. 12 is a circuit diagram showing a lowered potential generating circuit as an internal potential generating circuit in accordance with a sixth embodiment of the present invention.

FIG. 12 is a circuit diagram showing details of a lowered potential generating circuit as an internal potential generating circuit in accordance with the sixth embodiment of the present invention.

Referring to FIG. 12, the lowered potential generating circuit in accordance with the present embodiment includes a level converting circuit 101, capacitors 103, 105, 107, 109 and PMOS transistors 111, 113, 115, 117 and 119. Level converting circuit 101 is similar to the level converting circuit of FIG. 3. Portions corresponding to those of FIG. 3 are denoted by the same reference characters and description thereof is not repeated.

Capacitor 103 receives signal IN1. Capacitor 105 receives signal IN2. Level converting circuit 101 receives signals IN4 and IN3. Capacitor 109 receives signal IN5. Signals IN3 and IN4 correspond to signals IN2 and IN1 of FIG. 3.

PMOS transistor 111 is connected between capacitor 103 and node N64. PMOS transistor 113 is connected between node N61 and the ground node, and has its gate connected to capacitor 105. PMOS transistor 115 is connected between capacitor 105 and the ground node in diode manner.

Node N62 is connected to capacitor 107, the gate of PMOS transistor 111 and the source of PMOS transistor 117. PMOS transistor 117 has its gate connected to capacitor 109 and its drain connected to the ground node. PMOS transistor 119 is connected between capacitor 109 and ground node in diode manner. Nodes N64 and N65 are connected.

The lowered potential generating circuit in accordance with the present embodiment generates a lowered potential Vbb which is smaller than the power supply potential Vcc, in response to signals IN1 to IN5. Level converting circuit 101 converts the signal IN4 which has the amplitude between power supply potential Vcc and a ground potential GND to the amplitude between the power supply potential Vcc and the lowered potential Vbb. Signals IN1 to IN5 are clock signals of which "H" level and "L" level are the power supply potential Vcc and a ground potential GND, respectively.

Figure 13:
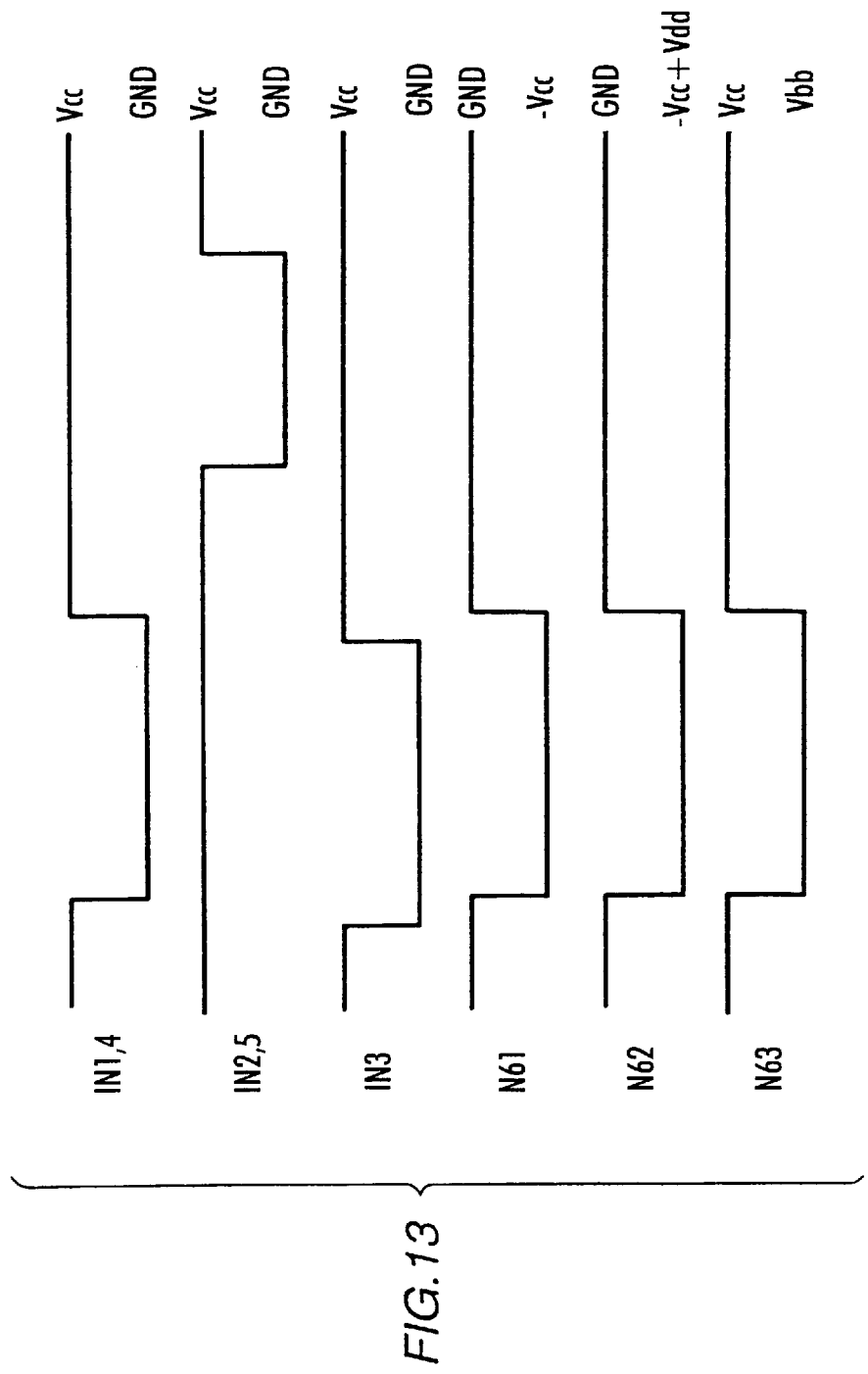
FIG. 13 is a timing chart illustrating the operation of the lowered potential generating circuit shown in FIG. 12.

FIG. 13 is a timing chart showing the operation of the lowered potential generating circuit shown in FIG. 12.

Referring to FIGS. 12 and 13, in a standby state, signals IN1 to IN5 are all at the "H" level. At this time, nodes N61 and N62 are precharged to the ground potential GND, and PMOS transistor 111 is off.

Before the signals IN1 and IN4 at "L" level are input, the signal IN3 which is at the "L" level is input to level converting circuit 101. Therefore, NMOS transistor 21 is rendered nearly off, and PMOS transistor 35 turns off. Further, PMOS transistor 27 and NMOS transistor 29 turn on.

Then, the signal IN4 at "L" level is input to level converting circuit 101, PMOS transistor 25 and NMOS transistor 31 turn on, and PMOS transistor 33 and NMOS transistor 23 turn off. Consequently, level converting circuit 101 outputs the lowered potential Vbb from node N65 to node N63, and the potential at node N63 attains to the lowered potential Vbb. From the same reason as described with reference to FIG. 3, the through current flowing through level converting circuit 101 is prevented.

Meanwhile, when the signal IN1 attains to the "L" level, node N61 is lowered to −Vcc. At this time, by the capacitor 107, in response to the potential at node N63 attaining Vbb, the potential at node N62 is lowered to −Vcc +Vbb. Consequently, PMOS transistor 111 turns on, and the potential (−Vcc) at node N61 is transmitted to node N64.

Before the signals IN1 and IN4 at "L" level are set to the "H" level, the signal IN3 at "L" level is set to "H" level.

Consequently, PMOS transistor 27 turns off and NMOS transistor 29 is rendered nearly off. Further, PMOS transistor 35 and NMOS transistor 21 turn on. Thereafter, signal IN4 is changed from "L" level to "H" level. Consequently, PMOS transistor 25 and NMOS transistor 31 turn off, PMOS transistor 33 and NMOS transistor 23 turn on, and hence level converting circuit outputs the power supply potential Vcc at node N63. From the same reason as described with reference to FIG. 3, the through current flowing through level converting circuit 101 is prevented.

When the signal IN1 is changed from "L" level to "H" level, the potential at node N61 is set to the ground potential GND. At this time, by capacitor 107, in response to the potential at node N63 attaining the power supply potential Vcc, the potential at node N62 is set to the ground potential GND. Therefore, PMOS transistor 111 turns off.

Then, the signals IN2 and IN5 are changed from "H" level to "L" level. Therefore, PMOS transistors 113 and 117 turn on, and nodes N61 and N62 are precharged to the ground potential GND. Signals IN2 and IN5 are set to the "H" level.

The lowered potential generating circuit repeats the above described operation to set the potential at node N64 to the lowered potential Vbb.

As described above, when the potential is to be transmitted from node N61 to node N64, −Vcc+Vbb is applied by level converting circuit 101 to the gate of PMOS transistor 111.

Therefore, since the absolute value of the gate potential of PMOS transistor 111 is larger by more than the absolute value of the threshold voltage Vth than the absolute value of source potential Vbb of PMOS transistor 111, the potential (−Vcc) at node N61 is fully transmitted to node N64. Here, PMOS transistor 111 has its source connected to node N64, and the threshold voltage Vth is the threshold voltage of PMOS transistor 111.

Further, since the level converting circuit 101 similar to that shown in FIG. 3 is used, the through current flowing through level converting circuit 101 can be prevented, from the same reason as described with reference to FIG. 3. Therefore, in the lowered potential generating circuit in accordance with the sixth embodiment, efficiency in generating the lowered potential can be improved. More specifically, since nodes N64 and N65 are connected, when a through current flows through level converting circuit 101, lowered potential Vpp will flow to the node N having the power supply potential Vcc, degrading efficiency in generating the lowered potential Vbb. However, in the present embodiment, the through current in the level converting circuit 101 is prevented, and hence the lowered potential Vbb can be generated efficiently.

The lowered potential generated by the lowered potential generating circuit may be used as a substrate potential of a DRAM, for example.

[Seventh Embodiment]

Figure 14:
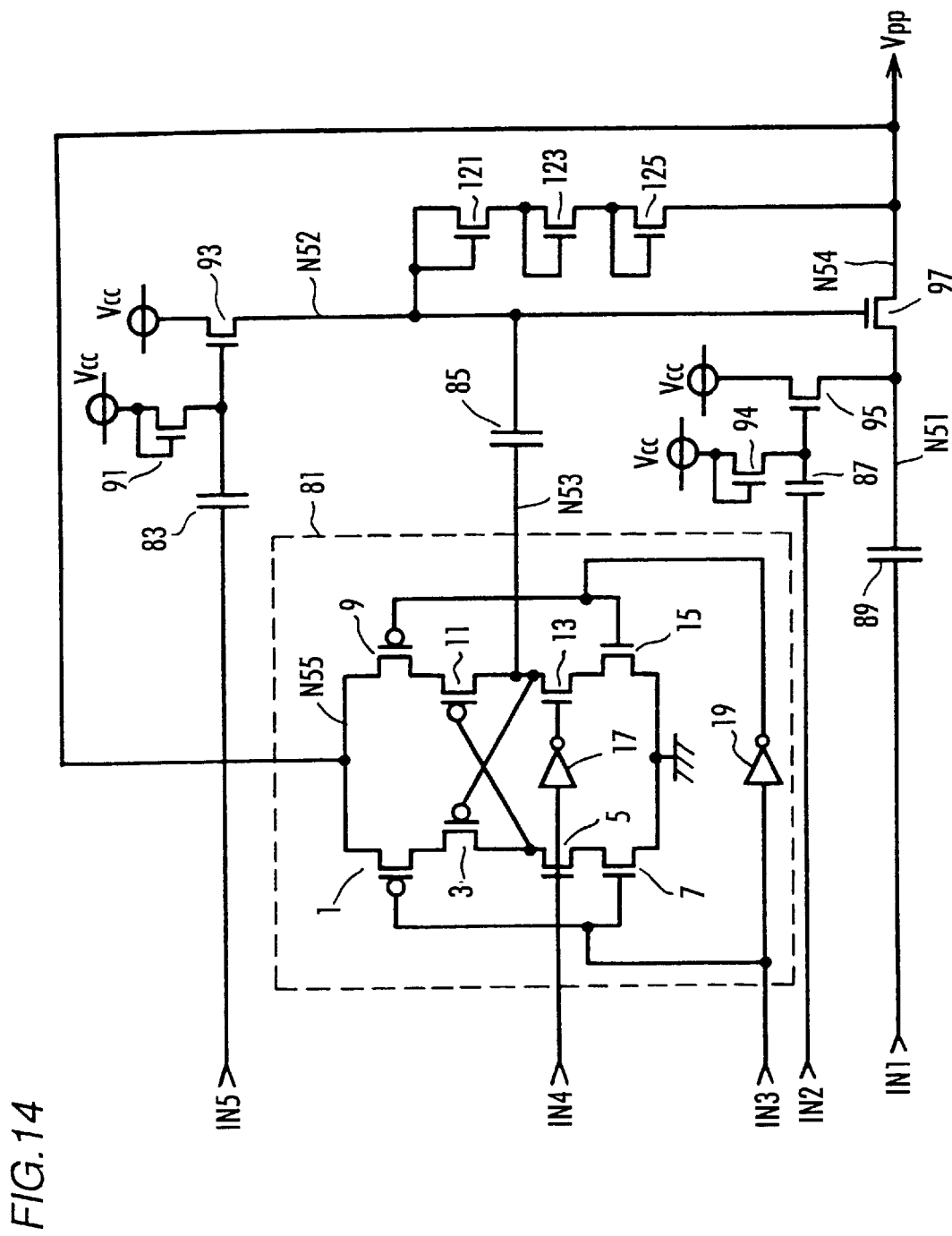
FIG. 14 is a circuit diagram showing a boosted potential generating circuit as an internal potential generating circuit in accordance with a seventh embodiment of the present invention.

FIG. 14 is a circuit diagram showing details of a boosted potential generating circuit as an internal potential generating circuit in accordance with the seventh embodiment of the present invention.

Referring to FIG. 14, the boosted potential generating circuit in accordance with the seventh embodiment includes NMOS transistors 121, 123, 125 connected in series between nodes N52 and N54 of the boosted potential generating circuit shown in FIG. 10. Each of the NMOS transistors 121, 123, and 125 is diode connected. Portions corresponding to those of FIG. 10 are denoted by the same reference characters and description thereof is not repeated.

NMOS transistors 121 to 125 fix the potential at node N52 so that it does not exceed Vpp+Vth. More specifically, if the potential at node N52 exceeds vpp +3 Vth, NMOS transistors 121 to 125 turn on to cause positive charges flow to node N54, so as to adjust the potential at node N52. The threshold voltage Vth is the threshold voltage of NMOS transistors 121 to 125.

Here, conventionally, excessive positive charges at node N52 are caused to flow to the node having the power supply potential Vcc or to the node having the ground potential GND. However, in the present embodiment, the positive charges are caused to flow to node N54 which is the output node of boosted potential Vpp, and hence efficiency in generating the boosted potential Vpp is not degraded.

As described above, in the seventh embodiment of the present invention, the potential at node N52 is adjusted by using NMOS transistors 121 to 125. Therefore, when the potential is increased at node N52 by capacitor 85, too much increase in potential at node N52 can be readily prevented.

[Eighth Embodiment]

Figure 15:
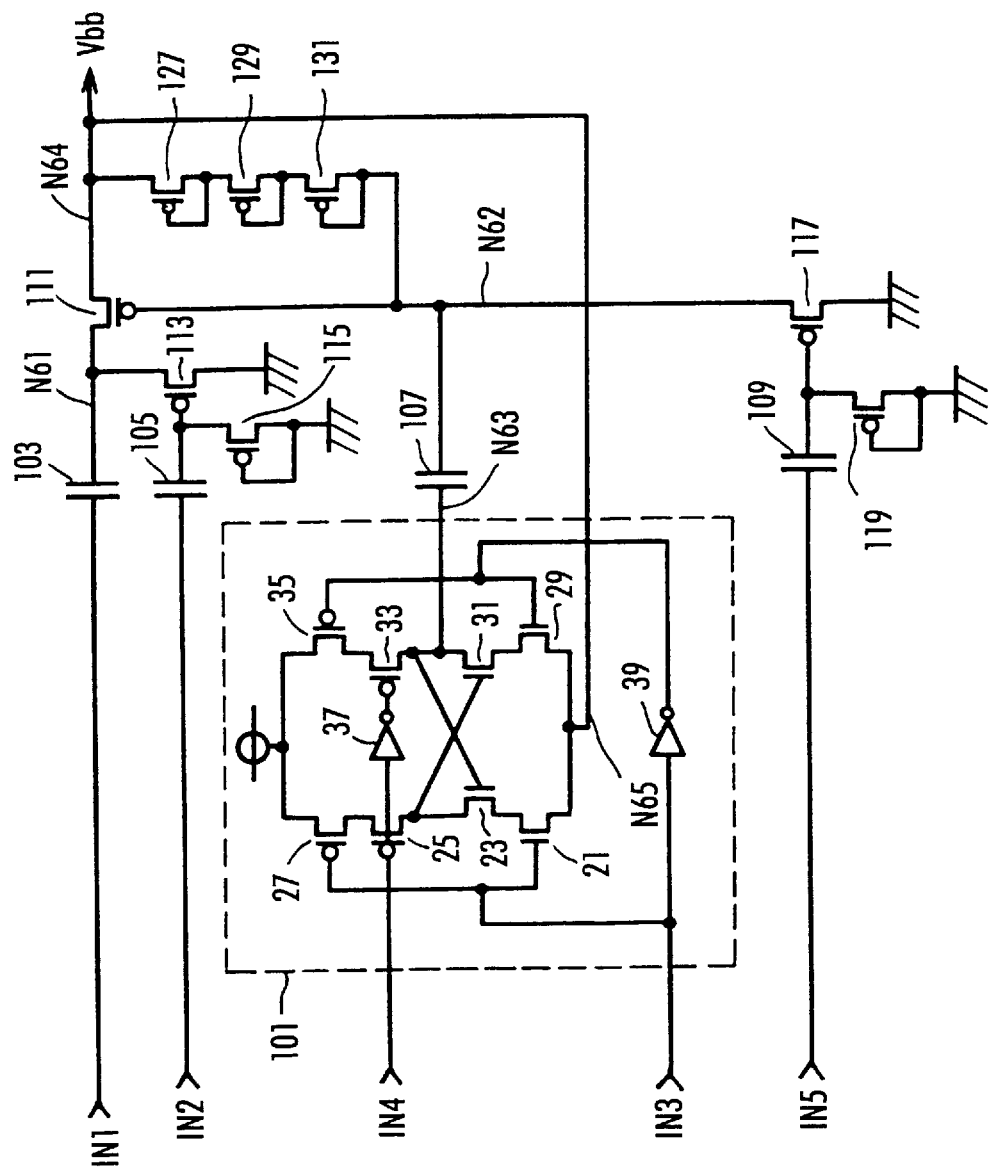
FIG. 15 is a circuit diagram showing a lowered potential generating circuit as an internal potential generating circuit in accordance with an eighth embodiment of the present invention.

FIG. 15 is a circuit diagram showing details of the lowered potential generating circuit as the internal potential generating circuit in accordance with the eighth embodiment of the present invention.

Referring to FIG. 15, the lowered potential generating circuit in accordance with the eighth embodiment corresponds to the lowered potential generating circuit of FIG. 12 and additionally includes PMOS transistors 127, 129 and 131 connected in series between nodes N62 and N64. PMOS transistors 127 to 131 are diode connected. Portions corresponding to those of FIG. 12 are denoted by the same reference characters, and description thereof is not repeated.

PMOS transistors 127 to 131 turn on when the potential at a node N62 becomes lower than Vbb−3 Vth, and causes excessive negative charges to flow from node N62 to N64.

Conventionally, excessive negative charges at node N62 are caused to flow to the node having the power supply potential Vcc or the node having the ground potential GND. However, in the present embodiment, excessive negative charges are caused to flow to node N64 which is the output node of lowered potential Vbb. Therefore, efficiency in generating the lowered potential Vbb is not degraded. The threshold voltage Vth is the threshold voltage of PMOS transistors 127 to 131.

As described above, in the lowered potential generating circuit according to the eighth embodiment, the potential at node N62 is adjusted by using PMOS transistors 127 to 131. Therefore, when node N62 has its voltage lowered by capacitor 107, too much lowering of the potential at node N62 can be readily prevented.

[Ninth Embodiment]

Figure 16:
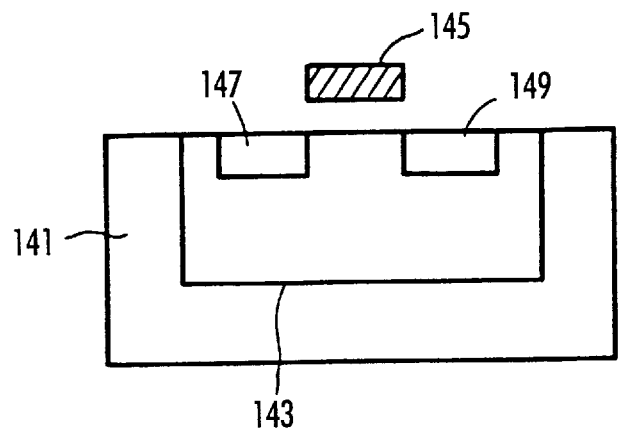
FIG. 16 shows a structure of a general MOS transistor.

FIG. 16 is a schematic diagram showing a structure of a general NMOS transistor.

Referring to FIG. 16, a general NMOS transistor has a P well formed at a P type semiconductor substrate. In the P well, source electrode 147 and drain electrode 149 are formed. More specifically, N type impurity is introduced to the P well to form $N^+$ layer serving as source electrode 147 and drain electrode 149. Thereafter, a gate electrode 145 is formed, for example, of polycrystalline silicon. The structure is similar in a PMOS transistor.

Figure 17:
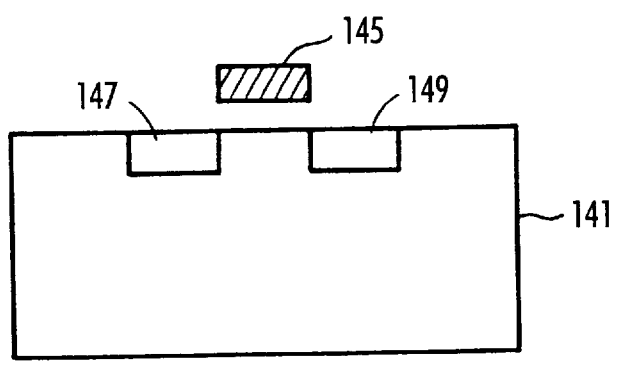
FIG. 17 shows a structure of an MOS transistor used in an internal potential generating circuit in accordance with a ninth embodiment of the present invention.

FIG. 17 shows a structure of an NMOS transistor used as the boosted potential generating circuit, as the internal potentia generating circuit in accordance with the ninth embodiment of the present invention.

Referring to FIG. 17, in the NMOS transistor, source electrode 147 and drain electrode 149 are formed directly in P type semiconductor substrate. More specifically, N type impurity is directly introduced to p type semiconductor substrate to form N⁺ layers, which will be the source electrode 147 and the drain electrode 149. Gate electrode 145 is formed, for example, of polycrystalline silicon.

By this structure, the NMOS transistor shown in FIG. 17 comes to have lower threshold voltage Vth than the NMOS transistor shown in FIG. 16. The same applies to PMOS transistor.

The boosted potential generating circuit in accordance with the ninth embodiment utilizes such an NMOS transistor as the NMOS transistors 91, 93, 94, 95 and 97 of the boosted potential generating circuit shown in FIG. 10 or 14.

As described above, in the boosted potential generating circuit in accordance with the ninth embodiment of the present invention, since NMOS transistor having lowered threshold voltage Vth is used, positive charges can be transmitted from the drain to the source with high efficiency as compared with the NMOS transistor shown in FIG. 16. Therefore, efficiency of the boosted potential generating circuit as a whole can be improved. Further, in addition to the effects provided by the boosted potential generating circuit shown in FIG. 10 or 14, the boosted potential Vpp can be surely generated.

A modification of the boosted potential generating circuit in accordance with the ninth embodiment utilizes the NMOS transistor having lower threshold voltage shown in FIG. 17 as a capacitor, that is, such NMOS transistors are used as capacitors 83, 85, 87 and 89 of the boosted potential generating circuit shown in FIGS. 10 and 14. In the NMOS transistor having smaller threshold voltage, channel from the source to the drain is formed more easily, and hence a NMOS transistor having lower threshold voltage is easily rendered a capacitor.

Therefore, in the modification of the boosted potential generating circuit in accordance with the ninth embodiment, the efficiency of the boosted potential generating circuit as a whole can be improved.

Meanwhile, a PMOS transistor having smaller absolute value of the threshold voltage manufactured in the similar manner as the NMOS transistor shown in FIG. 17 may be used as the PMOS transistors 11, 113, 115, 117, 119 or as capacitors 103, 105, 107 and 109 of the lowered potential generating circuit shown in FIG. 12 or 15 to provide similar effects as described above.

[Tenth Embodiment]

The internal potential generating circuit in accordance with the tenth embodiment utilizes an MOS transistor having high breakdown voltage as NMOS transistor 93 of FIG. 10, PMOS transistor 117 of FIG. 12, NMOS transistor 93 of FIG. 14 and PMOS transistor 117 of FIG. 15, respectively.

An example in which an NMOS transistor having high breakdown voltage is used as the NMOS transistor 93 of the boosted potential generating circuit shown in FIG. 10 will be described. Referring to FIGS. 10 and 11, the potential between gate and source (on the side of node N52) of NMOS transistor 93 is, at most, Vpp, and hence there is a possibility that a common NMOS transistor is broken.

Therefore, an NMOS transistor having high breakdown voltage which is hard to be broken even when the gate•source potential repeatedly attains Vpp is used as NMOS transistor 93. This also applies to NMOS transistor 93 shown in FIG. 14. More specifically, by the level converting circuit 81 shown in FIG. 10, the potential at node N52 is repeatedly increased to Vcc+Vpp. Therefore, in order to prevent breakdown of NMOS transistor 93, a transistor having higher breakdown voltage is used.

An example in which a PMOS transistor having high breakdown voltage is used as the PMOS transistor 117 of the lowered potential generating circuit in FIG. 12 will be described. Referring to FIGS. 12 and 13, the absolute value of the potential between the gate and source (on the side of N62) of PMOS transistor is, at most, the absolute value of −Vcc+Vbb.

Therefore, it is possible that a common PMOS transistor is broken. Therefore, the PMOS transistor having higher breakdown voltage which is hard to be broken even if the absolute value of the potential between the gate and source repeatedly attains to the absolute value of −Vcc+Vbb is used as the PMOS transistor 117. More specifically, since the potential at node N62 is repeatedly lowered to −Vcc+Vbb by level converting circuit 101 shown in FIG. 12, the PMOS transistor having high breakdown voltage is used as PMOS transistor 117 to prevent breakdown.

As described above, in the internal potential generating circuit in accordance with the tenth embodiment of the present invention, an MOS transistor having high breakdown voltage which is not broken even when the absolute value of the potential between gate and source of MOS transistor 93 or 117 attains to Vpp or −Vcc+Vbb repeatedly is used. Therefore, breakdown of MOS transistor 93 or 117 can be prevented, and hence internal potential generating circuit comes to have higher reliability.

[Eleventh Embodiment]

Figure 18:
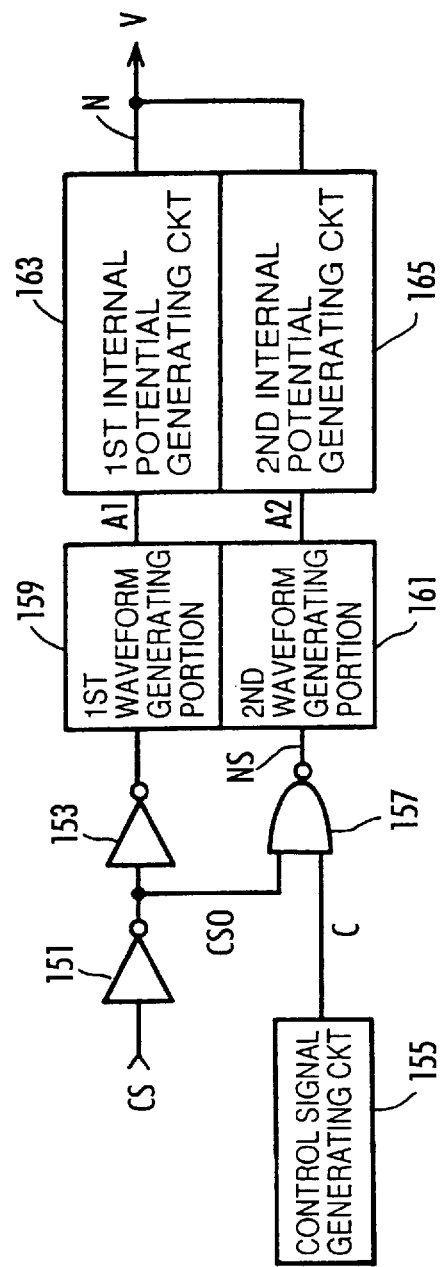
FIG. 18 is a schematic block diagram showing an internal potential generating unit in accordance with an eleventh embodiment of the present invention.

FIG. 18 is a schematic block diagram showing an internal potential generating unit in accordance with the eleventh embodiment of the present invention.

Referring to FIG. 18, the internal potential generating unit in accordance with the eleventh embodiment includes inverters 151, 153, control signal generating circuit 155, an NAND circuit 157, a first waveform generating portion 159, a second waveform generating portion 161, a first internal potential generating circuit 163 and a second internal potential generating circuit 165.

A clock signal CS is input to an input node of inverter 151. Two input nodes of NAND circuit 157 are connected to an output node of inverter 151 and an output node of control signal generating circuit 155. The first waveform generating portion 159 is connected to inverter 153. The first waveform generating portion 159 is connected to the first internal voltage generating circuit 163. The NAND circuit 57 has its output node connected to the second waveform generating portion 161. The second internal potential generating circuit 165 is connected to the second waveform generating portion 161. The first internal potential generating circuit 163 and the second internal potential generating circuit 165 have a common output node.

The first and second internal potential generating circuits 163 and 165 may be the boosted potential generating circuit shown in FIG. 10 or FIG. 14, or the lowered potential generating circuit shown in FIG. 12 or 15. First and second driving signals A1 and A2 output from the first and second waveform generating portions 159 and 161 include a plurality of signals, though not shown. For example, the first and second driving signals A1 and A2 may include signals IN1 to IN5 shown in FIG. 10, 12, 14 or 15.

Figure 19:
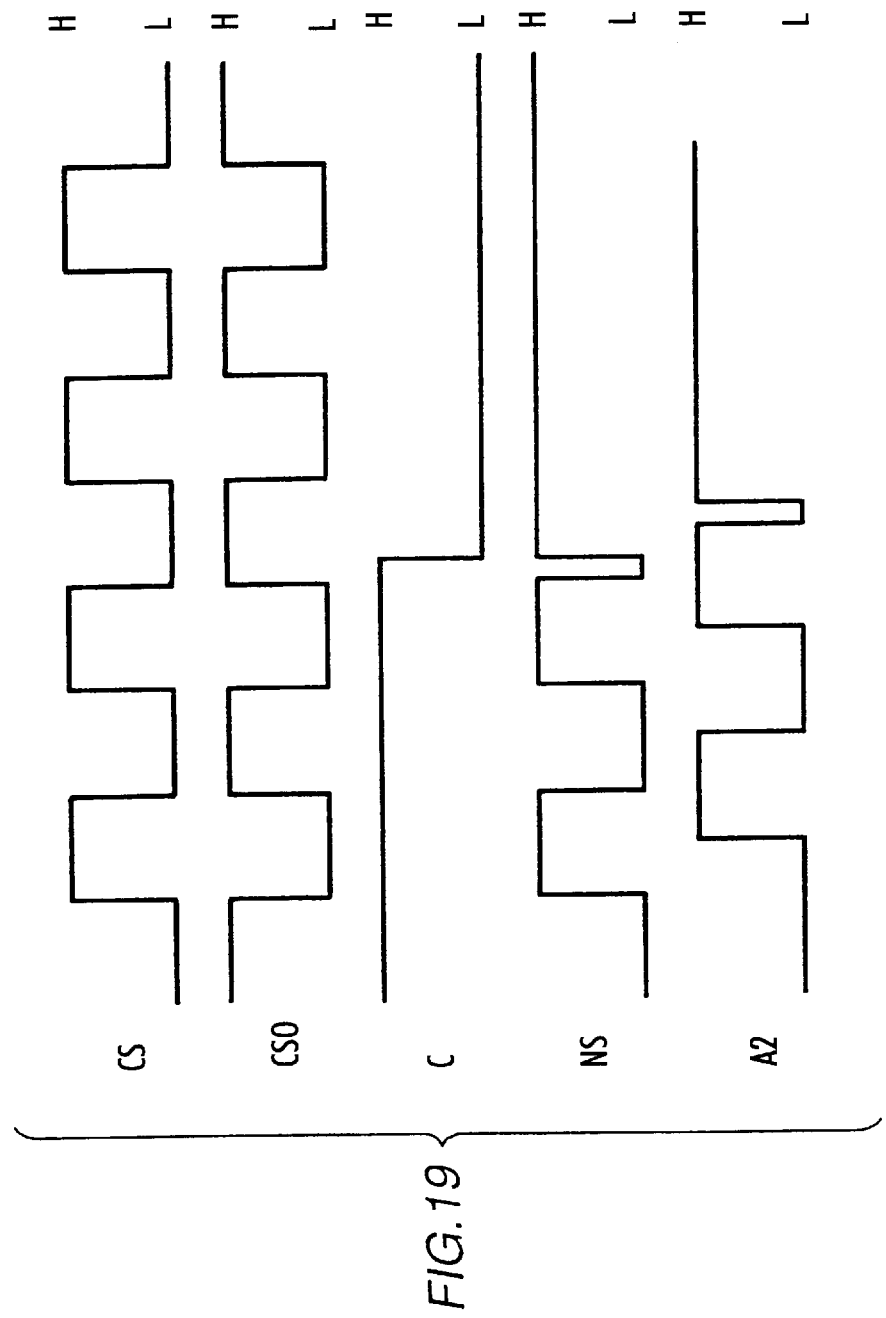
FIG. 19 is a timing chart illustrating the operation of the internal potential generating unit shown in FIG. 18.

FIG. 19 is a timing chart showing the operation of the internal potential generating unit shown in FIG. 18.

Referring to FIGS. 18 and 19, clock signal CS is input to inverter 151, and inverter 151 outputs an inverted clock signal CS0 by inverting clock signal CS. Here, if the control signal C output from control signal generating circuit 155 is at "H" level, NAND circuit 157 outputs a signal NS which is a pulse signal similar to clock signal CS to the second waveform generating portion 161. In response to the signal NS which is a pulse signal, the second waveform generating portion 161 generates a second driving signal A2 which is also a pulse signal, to the second internal potential generating circuit 165. In response to the second driving signal A2, which is the pulse signal, the second internal potential generating circuit 165 outputs a second internal potential to node N.

Meanwhile, the first waveform generating portion 159 receives a clock signal CS through inverters 151 and 153, and generates a first driving signal A1 which is a pulse signal. The first internal potential generating circuit 163 outputs, in response to the first driving signal A1 which is the pulse signal, the first internal potential to node N. More specifically, the potential at node N attains to an output potential V which is the sum of the first internal potential output from the first internal potential generating circuit 163 and the second internal potential output from the second internal potential generating circuit 165.

When the control signal C from control signal generating circuit 155 is set to "L" level while the clock signal CS is being input, the signal NS from NAND circuit 157 is fixed at "H" level. The second waveform generating portion 161 receives the signal NS fixed at "H" level, and outputs the second driving signal A2 fixed at "H" level to the second internal potential generating circuit 165. Consequently, the second internal potential generating circuit 165 stops its operation. Though an example in which the signal A2 is fixed at "H" level when the signal NS at "H" level is input to the second waveform generating portion 161 has been described, the second driving signal A2 may be fixed to "L" level.

Meanwhile, since the clock signal CS is input through inverters 151 and 153 to the first waveform generating portion 159, the first internal potential generating circuit 163 is in operation, outputting the first internal potential to node N. In this case, the first internal potential is output as the output potential V.

As described above, in the internal potential generating unit in accordance with the eleventh embodiment of the present invention, simply by changing the level of the control signal C from control signal generating circuit 155, on/off of the second internal potential generating circuit 165 can be controlled, and hence performance of the internal potential generating unit can be readily switched.

In the conventional internal potential generating unit, the performance of the internal potential generating unit was switched by switching aluminum interconnection, which was troublesome. However, in accordance with the present embodiment, the performance can be switched easily simply by switching the level of the control signal C.

The present embodiment may be utilized when 4K refresh (refresh of all the memory cells by 4K times) and 8K refresh (in which all the memory cells are refreshed by 8K times) are to be switched in a DRAM, for example. At the time of 4K refresh, both the first and second internal potential generating circuits 163 and 165 are operated. For 8K refresh, only the first internal potential generating circuit 163 is operated.

[Twelfth Embodiment]

Figure 20:
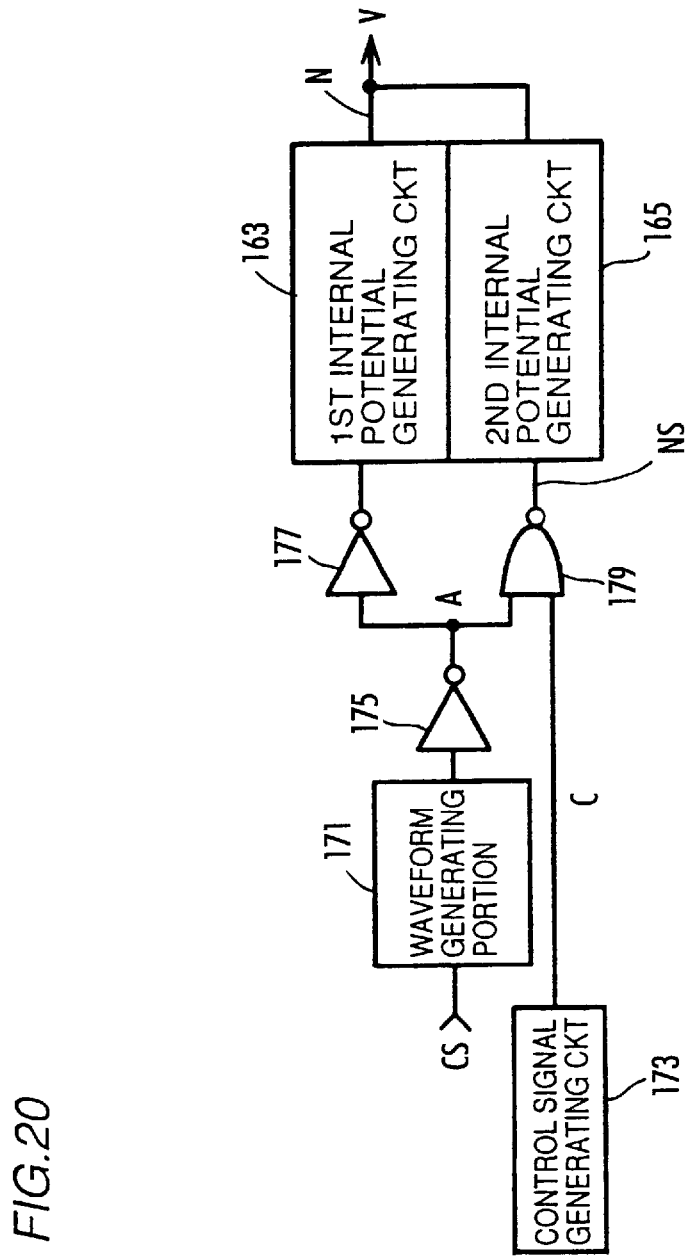
FIG. 20 is a schematic block diagram showing an internal potential generating unit in accordance with a twelfth embodiment of the present invention.

FIG. 20 is a schematic block diagram showing an internal potential generating unit in accordance with the twelfth embodiment of the present invention.

Referring to FIG. 20, the internal potential generating unit in accordance with the twelfth embodiment includes a waveform generating portion 171, a control signal generating circuit 173, inverters 175, 177, an NAND circuit 179, a first internal potential generating circuit 163 and a second internal potential generating circuit 165.

Portions corresponding to those of FIG. 18 are denoted by the same reference characters and description thereof is not repeated. Waveform generating portion 171 receives a clock signal CS. Waveform generating portion 171 has its output node connected to an input node of inverter 175. Inverter 175 has its output node connected to an input node of inverter 177 and to one input node of NAND circuit 179.

Inverter 177 has its output node connected to the first internal potential generating circuit 163. NAND circuit 179 has its the other input node connected to control signal generating circuit 173. NAND circuit 179 has its output node connected to the second internal potential generating circuit. The output node of the first and second internal potential generating circuits 163 and 165 is node N.

An output signal from waveform generating portion is inverted by inverter 175 to be a driving signal A. Actually, the driving signal A includes a plurality of signals, such as signals IN to IN5 shown in FIG. 10, 12, 14, and 15. Accordingly, the signal NS actually includes a plurality of signals.

Figure 21:
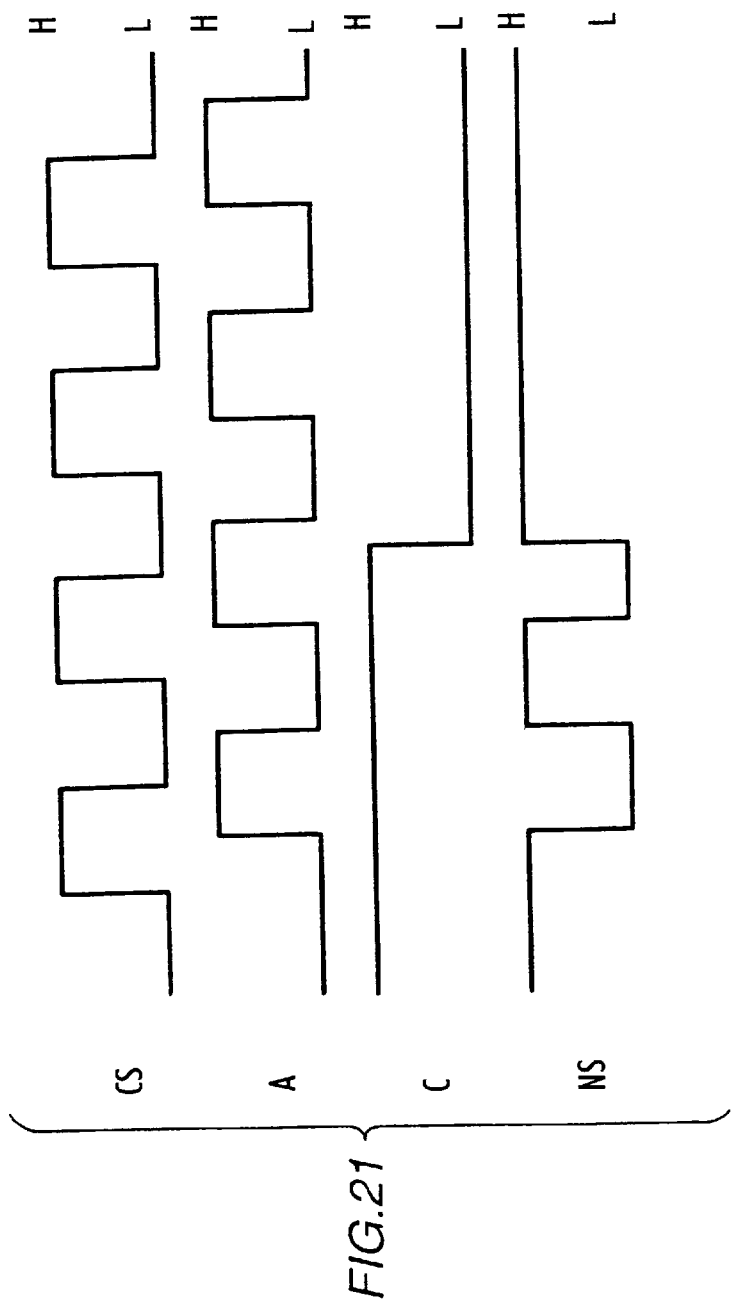
FIG. 21 is a timing chart illustrating the operation of the internal potential generating unit shown in FIG. 20.

FIG. 21 is a timing chart showing the operation of the internal potential generating unit shown in FIG. 20.

Referring to FIGS. 20 and 21, clock signal CS is input to waveform generating portion 171. Waveform generating portion 171 outputs driving signal A which is a pulse signal.

While control signal C at "H" level is being input from control signal generating circuit 173 to NAND circuit 179, NAND circuit 179 outputs a signal NS which is a pulse signal. The signal NS, which is a pulse signal, is obtained by inverting driving signal A, which is also the pulse signal. The second internal potential generating circuit 165 receives the pulse signal NS, and outputs the second internal potential node N.

Meanwhile, the first internal potential generating circuit 163 receives the driving signal A which is the pulse signal, and outputs the first internal potential to node N. More specifically, both the first and second internal potentials are output to node N, and hence the output voltage V is the sum of the first and second internal potentials.

When the control signal C from control signal generating circuit 173 is set to "L" level, the signal NS is fixed to "H" level. Therefore, the second internal potential generating circuit 165 stops its operation. Consequently, only the first internal potential from the first internal potential generating circuit 163 is output to node N, and the first internal potential will be the output potential V.

As described above, in the internal potential generating unit in accordance with the twelfth embodiment of the present invention, on/off of the second internal potential generating circuit 165 is controlled by the control signal C. Therefore, performance of the internal potential generating unit can be readily switched.

In a DRAM, for the 4K refresh, control signal C is set to "H" level, so that both first and second internal potential generating circuits 163 and 165 are operated. When 8K refresh is desired, control signal C is set to "L" level, so as to operate only a first internal potential generating circuit 163.

Conventionally, when the performance of the internal potential generating unit is to be switched, aluminum interconnection was switched, which was troublesome. However, according to the present embodiment, the performance of the internal potential generating unit can be switched easily simply by switching the level of the control signal C.

[Thirteenth Embodiment]

FIG. 22 is a circuit diagram showing details of the level converting circuit in accordance with the thirteenth embodiment of the present invention. Portions corresponding to those of FIG. 1 are denoted by the same reference characters and description thereof is not repeated. In FIG. 22, input signals IN1 and IN2 are the same as signals IN1 and IN2 input to the level converting circuit shown in FIG. 1. Therefore, description of level converting circuit in accordance with the thirteenth embodiment will be made referring to the timing chart of FIG. 2.

Referring to FIG. 22, the level converting circuit in accordance with the thirteenth embodiment includes PMOS transistors 3, 11, 1001, 1003, NMOS transistors 5, 13, 1005, 10007 and inverters 17 and 19.

PMOS transistor 3, 1001 and NMOS transistor 1005, 5 constitute an input portion. PMOS transistor 1001 is a first current cutting means for the input portion. NMOS transistor 1005 is a second current cutting means for the input portion.

PMOS transistor 11, 1003 and NMOS transistors 1007, 13 constitute an output portion. PMOS transistor 1003 is a first current cutting means for the output portion. NMOS transistor 1007 is a second current cutting means for the output portion.

PMOS transistor 3, 1001 and NMOS transistor 1005, 5 are connected in series between the node N1 having the boosted potential Vpp and node N2 having the ground potential. PMOS transistor 3 has its source connected to node N1 and has its drain connected to the source of PMOS transistor 1001. PMOS transistor 1001 has its drain connected to node N3. NMOS transistor 5 has its source connected to node N2 and its drain connected to the source of NMOS transistor 1005. NMOS transistor 1005 has its drain connected to node N3. PMOS transistor 1001 and NMOS transistor 1005 receive at their gates the signal IN2. The signal IN1 is input to the gate of NMOS transistor 5.

PMOS transistors 11, 1003 and NMOS transistors 13, 1007 are connected in series between nodes N1 and N2. PMOS transistor 11 has its source connected to node N1, and its drain connected to the source of PMOS transistor 1003. PMOS transistor 1003 has its drain connected to node N4. NMOS transistor 13 has its source connected to node N2, and its drain connected to the source of NMOS transistor 1007. NMOS transistor 1007 has its drain connected to node N4. PMOS transistor 1003 and NMOS transistor 1007 receive at their gates the signal IN2 inverted by inverter 19. The signal IN1 inverted by inverter 17 is input to the gate of NMOS transistor 17.

PMOS transistor has its gate connected to node N4. PMOS transistor 11 has its gate connected to node N3. Node N4 is an output node and outputs the signal OUT.

Referring to FIGS. 22 and 2, before the signal IN1 at "H" level is input to the gate of NMOS transistor 5, the signal IN2 at "H" level is input to the gate of PMOS transistor 1001 and NMOS transistor 1005. Consequently, even when PMOS transistor 3 and NMOS transistor 5 simultaneously turn on in response to the input of the signal IN1 at "H" level, PMOS transistor 1001 is rendered nearly off (that is, tends to have high resistance; hereinafter simply referred to as "off") in advance, and hence through current between nodes N1 and N2 can be prevented.

Before the signal IN1 at "H" level is input to the gate of NMOS transistor 5, a signal obtained by inverting signal IN2, that is, a signal at "L" level is input to the gates of PMOS transistor 1003 and NMOS transistor 1003. More specifically, even when PMOS transistor 11 and NMOS transistor 13 simultaneously turn on in response to the input of the signal IN1 at "H" level to the input portion, NMOS transistor 1007 turns off in advance, and hence through current between nodes N1 and N2 can be prevented.

Before the signal IN1 at "H" level input to the gate of NMOS transistor 5 attains to "L" level, the signal IN2 at "H" level which has been input to the gate of PMOS transistor 1001 and NMOS transistor 1005 is set to "L" level. More specifically, even when PMOS transistor 3 and NMOS transistor 5 simultaneously turn on in response to the signal IN1 which changes from "H" to "L" level, NMOS transistor 1005 turns off in advance, and hence through current between nodes N1 and N2 can be prevented.

Before the signal IN1 at "H" level at the gate of NMOS transistor 5 is set to "L" level, the signal at "L" level obtained by inverting the signal IN2 which has been input to the gates of PMOS transistor 1003 and NMOS transistor 1007 is set to "H" level. More specifically, even when PMOS transistor 11 and NMOS transistor 13 simultaneously turn on in response to the signal IN1 changing from "H" level to "L" level, PMOS transistor 1003 is rendered nearly off (tends to have high resistance; hereinafter simply referred to as "off") in advance, and hence through current between nodes N1 and N2 can be prevented.

Here, while the signal IN1 at "H" is being input, the potential of signal OUT is the boosted potential Vpp which is higher than the power supply potential Vcc. In other words, the signal IN1 which has the level of power supply potential Vcc is converted to the signal OUT having the boosted potential Vbb.

As described above, in the level converting circuit in accordance with the thirteenth embodiment of the present invention, before PMOS transistor 3 and NMOS transistor 5 or PMOS transistor 11 and NMOS transistor 13 simultaneously turn on, PMOS transistor 1001 and NMOS transistor 1007 or PMOS transistor 1003 and NMOS transistor 1005 turn off in advance, and hence through current between nodes N1 and N2 can be prevented.

Similar effects as described above may be obtained by adapting the timing to set the signal IN1 to "H" level to be identical with the timing to set the signal IN2 to "H" level and adapting the timing to set the signal IN1 to "L" level to be identical with the timing to set the signal IN2 to "L" level.

More specifically, in this case, even when PMOS transistor 3 and NMOS transistor 5 or PMOS transistor 11 and NMOS transistor 13 simultaneously turn on, PMOS transistor 1001 and NMOS transistor 1007 or PMOS transistor 1003 and NMOS transistor 1005 turn off simultaneously, and hence through current between nodes N1 and N2 can be prevented.

Further, as shown in FIG. 7, it is possible to use a signal obtained by delaying signal IN by a delay circuit 59 as the signal IN1 shown in FIG. 22 and the signal IN not delayed may be used as the signal IN2 shown in FIG. 22.

[Fourteenth Embodiment]

Figure 23:
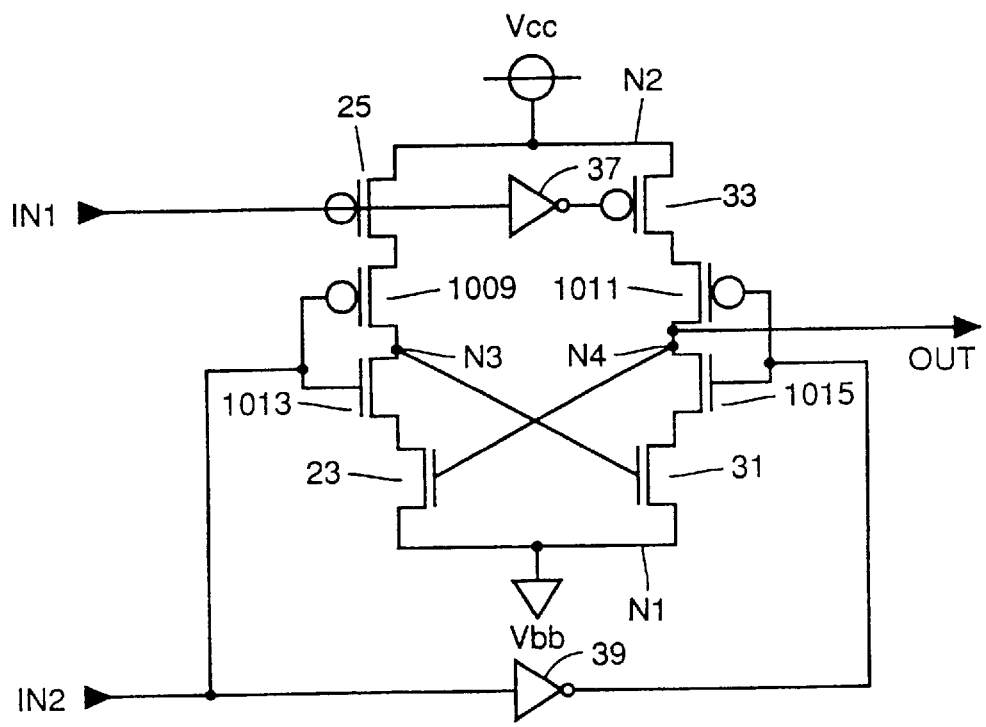
FIG. 23 is a circuit diagram showing a level converting circuit in accordance with a fourteenth embodiment of the present invention.

FIG. 23 is a circuit diagram showing details of the level converting circuit in accordance with the fourteenth embodiment of the present invention. Portions corresponding to those of FIG. 3 are denoted by the same reference characters and description thereof is not repeated. The signals IN1 and IN2 input to the level converting circuit shown in FIG. 23 are the same as the signals IN1 and IN2 input to the level converting circuit of FIG. 3. Therefore, the level converting circuit of FIG. 23 will be described referring to the timing chart of FIG. 4.

In the level converting circuit shown in FIG. 22, the level of the power supply potential Vcc is set to the level of the boosted potential Vpp which is higher. However, in the level converting circuit in accordance with the present embodiment, the level of the ground potential GND is converted to a level of a lowered potential Vbb, which is lower than the ground level.

Referring to FIG. 23, the level converting circuit in accordance with the present embodiment includes PMOS transistors 25, 33, and 1009, 1001, NMOS transistors 1003, 23, 1015, 31 and inverters 37 and 39.

PMOS transistors 25 and 1009 and NMOS transistors 1013 and 23 constitute an input portion. NMOS transistor 1013 is a first current cutting means for the input portion. PMOS transistor 1009 is a second current cutting means for the input portion.

PMOS transistors 33, 1011, and NMOS transistors 1015 and 31 constitute an output portion. NMOS transistor 1015 is a first current cutting means for the output portion. PMOS transistor 1011 is a second current cutting means for the output portion.

PMOS transistors 25, 1009 and NMOS transistors 1013 and 23 are connected in series between node N1 having lowered potential Vpp and node N2 having power supply potential Vcc. NMOS transistor 23 has its source connected to node N1, and its drain connected to the source of NMOS transistor 1013. NMOS transistor 1013 has its drain connected to the node N3. PMOS transistor 25 has its source connected to node N2, and its drain connected to the source of PMOS transistor 1009. PMOS transistor 1009 has its drain connected to node N3. PMOS transistor 25 receives at its gate the signal IN1. PMOS transistor 1009 and NMOS transistor 1013 receives at their gates the signal IN1.

PMOS transistors 33, 1001, and NMOS transistors 1015 and 31 are connected in series between nodes N1 and N2. NMOS transistor 31 has its source connected to node N1 and its drain connected to the source of NMOS transistor 1015. NMOS transistor 1015 has its drain connected to node N4. PMOS transistor 33 has its source connected to node N2, and its drain connected to the source of PMOS transistor 1001. PMOS transistor 1001 has its drain connected to node N4. PMOS transistor 33 receives at its gate the signal IN1 inverted by inverter 37. PMOS transistor 1001 and NMOS transistor 1015 receive at their gates the signal IN2 inverted by inverter 39.

NMOS transistor 23 has its gate connected to node N4. NMOS transistor 31 has its gate connected to node N3. Node N4 is an output node, which outputs the signal OUT.

Referring to FIGS. 23 and 4, before the signal at "L" level is input to the gate of PMOS transistor 25, the signal IN2 at "L" level is input to the gate of PMOS transistor 1009 and NMOS transistor 1013. More specifically, even when PMOS transistor 25 and NMOS transistor 23 turn on simultaneously in response to the signal IN1 at "L" level, NMOS transistor 1013 is rendered nearly off (tends to have high resistance; hereinafter simply referred to as "off") in advance, and hence through current between nodes N1 and N2 can be prevented.

Before the signal IN1 at "L" level is input to the gate of PMOS transistor 25, the inverted signal IN2, that is, a signal at "H" level is input to the gate of PMOS transistor 1011 and NMOS transistor 1015. More specifically, even when PMOS transistor 33 and NMOS transistor 31 simultaneously turn on in response to the input of the signal IN1 at "L" level, PMOS transistor 1011 turns off in advance, and hence through current between nodes N1 and N2 can be prevented.

Before the signal IN1 at "L" level which has been input to the gate of PMOS transistor 25 attains to the "H" level, the signal IN2 which is at "L" at the gates of PMOS transistor 1009 and NMOS transistor 1013 is changed to "H" level. More specifically, even when PMOS transistor 25 and NMOS transistor 23 simultaneously turn on in response to the signal IN1 changing from "L" level to "H" level, PMOS transistor 1009 turns off in advance, and hence through current between nodes N1 and N2 can be prevented.

Before the signal IN1 at "L" level which has been input to the gate of PMOS transistor 25 is changed to "H" level, the inverted signal IN2, that is, the signal at "L" level is input to the gate of PMOS transistor 1011 and NMOS transistor 1015. More specifically, even when PMOS transistor 33 and NMOS transistor 31 simultaneously turns on in response to the signal IN1 changing from "L" level to "H" level, NMOS transistor 1015 is rendered nearly off (tends to have high resistance; hereinafter simply referred to as "off") in advance, and hence through current between nodes N1 and N2 can be prevented.

While the signal IN1 at "L" level is being input, the potential of the signal OUT is the lowered potential Vbb which is lower than the ground potential GND. Namely, the signal IN1 having the ground potential GND is converted to the signal OUT having the lowered potential Vbb.

As described above, in the level converting circuit in accordance with the fourteenth embodiment, before PMOS transistor 25 and NMOS transistor 23 or PMOS transistor 33 and NMOS transistor 31 simultaneously turn on, PMOS transistor 1009 and NMOS transistor 1015 or PMOS transistor 1011 and NMOS transistor 1013 are turned off, so that through current between nodes N1 and N2 can be prevented.

The same effect as described above can be obtained by adapting the timing to set the signal IN1 to "L" level to be identical with the timing to set the signal IN2 to "L" level and by adapting the timing to set the signal IN1 to "H" level to be identical with the timing to set the signal IN2 to "H" level. More specifically, simultaneously with turning on of PMOS transistor 25 and NMOS transistor 23 or PMOS transistor 33 and NMOS transistor 31, NMOS transistor 1013 and PMOS transistor 1011 or NMOS transistor 1015 and PMOS transistor 1009 turn off, and hence through current between nodes N1 and N2 can be prevented.

As the signal IN1, a signal obtained by delaying the signal IN2 by delay circuit 59 such as shown in FIG. 7 may be used.

[Fifteenth Embodiment]

Figure 24:
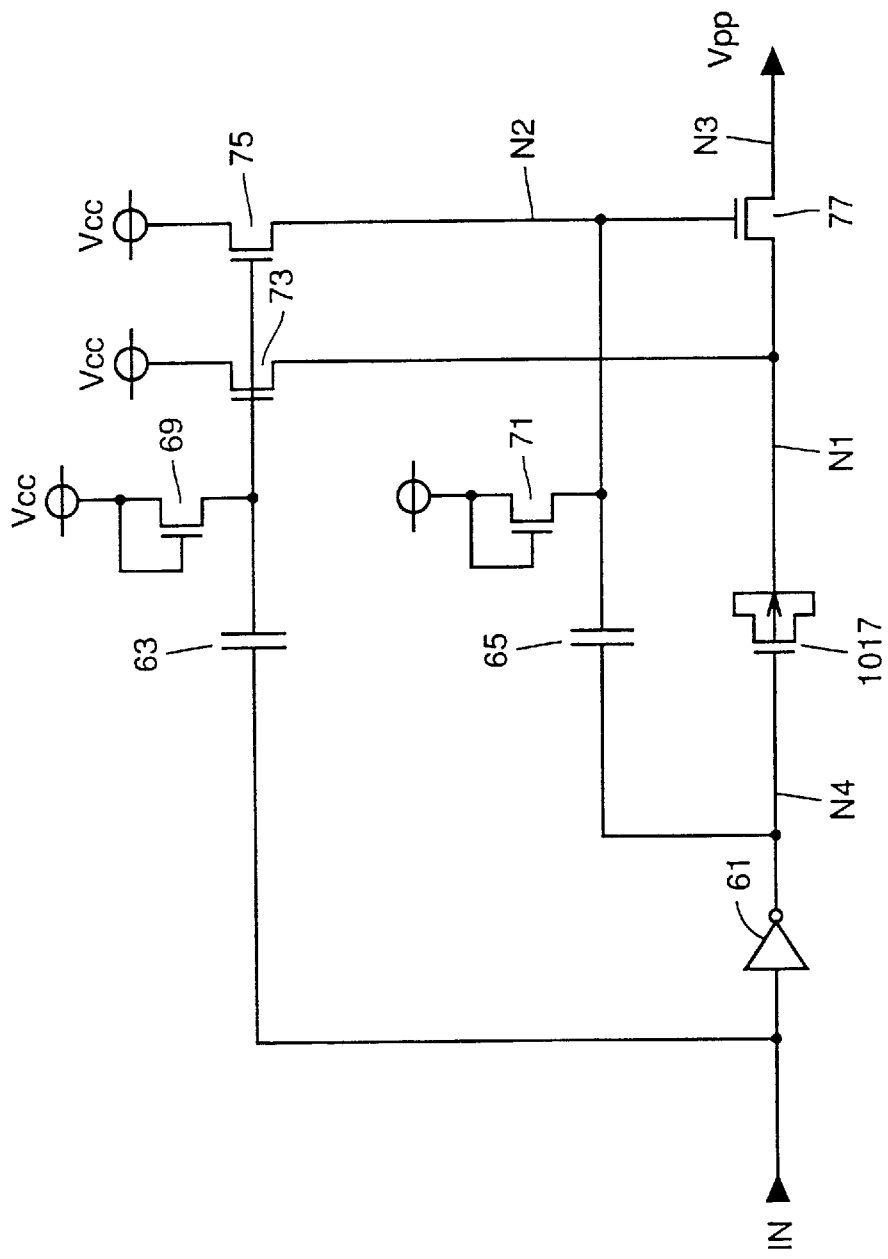
FIG. 24 is a circuit diagram showing a boosted potential generating circuit as a general internal potential generating circuit.

FIG. 24 is a circuit diagram showing details of a general boosted potential generating circuit. Portions corresponding to those of FIG. 8 are denoted by the same reference characters and description thereof is not repeated. The boosted potential generating circuit of FIG. 24 differs from the boosted potential generating circuit shown in FIG. 8 in the capacitor connected between node N1 and inverter 61. More specifically, the capacitor 67 of boosted potential generating circuit shown in FIG. 8 is different from capacitor 1017 of the boosted potential generating circuit shown in FIG. 24.

Referring to FIG. 24, capacitor 1017 is a PMOS transistor. The PMOS transistor as capacitor 1017 is of enhancement type. The enhancement type PMOS transistor 1017 has its gate connected to the input side of signal IN, that is, to node N4, and its source and drain are connected to node N1 on the output side of the boosted potential generating circuit. A channel is generated in the enhancement type PMOS transistor 1017, so that the gate side and the source and drain side are used as both sides of parallel plates of the capacitor.

Figure 25:
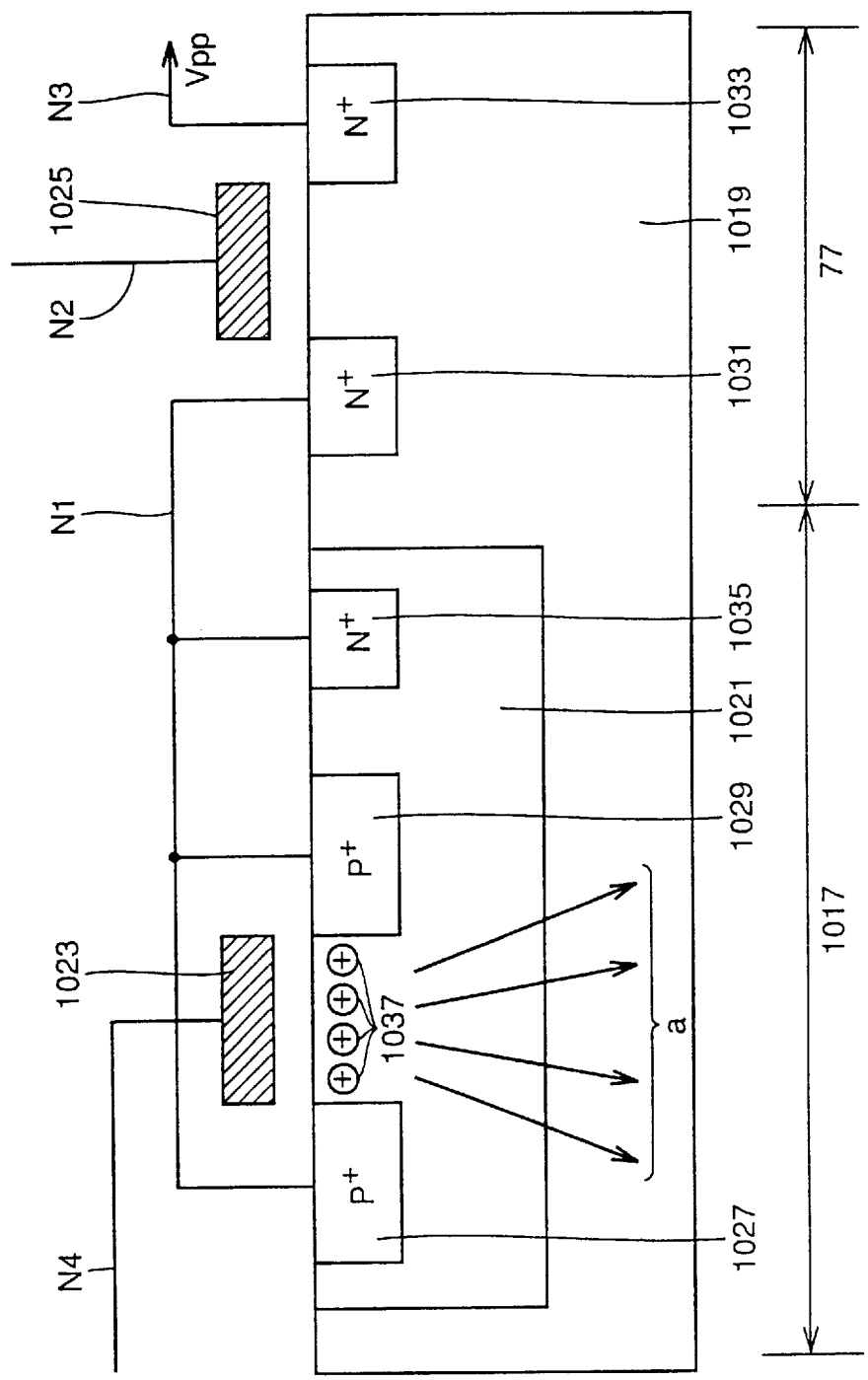
FIG. 25 shows structures of a capacitor 1017 and an NMOS transistor 77 shown in FIG. 24.

FIG. 25 shows structures of the enhancement type PMOS transistor as capacitor 1017 and NMOS transistor 77 shown in FIG. 24. Portion corresponding to those of FIG. 24 are denoted by the same reference characters and description thereof is not repeated.

Referring to FIGS. 24 and 25, the enhancement type PMOS transistor as capacitor 1017 is formed in the following manner. An N well 1021 is formed in P type semiconductor substrate 1019. In N well 1021, P$^+$ source/drain electrodes 1027 and 1029 as well as a potential fixing layer 1035 are formed. On a region where the channel is formed, an insulating film is formed and gate electrode 1023 is formed further thereon.

NMOS transistor 77 is formed through the following steps. N⁺ source/drain electrodes 1031 and 1033 are formed in P type semiconductor substrate 1019. On a region where the channel is formed, an insulating film is formed, and gate electrode 1025 is further formed thereon.

Figure 26:
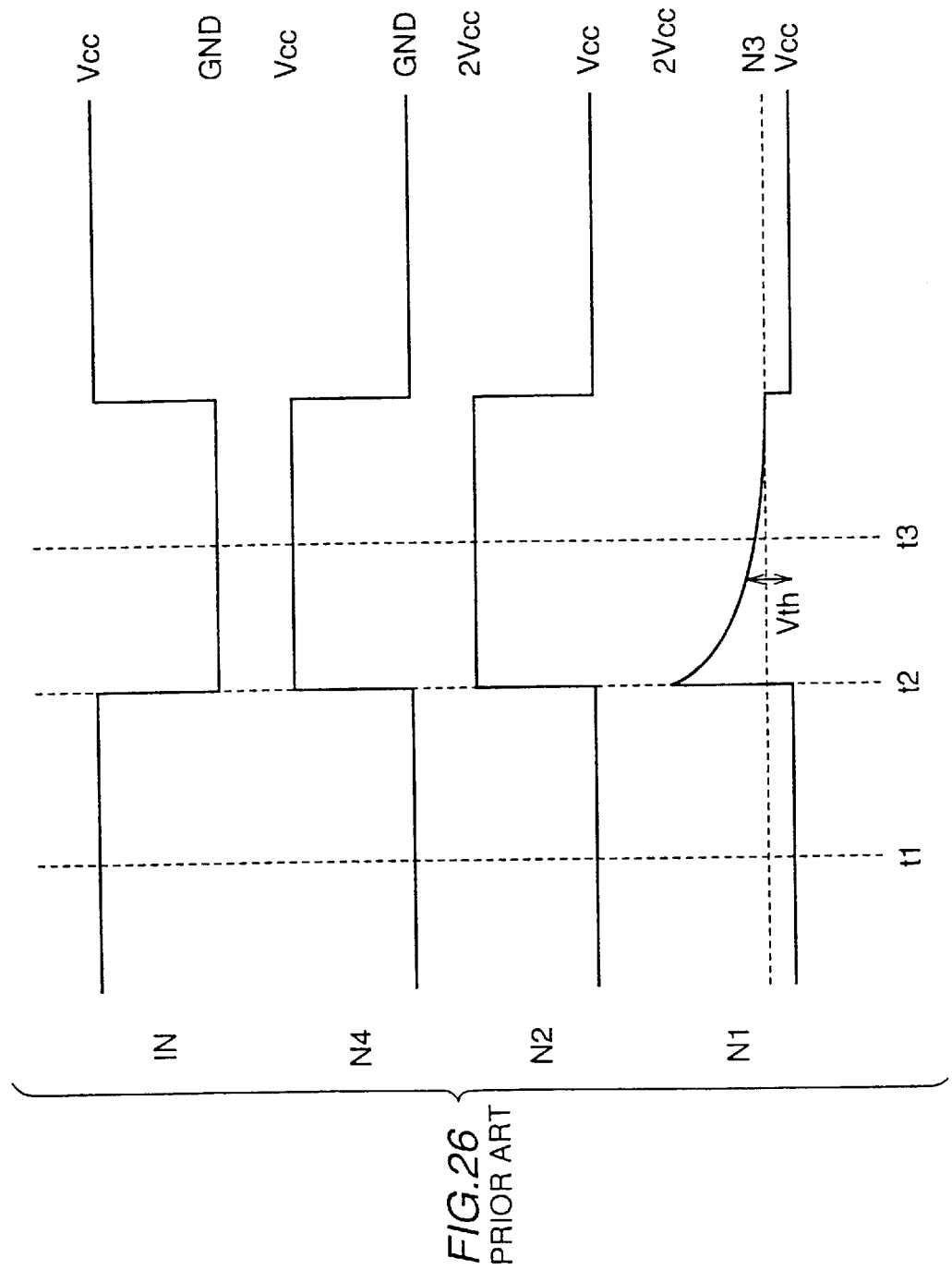
FIG. 26 is a timing chart showing the operation of the general boosted potential generating circuit shown in FIG. 24.

FIG. 26 is a timing chart showing the operation of general boosted potential generating circuit shown in FIG. 24.

Referring to FIGS. 24, 25 and 26, at time t1, when the signal IN is at "H" level, node N4 is at the level of the ground potential GND, and node N1 is at the level of the power supply potential Vcc. Therefore, the potential between the source and gate of PMOS transistor 1017 is −Vcc, and a channel is formed in PMOS transistor 1017 (in other words, holes 1037 are formed). More specifically, a capacitor is formed between gate 1023 and a channel.

At time t2, when the signal IN attains to "L" level, node N4 also changes from the GND level to the Vcc level. In response to the increase in level from GND to Vcc at node N4, the potential at node N1 is also increased, and hence channel is kept formed in PMOS transistor 1017.

At time t3, when the potential at node N1 is transmitted to node N3 and the potential at node N1 lowers to be lower than Vcc (power supply potential) +Vth (threshold voltage of PMOS transistor 1017), the potential between source/drain of PMOS transistor 1017, that is, potential Vgs becomes larger than −Vth. Thus, the channel disappears, that is, holes 1037 collected below gate electrode 1023 to form the channel pierce through the P type semiconductor substrate 1019 as shown by the arrow a, possibly causing a leak current. The boosted potential generating circuit as the internal potential generating circuit in accordance with the fifteenth embodiment was made to solve such a problem.

Figure 27:
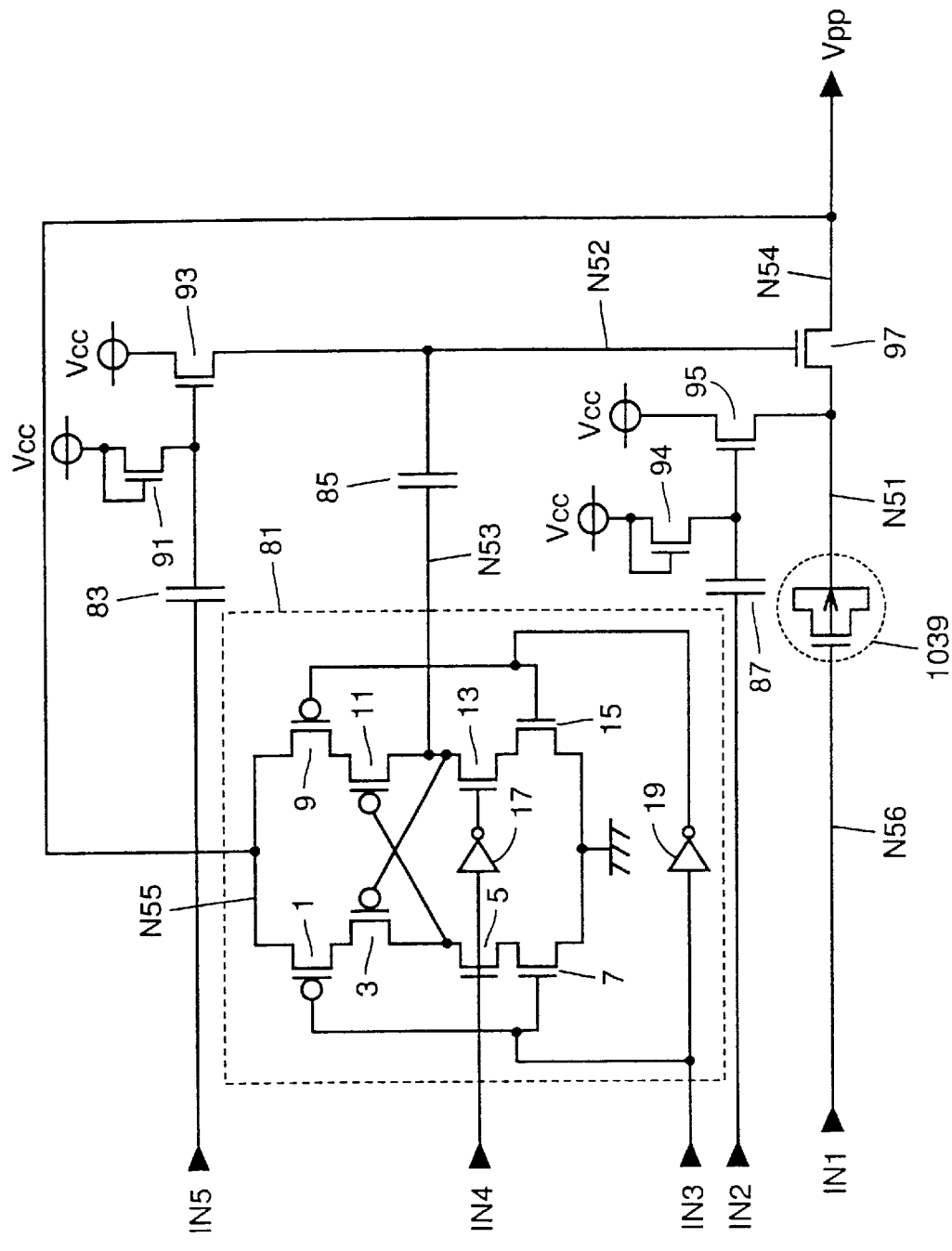
FIG. 27 is a circuit diagram showing a boosted potential generating circuit as an internal potential generating circuit in accordance with a fifteenth embodiment of the present invention.

FIG. 27 is a circuit diagram showing details of the boosted potential generating circuit as the internal potential generating circuit in accordance with the fifteenth embodiment of the present invention. Portions corresponding to those of FIG. 10 are denoted by the same reference characters and description thereof is not repeated. The boosted potential generating circuit shown in FIG. 10 differs from the boosted potential generating circuit shown in FIG. 27 in the capacitor to which signal IN1 is input. More specifically, capacitor 89 in the boosted potential generating circuit shown in FIG. 10 differs from capacitor 1039 of the boosted potential generating circuit shown in FIG. 27.

Referring to FIG. 27, in the boosted potential generating circuit in accordance with the fifteenth embodiment, a depletion type PMOS transistor is used as capacitor 1039. The depletion type PMOS transistor has its gate connected to node N56 and its source and drain connected to node N51.

Figure 28:
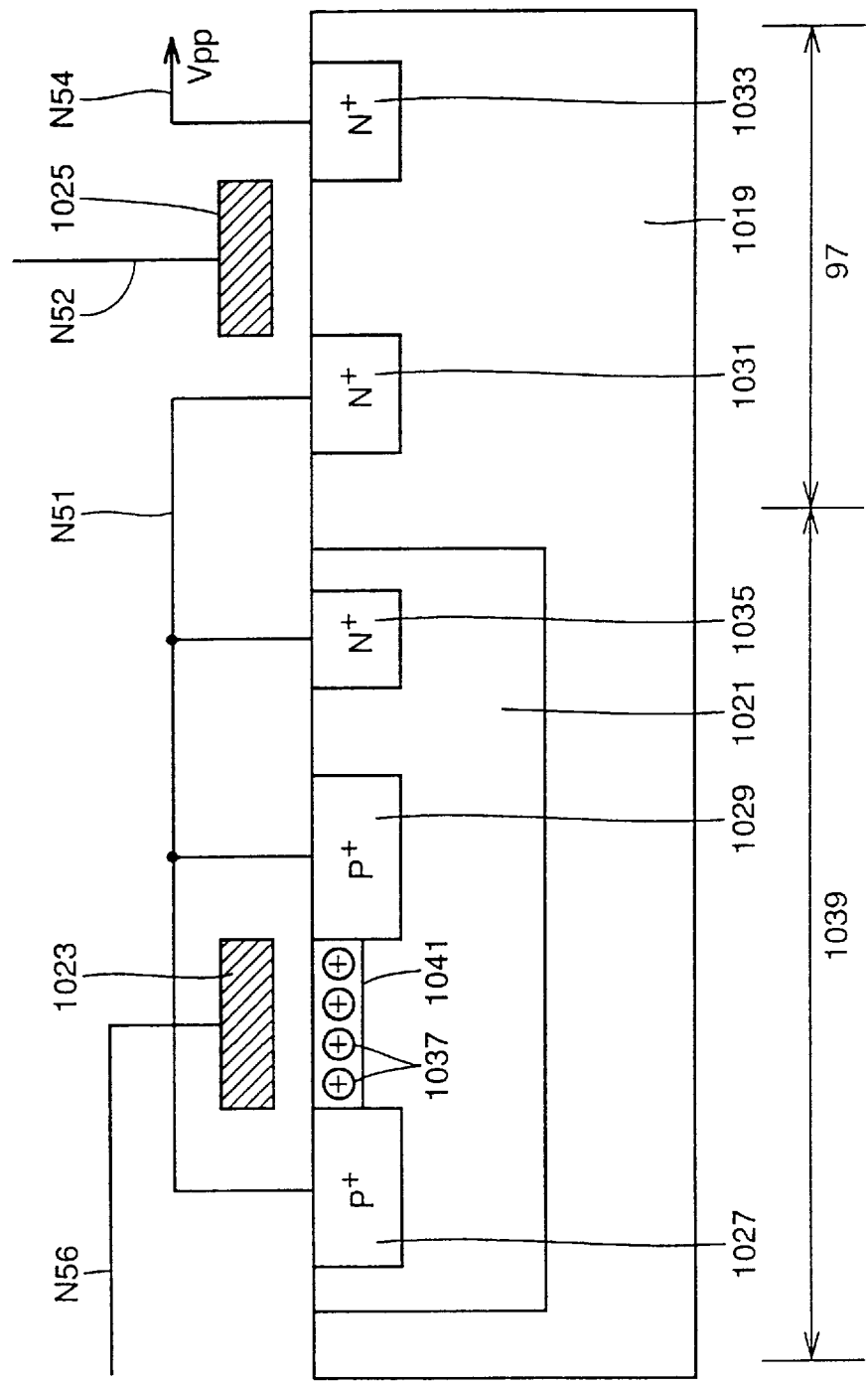
FIG. 28 shows structure of a capacitor 1039 and an NMOS transistor 97 shown in FIG. 27.

FIG. 28 shows structures of the depletion type PMOS transistor as capacitor 1039 and NMOS transistor 97 of the boosted potential generating circuit shown in FIG. 27. Portions corresponding to those of FIG. 27 are denoted by the same reference characters and description thereof is not repeated.

Referring to FIG. 28, the depletion type PMOS transistor 1039 is formed in the following manner. An N well 1021 is formed in P type semiconductor substrate 1019, P⁺ source/drain electrodes 1027 and 1029 as well as potential fixing layer 1035 are formed in N well 1021. An insulating film is formed on a region 1041 and gate electrode 1023 is formed thereon. In the boosted potential generating circuit in accordance with the present embodiment, holes 1037 are always collected at region 1041, forming a channel. This is because the capacitor 1039 is a depletion type PMOS transistor.

NMOS transistor 97 is formed in the following manner. In P type semiconductor substrate 1019, N⁺ source/drain electrodes 1031 and 1033 are formed. An insulating film is formed on a region where the channel is formed, and gate electrode 1025 is formed thereon.

Figure 29:
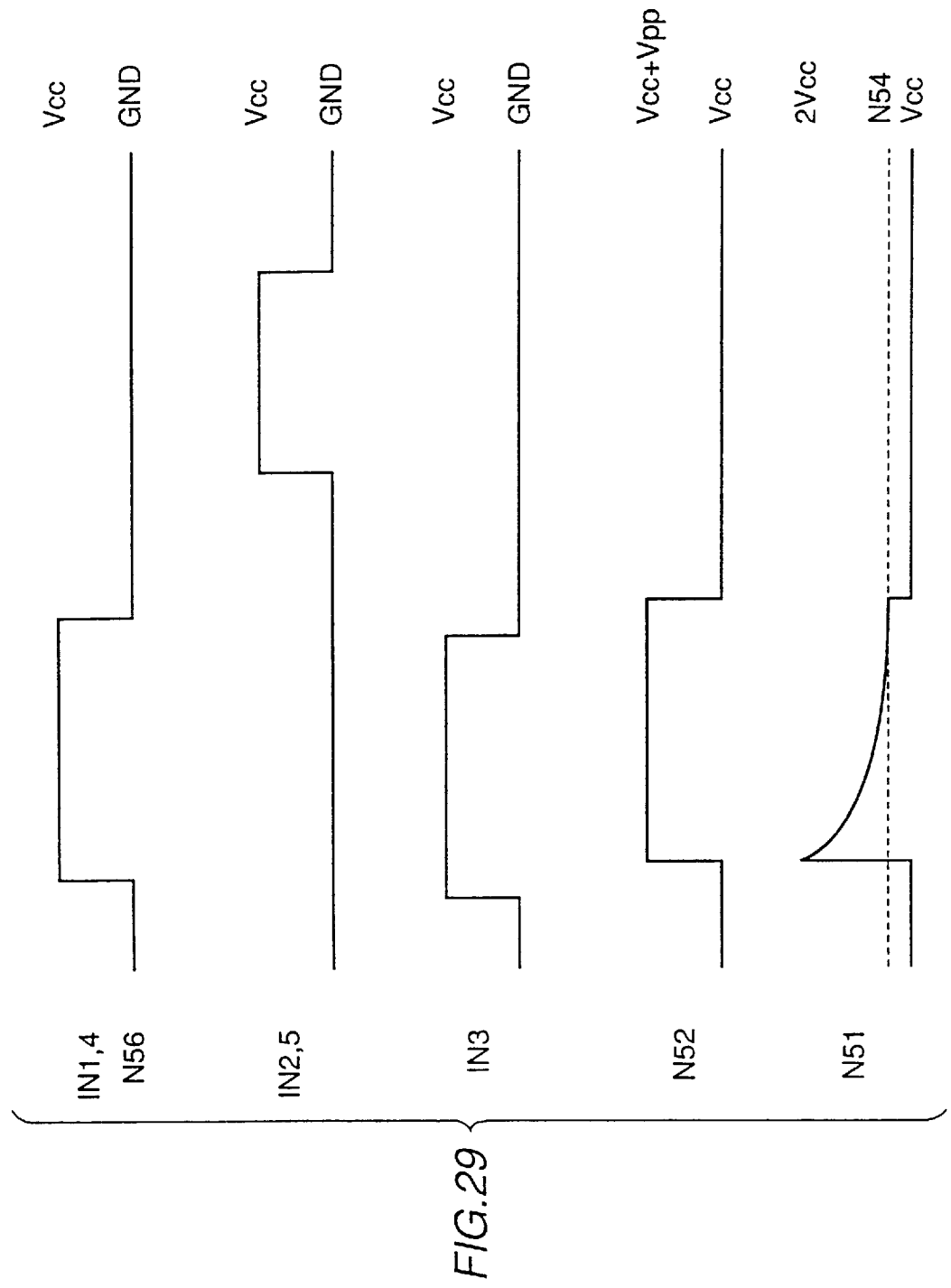
FIG. 29 is a timing chart illustrating the operation of the boosted potential generating circuit shown in FIG. 27.

FIG. 29 is a timing chart showing the operation of the boosted potential generating circuit shown in FIG. 27.

Referring to FIG. 29, at any time, the potential difference between nodes N56 and N51, that is, the potential between gate•source of the depletion type PMOS transistor 1039 is always negative. Therefore, a channel is always formed in PMOS transistor 1039. Accordingly, unlike the boosted potential generating circuit shown in FIG. 24 in which an enhancement type PMOS transistor is used as capacitor 1017, leak current is not generated. This utilizes such property of the depletion type PMOS transistor that a channel is always formed as long as the gate•source potential Vgs is negative.

As described above, in the boosted potential generating circuit in accordance with the fifteenth embodiment, a PMOS transistor of a depletion type is used as capacitor 1039. Therefore, while the boosted potential generating circuit is in operation, there is always a channel formed in the PMOS transistor 1039 (as PMOS transistor 1039 functions as a capacitor), and hence leak current caused by disappearance of the channel can be prevented.

The boosted potential generating circuit in accordance with the fifteenth embodiment differs from the boosted potential generating circuit in accordance with the fifth embodiment shown in FIG. 10 only in the capacitor to which the signal IN1 is input. Therefore, the boosted potential generating circuit in accordance with the fifteenth embodiment provides similar effects as the fifth embodiment.

The level converting circuit shown in FIG. 22 may be used as a level converting circuit 81 shown in FIG. 27.

[Sixteenth Embodiment]

Figure 30:
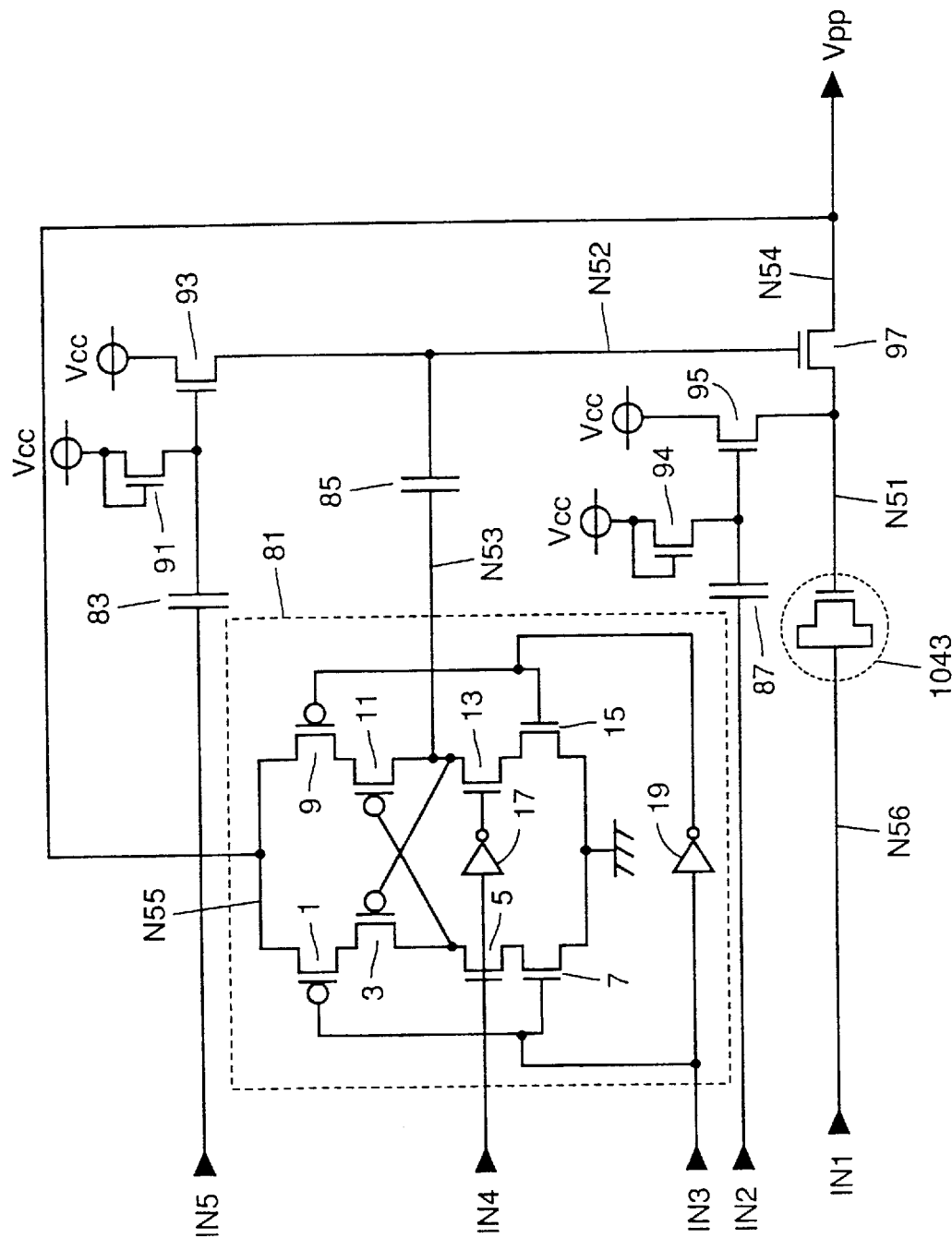
FIG. 30 is a circuit diagram showing a boosted potential generating circuit as an internal potential generating circuit in accordance with a sixteenth embodiment of the present invention.

FIG. 30 is a circuit diagram showing details of the boosted potential generating circuit as the internal potential generating circuit in accordance with the sixteenth embodiment. Portions corresponding to those of FIG. 27 are denoted by the same reference characters and description thereof is not repeated. The boosted potential generating circuit shown in FIG. 27 and the boosted potential generating circuit shown in FIG. 30 are different in the capacitor to which signal IN1 is input. More specifically, in the boosted potential generating circuit of FIG. 27, a depletion type PMOS transistor is used as capacitor 1039, while in the boosted potential generating circuit shown in FIG. 30, a depletion type NMOS transistor is used as capacitor 1043. The boosted potential generating circuit shown in FIG. 27 and the boosted potential generating circuit shown in FIG. 30 differ only in this point. Therefore, for description of the circuit shown in FIG. 30, the timing chart of FIG. 29 is used.

Referring to FIG. 30, the NMOS transistor 1043 of the depletion type has its gate connected to node N51, and its source and drain connected to node N56.

Figure 31:
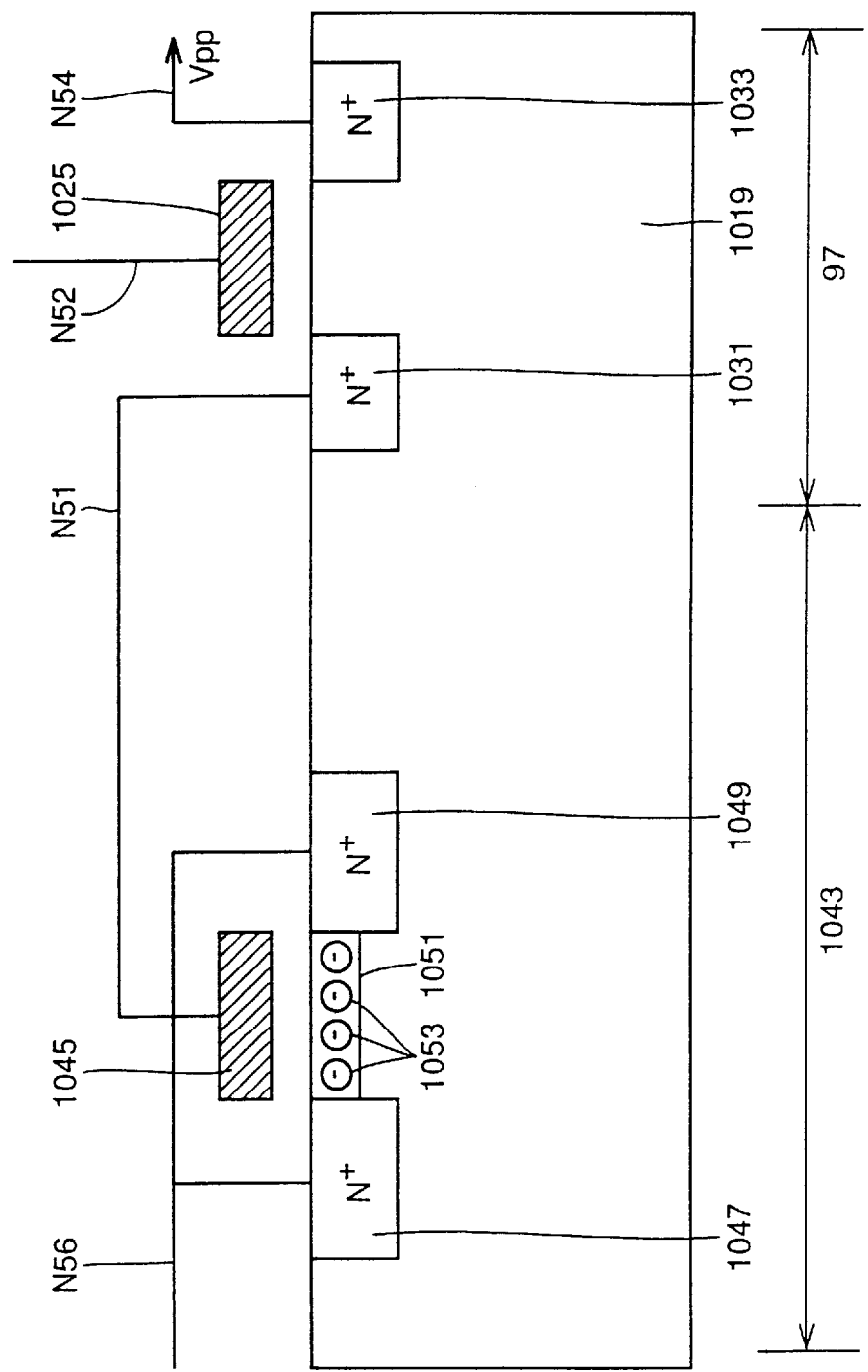
FIG. 31 shows structures of a capacitor 1043 and an NMOS transistor 97 shown in FIG. 30.

FIG. 31 shows structures of a depletion type NMOS transistor as capacitor 1043 and of NMOS transistor 97 of the boosted potential generating circuit shown in FIG. 30. Portions corresponding to those of FIG. 30 are denoted by the same reference characters and description thereof is not repeated.

Referring to FIG. 31, the NMOS transistor of the depletion type as capacitor 1043 is formed in the following manner. N⁺ source/drain electrodes 1047, 1049 are formed in P type semiconductor substrate 1019. On a region 1051, an insulating film is formed, and a gate electrode 1045 is formed thereon. In the NMOS transistor 1043 of the depletion type, electrons 1053 are always collected at region 1051 so long as the potential applied to gate electrode 1045 is positive, thus providing a channel. NMOS transistor 1043 of the depletion type is characterized in that $N^+$ source/drain electrodes 1047 and 1049 are formed directly in P type semiconductor substrate 1019, without forming any well.

Referring to FIGS. 30, 31 and 29, while the boosted potential generating circuit is in operation, the potential difference between nodes N51 and N56, that is, gate•source potential Vgs of NMOS transistor 1043 is always positive. Therefore, a channel is always formed in NMOS transistor 1043. Thus, leak current caused by disappearance of the channel never flows.

As described above, in the boosted potential generating circuit in accordance with the sixteenth embodiment, since an NMOS transistor of the depletion type is used as capacitor 1043, there is always a channel formed in NMOS transistor 1043 while the boosted potential generating circuit is in operation (that is, NMOS transistor 1043 always function as a capacitor). Therefore, a leak current caused by disappearance of the channel can be prevented.

Further, a NMOS transistor of the depletion type used as capacitor 1043 in the boosted potential generating circuit in accordance with the sixteenth embodiment is formed by providing $N^+$ source/drain electrodes 1047 and 1049 directly in P type semiconductor substrate 1019 without forming any well. Therefore, as compared with an NMOS transistor of which $N^+$ source/drain electrodes are formed in a well, it has lower threshold voltage, facilitating formation of a channel, and hence it has superior performance as a capacitor.

The level converting circuit shown in FIG. 22 may be used as level converting circuit 81 shown in FIG. 30.

[Seventeenth Embodiment]

Figure 32:
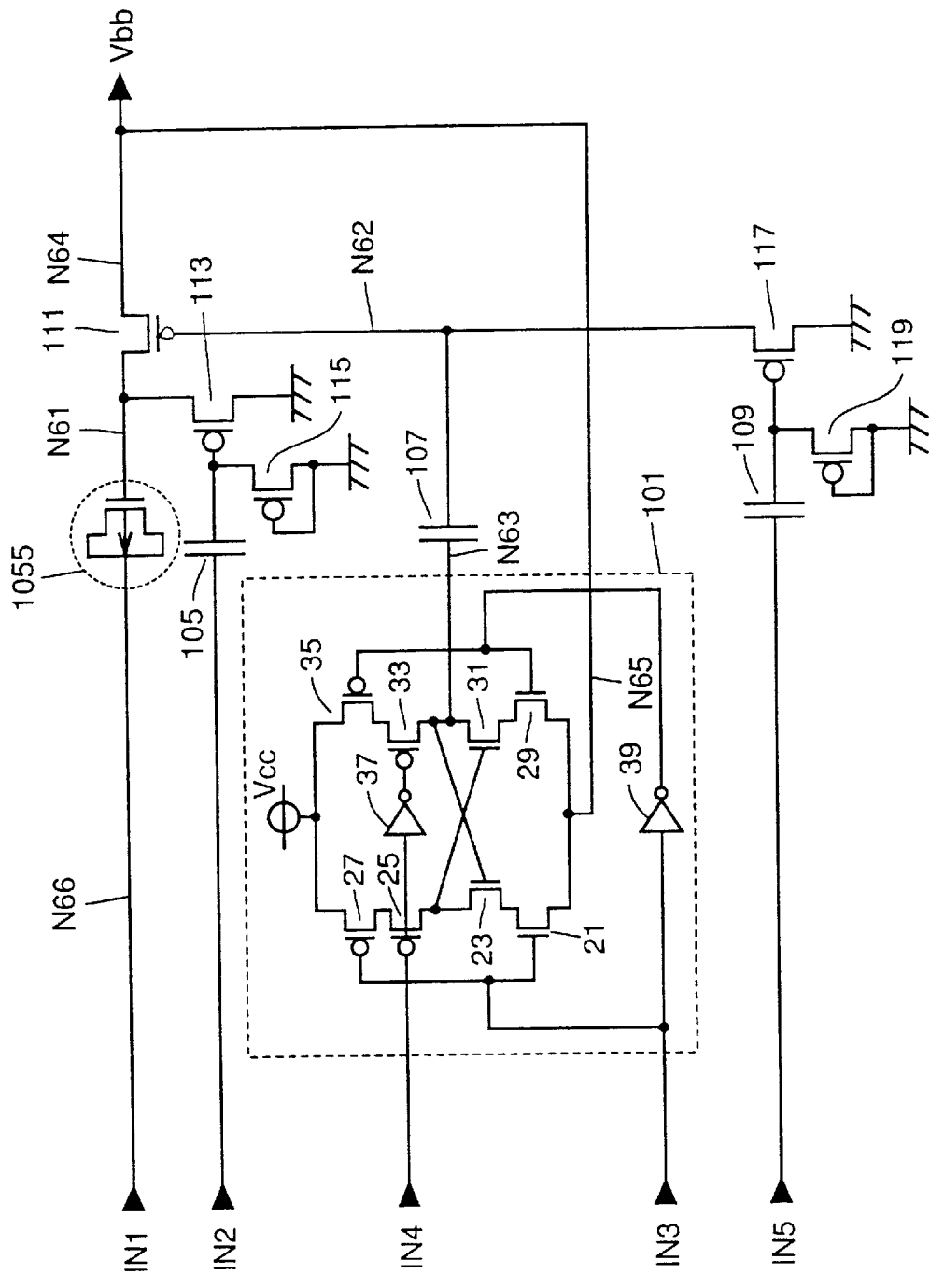
FIG. 32 is a circuit diagram showing a lowered potential generating circuit as an internal potential generating circuit in accordance with a seventeenth embodiment of the present invention.

FIG. 32 is a circuit diagram showing details of a lowered potential generating circuit as the internal potential generating circuit in accordance with the seventeenth embodiment of the present invention. Portions corresponding to those of FIG. 12 are denoted by the same reference characters and description thereof is not repeated. The lowered potential generating circuit shown in FIG. 32 differs from the lowered potential generating circuit shown in FIG. 12 in the capacitor to which signal IN1 is input. More specifically, a PMOS transistor of the depletion type is used as a capacitor 1055 of the lowered potential generating circuit shown in FIG. 32. PMOS transistor 1055 of the depletion type is similar to PMOS transistor 1039 of the depletion type shown in FIG. 27, in which a channel is always formed so long as the gate•source potential Vgs is negative.

Referring to FIG. 32, the PMOS transistor of the depletion type as capacitor 1055 has its gate connected to node N61 on the side of the output of the boosted potential generating circuit and its source/drain connected to node N66 which is on the input side of signal IN1. The structure of the PMOS transistor of the depletion type as capacitor 1055 is similar to that of the PMOS transistor as capacitor 1039 shown in FIGS. 27 and 28.

Figure 33:
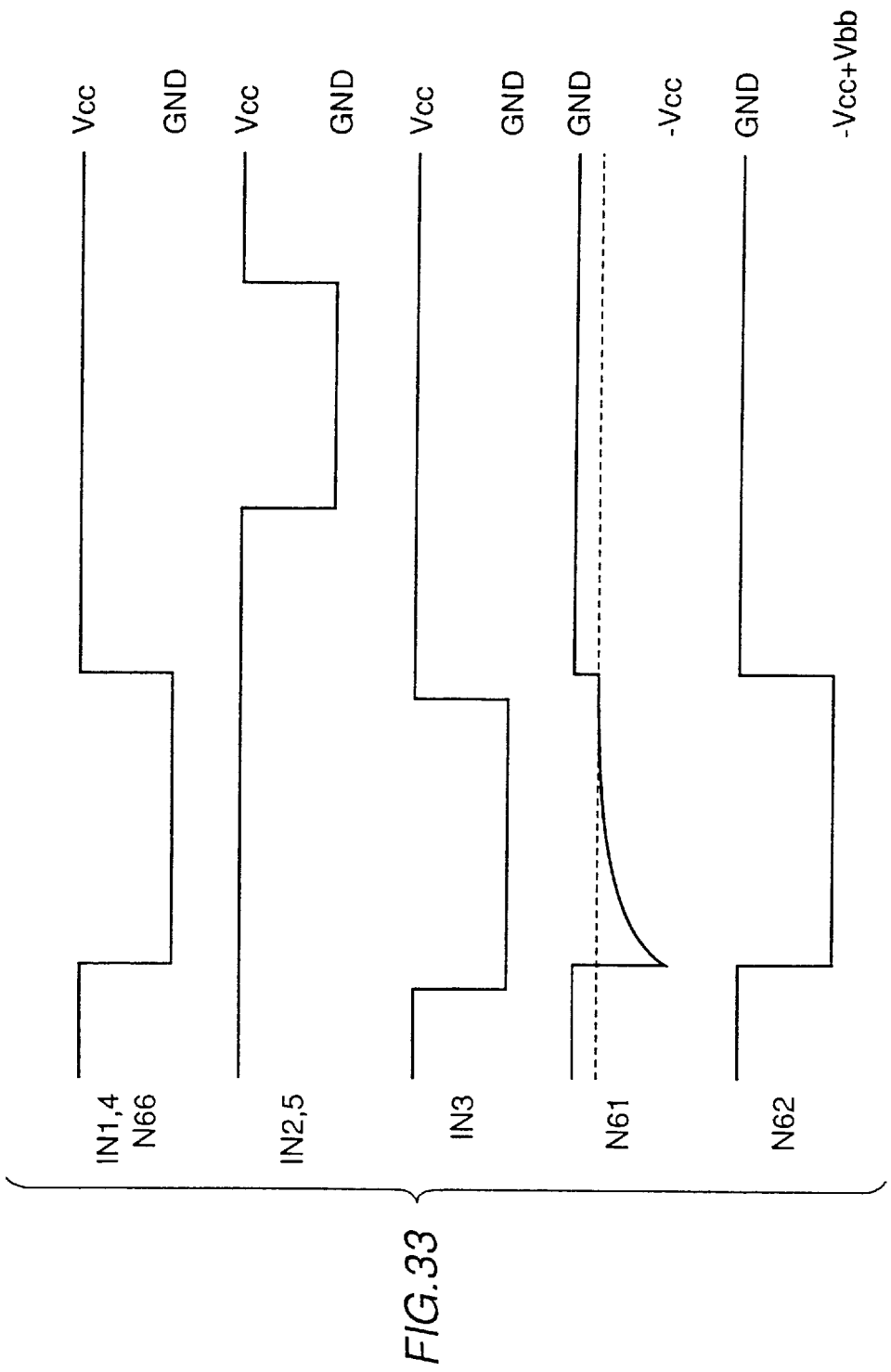
FIG. 33 is a timing chart illustrating the operation of the lowered potential generating circuit shown in FIG. 32.

FIG. 33 is a timing chart showing the operation of the lowered potential generating circuit shown in FIG. 32.

Referring to FIG. 33, when the lowered potential generating circuit shown in FIG. 32 is in operation, the potential difference between nodes N61 and N66, that is, gate•source potential Vgs of the PMOS transistor 1055 of the depletion type is always negative. Therefore, a channel is always formed in PMOS transistor 1055. Therefore, leak current caused by disappearance of channel never flows.

As described above, in the lowered potential generating circuit in accordance with the seventeenth embodiment of the present invention, since a PMOS transistor of the depletion type is used as capacitor 1055, there is always a channel formed in the PMOS transistor 1055 while the lowered potential generating circuit is in operation (PMOS transistor 1055 functions as a capacitor). Therefore, generation of a leak current can be prevented.

Further, the lowered potential generating circuit in accordance with the seventeenth embodiment differs from the lowered potential generating circuit of FIG. 12 only in the capacitor to which signal IN1 is input. Therefore, the lowered potential generating circuit in accordance with the seventeenth embodiment provides similar effects as the lowered potential generating circuit in accordance with the sixth embodiment.

The level converting circuit shown in FIG. 23 may be used as level converting circuit 101 of FIG. 32.

[Eighteenth Embodiment]

Figure 34:
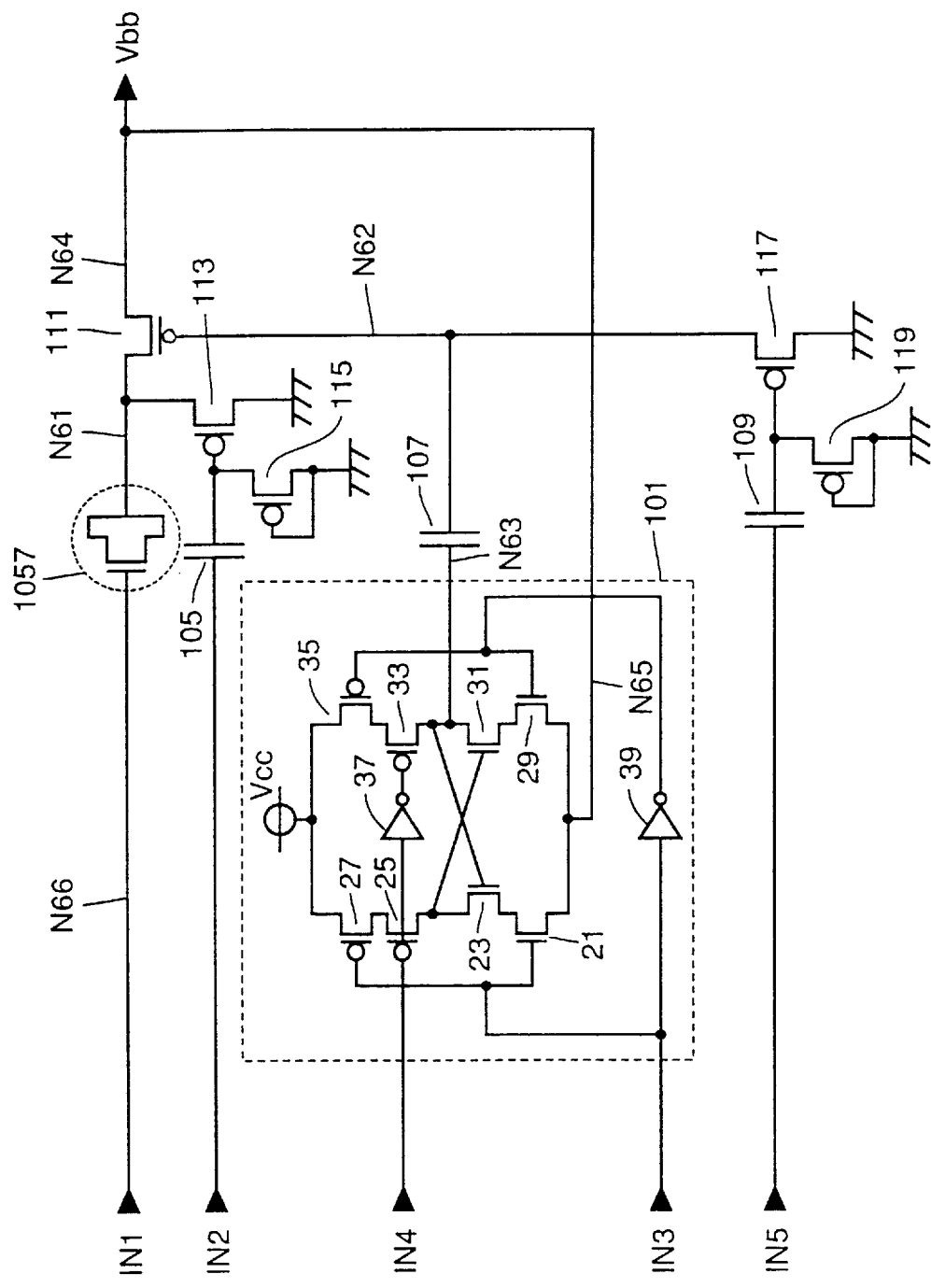
FIG. 34 is a circuit diagram showing a lowered potential generating circuit as an internal potential generating circuit in accordance with an eighteenth embodiment of the present invention.

FIG. 34 is a circuit diagram showing details of a lowered potential generating circuit as the internal potential generating circuit in accordance with the eighteenth embodiment of the present invention. Portions corresponding to those of FIG. 32 are denoted by the same reference characters and description thereof is not repeated. The lowered potential generating circuit of FIG. 34 differs from the lowered potential generating circuit of FIG. 32 in the capacitor to which signal IN1 is input. More specifically, while a PMOS transistor of the depletion type is used as capacitor 1055 in FIG. 32, an NMOS transistor of the depletion type is used as capacitor 1057 in FIG. 34. Since this is the only difference, the lowered potential generating circuit of FIG. 34 will be described referring to the timing chart of FIG. 33.

Referring to FIG. 34, the NMOS transistor of the depletion type used as capacitor 1057 of the lowered potential generating circuit in accordance with the eighteenth embodiment of the present invention has its gate connected to node N66 which is the input side of signal IN1, and its source and drain connected to node N61 which is the output side of the lowered potential generating circuit. In the NMOS transistor of the depletion type as capacitor 1057, as in the NMOS transistor of the depletion type as capacitor 1043 shown in FIG. 30, there is always a channel formed, so long as the gate•source potential Vgs is positive. The structure of the NMOS transistor of the depletion type as capacitor 1057 is similar to that of the NMOS transistor of the depletion type as capacitor 1043 shown in FIG. 31.

Referring to FIG. 33, while the lowered potential generating circuit shown in FIG. 34 is in operation, the potential difference between nodes N66 and N61, that is, the gate•source potential Vgs of NMOS transistor 1057 is always positive. Therefore, there is always a channel formed in NMOS transistor 1057. Therefore, leak current caused by disappearance of the channel never flows.

As described above, in the lowered potential generating circuit in accordance with the eighteenth embodiment of the present invention, an NMOS transistor of the depletion type is used as capacitor 1057 to which signal IN1 is input. Therefore, while the lowered potential generating circuit is in operation, there is always a channel formed in NMOS transistor 1057 (NMOS transistor 1057 functions as a capacitor). Therefore, generation of a leak current can be prevented.

Further, similar to the NMOS transistor as capacitor 1043 shown in FIG. 30, the NMOS transistor as capacitor 1057 of the lowered potential generating circuit in accordance with the eighteenth embodiment of the present invention has its N+ source/drain electrodes 1047 and 1049 formed directly in P type semiconductor substrate 1019, without forming a well. Therefore, as compared with an NMOS transistor having N+ source/drain electrodes formed in a well, the threshold voltage can be lowered. Thus, channel is more easily formed in NMOS transistor 1057, providing superior performance as a capacitor. The level converting circuit shown in FIG. 23 may be used as level converting circuit 101.

[Nineteenth Embodiment]

First, a method of manufacturing an NMOS transistor having a general LDD (Lightly Doped Drain) structure will be described.

FIG. 35 shows a first step of the method of manufacturing a general NMOS transistor. In FIG. 35, (a) shows a silicon substrate 1065. In FIG. 35, (b) is a plan view of (a). Using such a silicon substrate 1065, an NMOS transistor is formed.

Figure 36A:
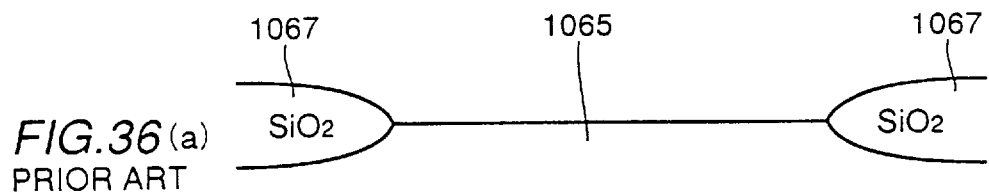
Figure 36B:
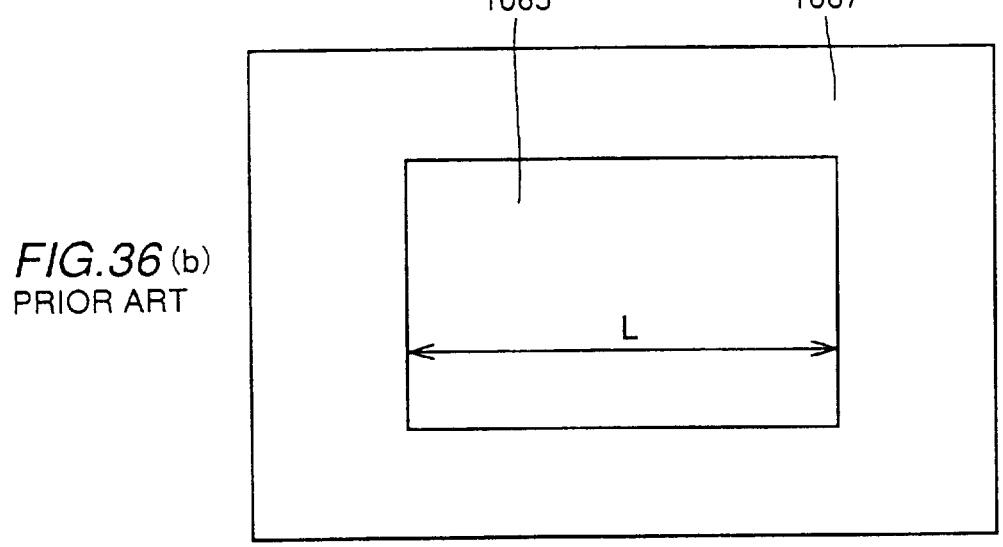

FIG. 36 shows a second step of manufacturing a general NMOS transistor.

Referring to (a) of FIG. 36, on silicon substrate 1065, a silicon oxide film ($SiO_2$) 1067 is formed. In FIG. 36, (b) is a plan view of (a).

FIG. 37 shows a third step of manufacturing a general NMOS transistor.

Referring to (a) of FIG. 37, a resist 1069 is formed on silicon oxide film 1067. In other words, a mask is provided by resist 1069. Then, boron 1071 is introduced, and a P well 1073 is formed in silicon substrate 1065. In FIG. 37, (b) is a plan view of (a).

Figure 38A:
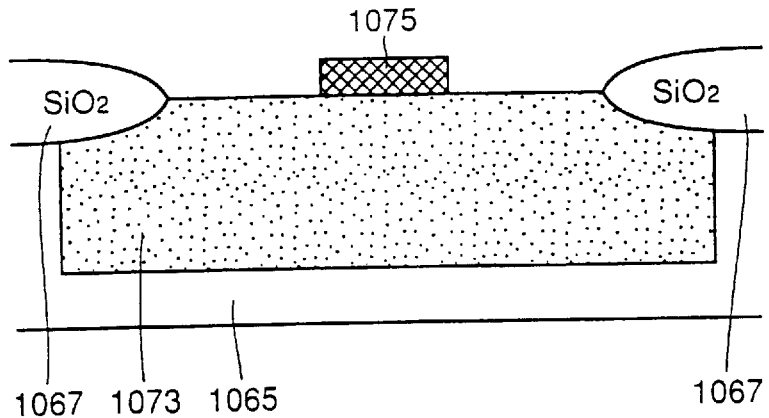
Figure 38B:
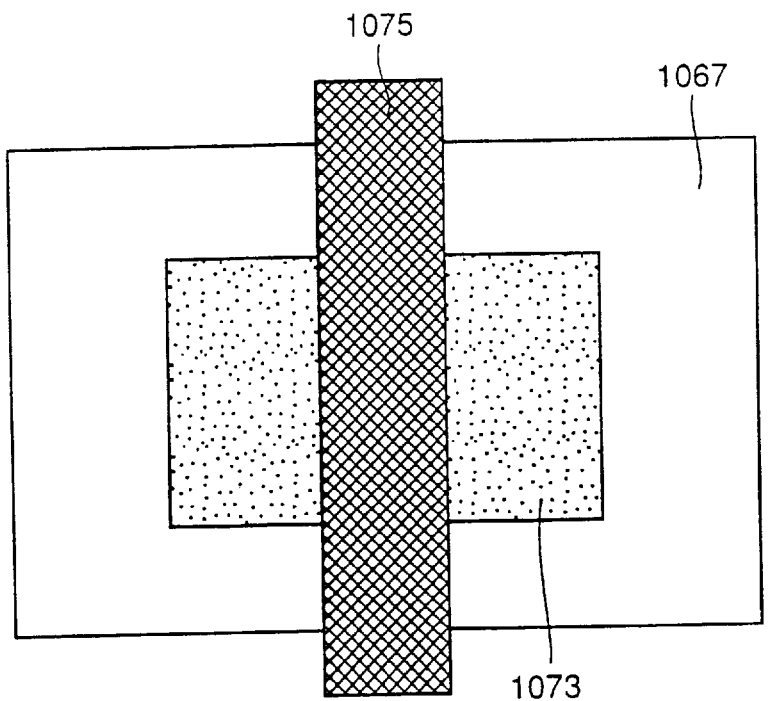

FIG. 38 shows a fourth step of manufacturing a general NMOS transistor.

Referring to (a) of FIG. 38, an insulating film, not shown, is formed on P well 1073, and a transfer gate 1075 is formed thereon. Transfer gate 1075 is formed, for example, of a two-layered structure including polycrystalline silicon and tungsten silicide (WSi). In this example, tungsten silicide is formed on polycrystalline silicon. In FIG. 38, (b) is a plan view of (a).

Figure 39A:
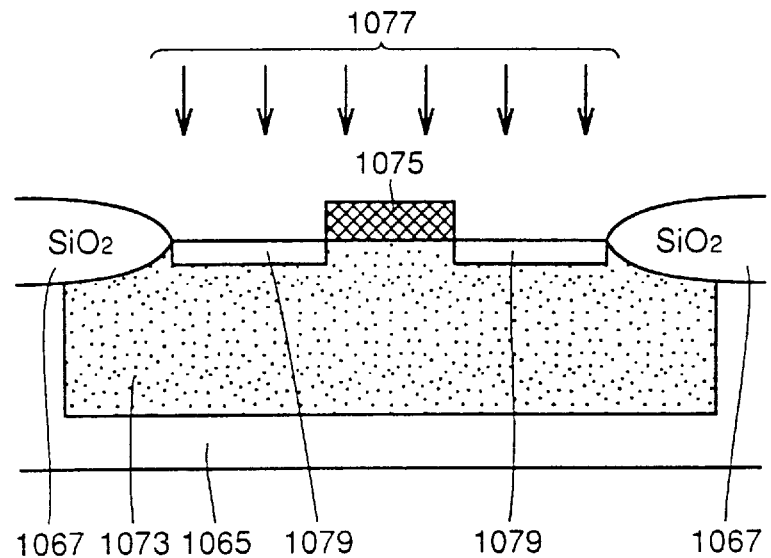
Figure 39B:
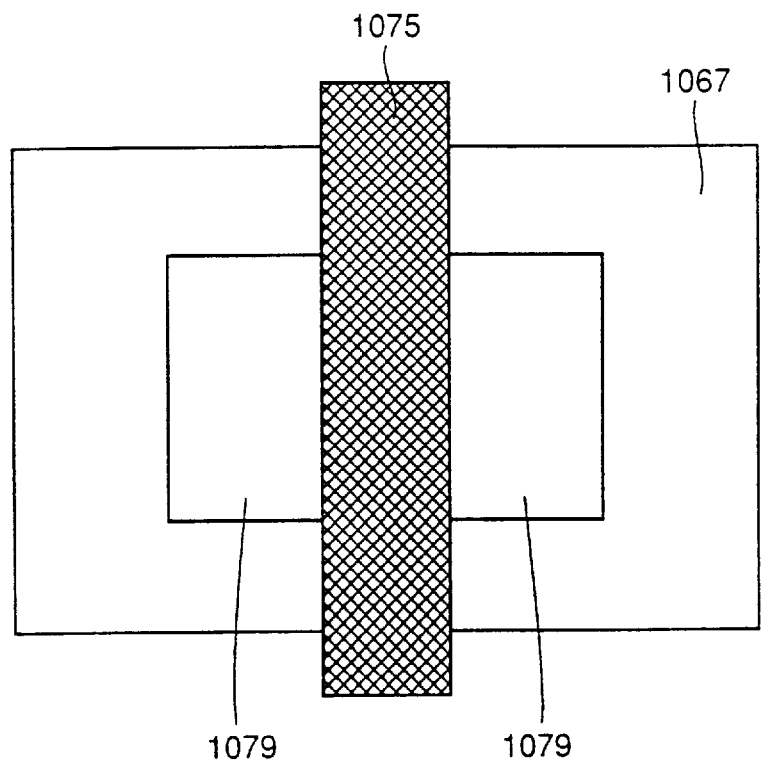

FIG. 39 shows a fifth step of manufacturing a general NMOS transistor.

Referring to (a) of FIG. 39, phosphorus ($n^-$) 1077 having low concentration is introduced to P well 1073, and thus a lightly doped $n^-$ region 1079 is formed. In FIG. 39, (b) is a plan view of (a).

Figure 40A:
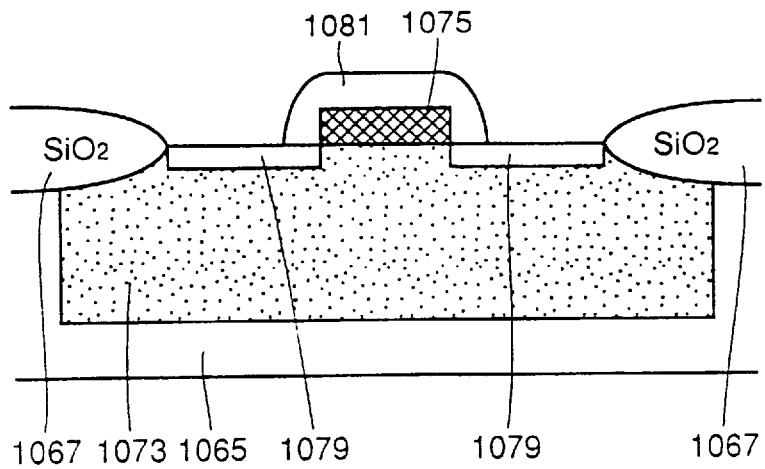
Figure 40B:
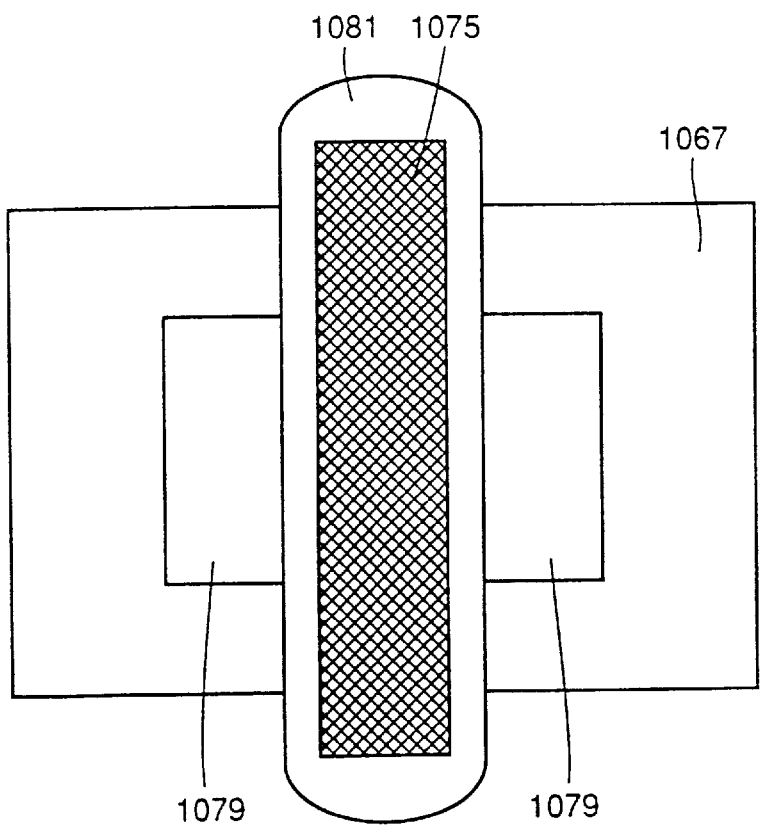

FIG. 40 shows a sixth step of manufacturing a general NMOS transistor.

Referring to (a) of FIG. 40, a high temperature oxide film 1081 is formed on a side wall of transfer gate 1075. In order to form high temperature oxide film 1081 on the side wall of transfer gate 1075, first, high temperature oxide film is formed on silicon oxide film 1067, $n^-$ region 1039 and transfer gate 1075, and then anisotropic etching is performed. By doing so, high temperature oxide film 1081 can be formed on the side wall of transfer gate 1075. As high temperature oxide film 1081, Tetra Ethyl Ortho Silicate (TEOS) may be used, for example.

Figure 41A:
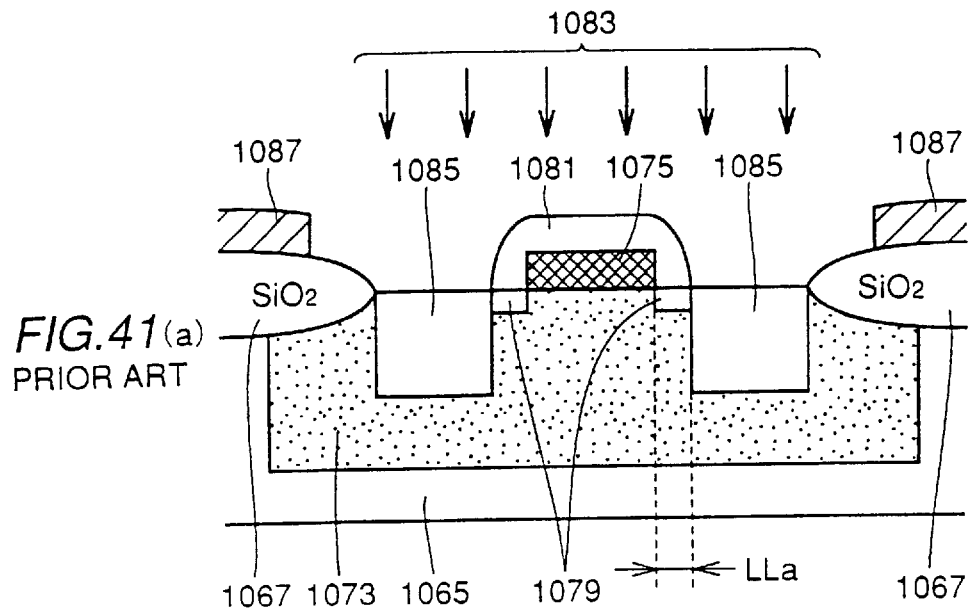
Figure 41B:
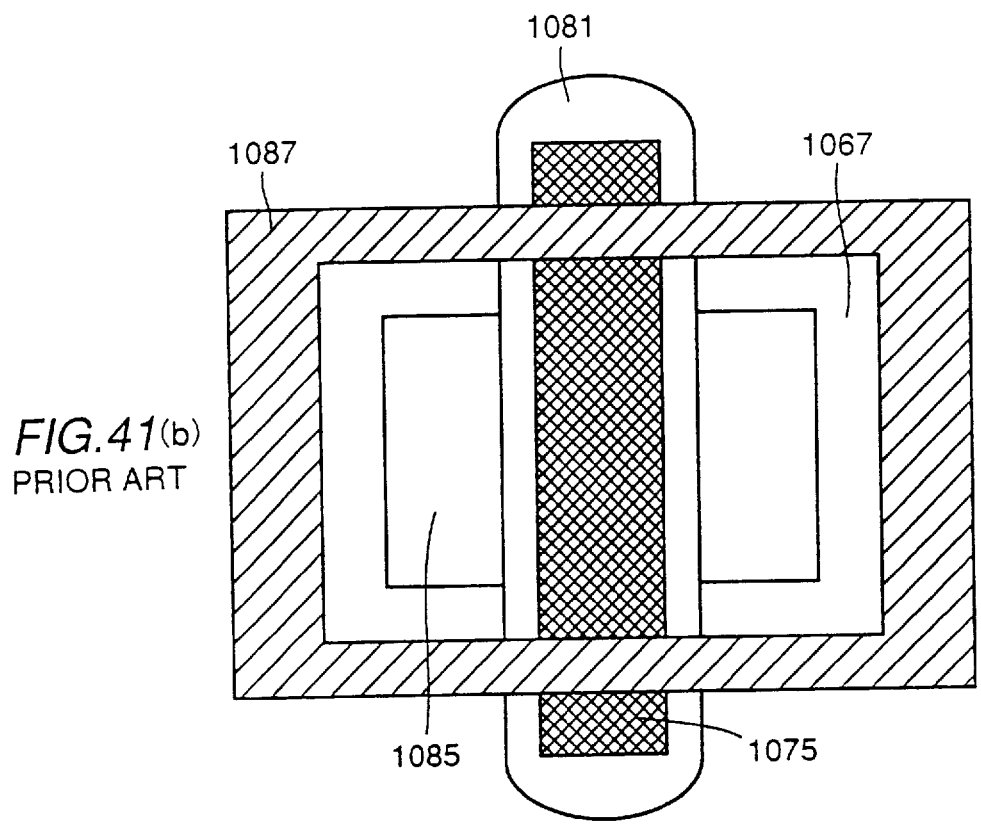

FIG. 41 shows a seventh step of manufacturing a general NMOS transistor.

Referring to (a) of FIG. 41, a resist 1087 is formed on silicon oxide film 1067. By introducing phosphorus ($n^+$) 1083 having high concentration, a highly doped $n^+$ region 1085 is formed. In FIG. 41, (b) is a plan view of (a).

Figure 42A:
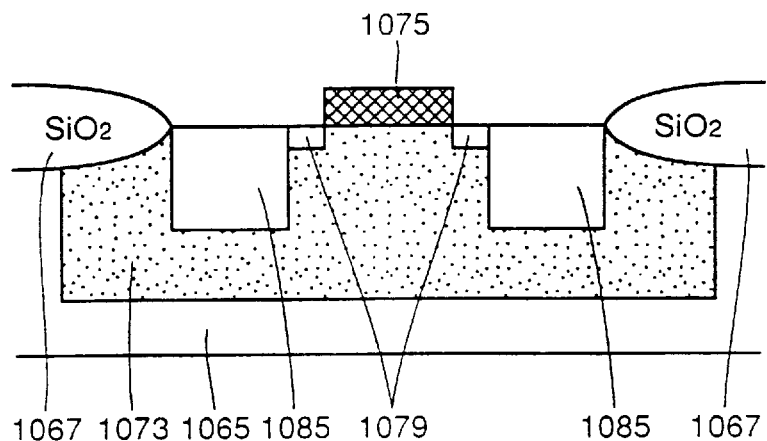
Figure 42B:
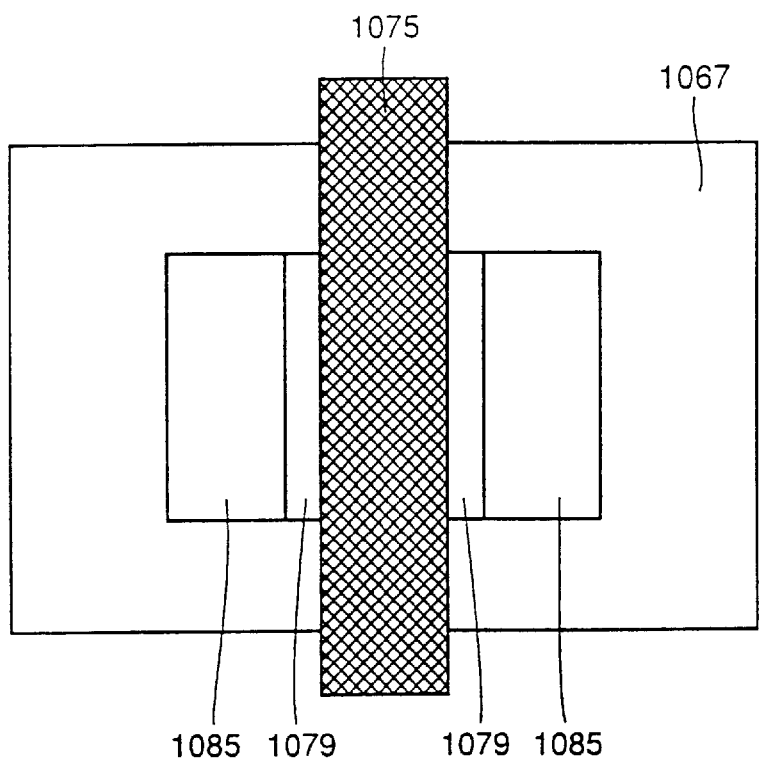

FIG. 42 shows an eighth step of manufacturing a general NMOS transistor.

Referring to (a) of FIG. 42, high temperature oxide film 1081 formed on the side wall of transfer gate 1075 is removed by etching. In FIG. 42, (b) is a plan view of (a).

Figure 43A:
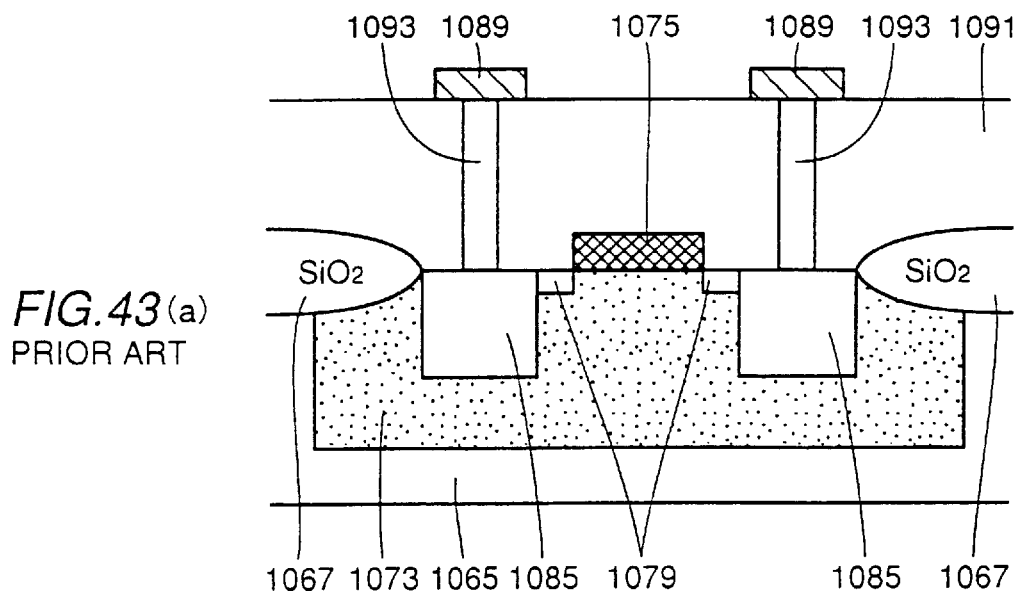
Figure 43B:
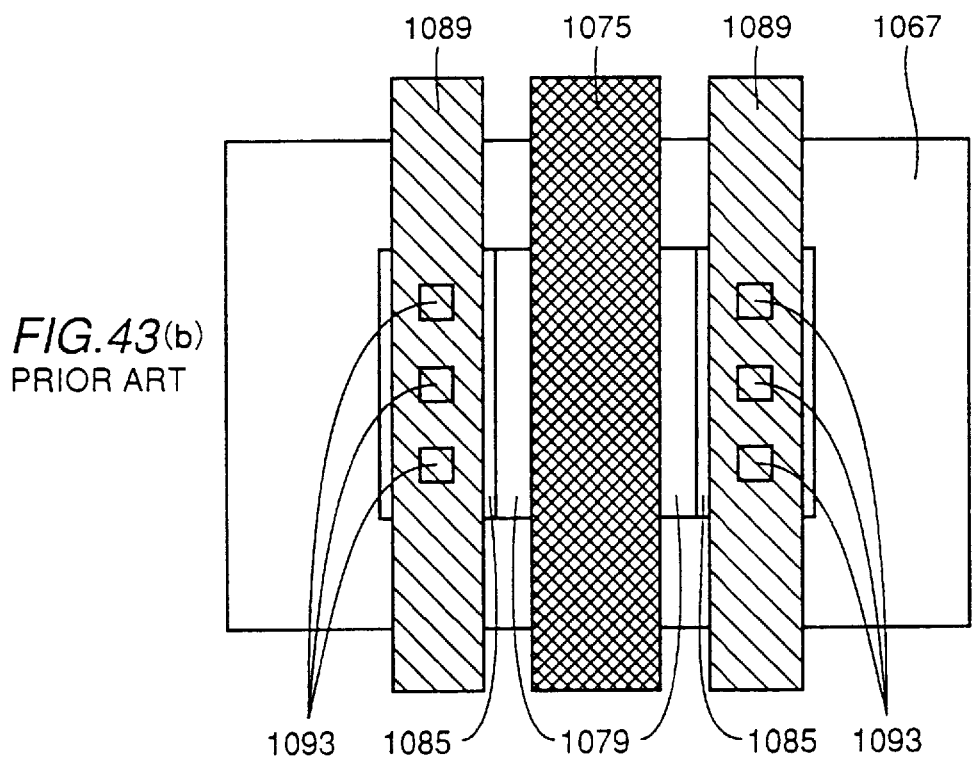
Figure 44:
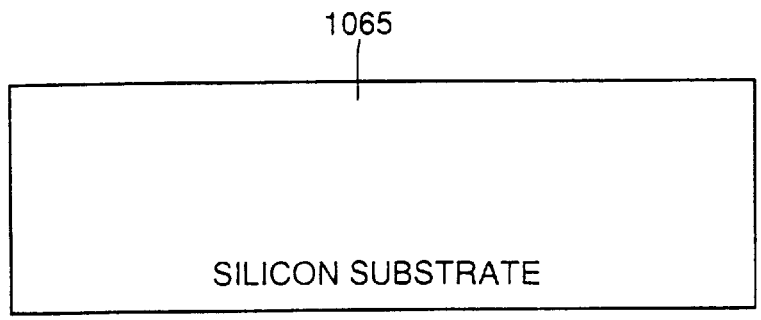
FIGS. 44(*a*)–51(*b*) are illustrations showing first to eighth steps of manufacturing an NMOS transistor used for a memory cell.
Figure 44:
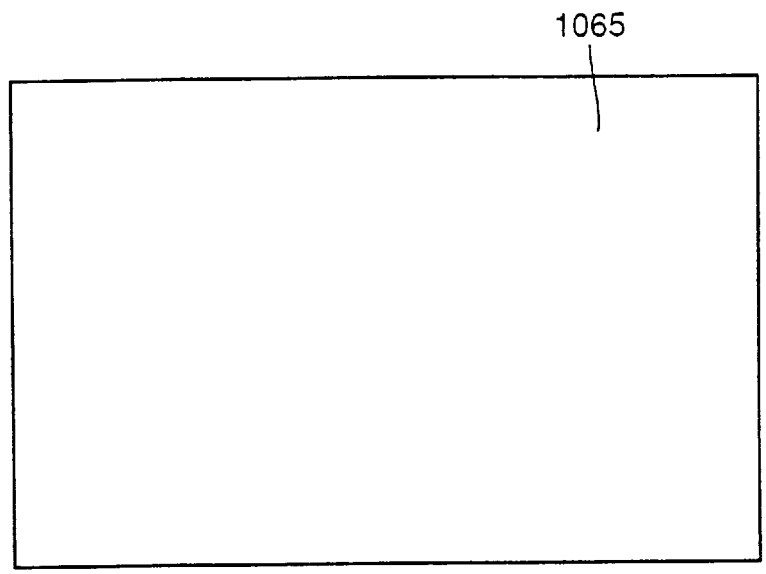
Figure 45A:
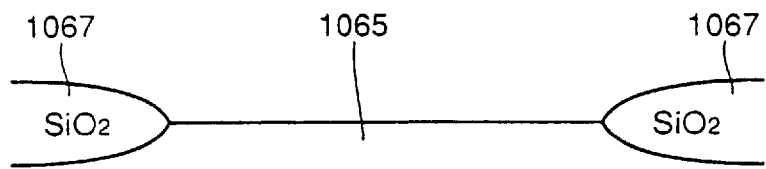
Figure 45B:
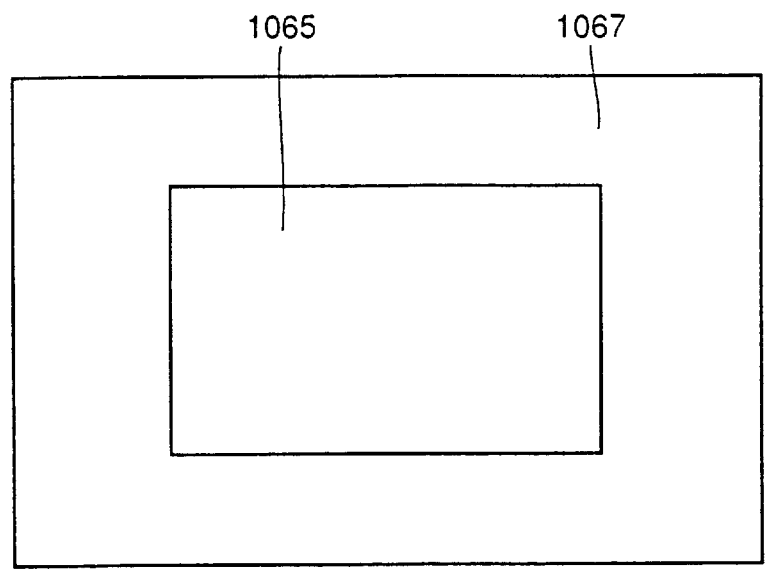
Figure 46A:
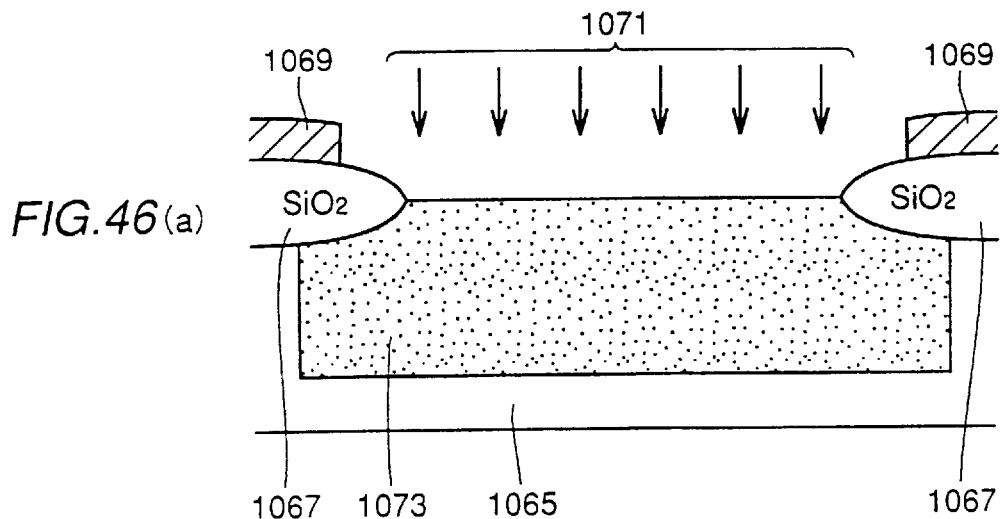
Figure 46B:
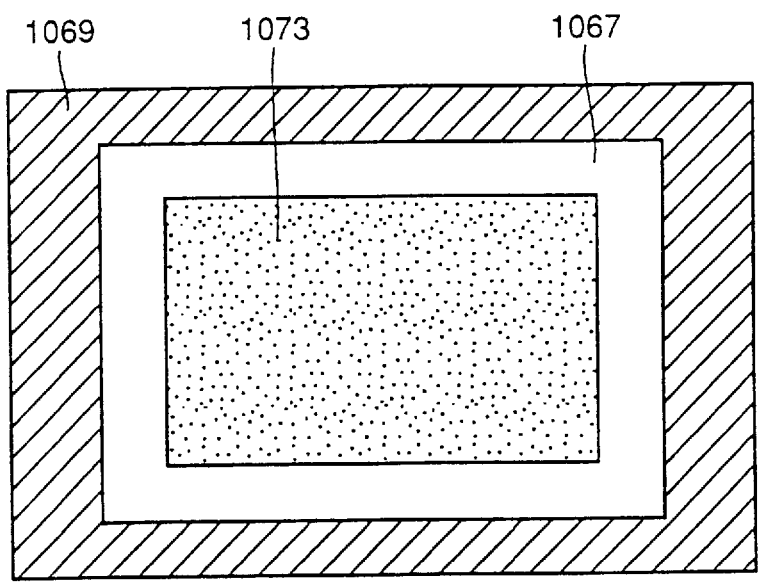
Figure 47:
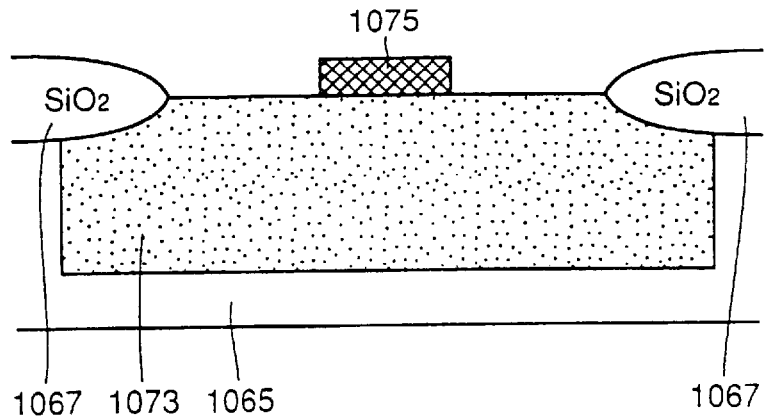
Figure 47:
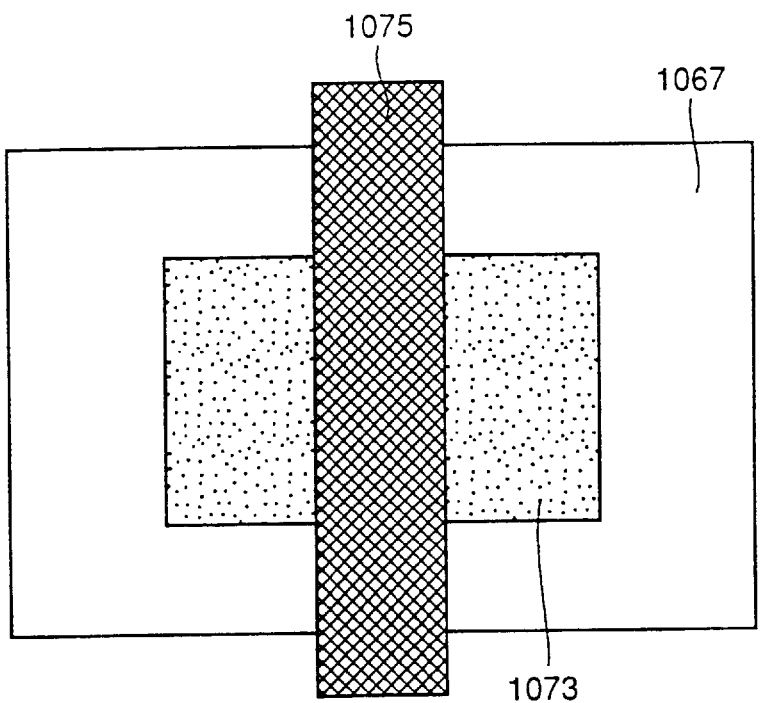
Figure 48A:
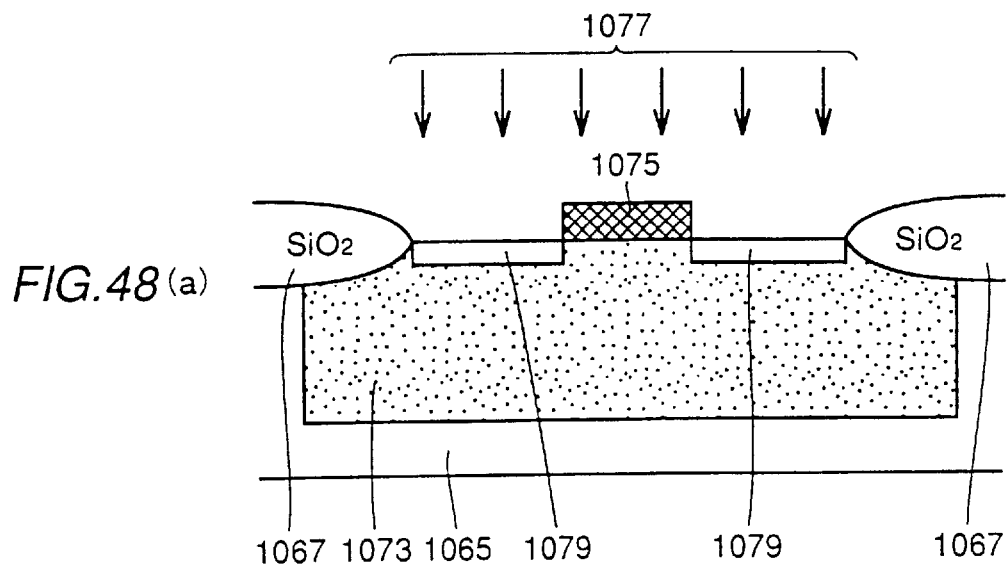
Figure 48B:
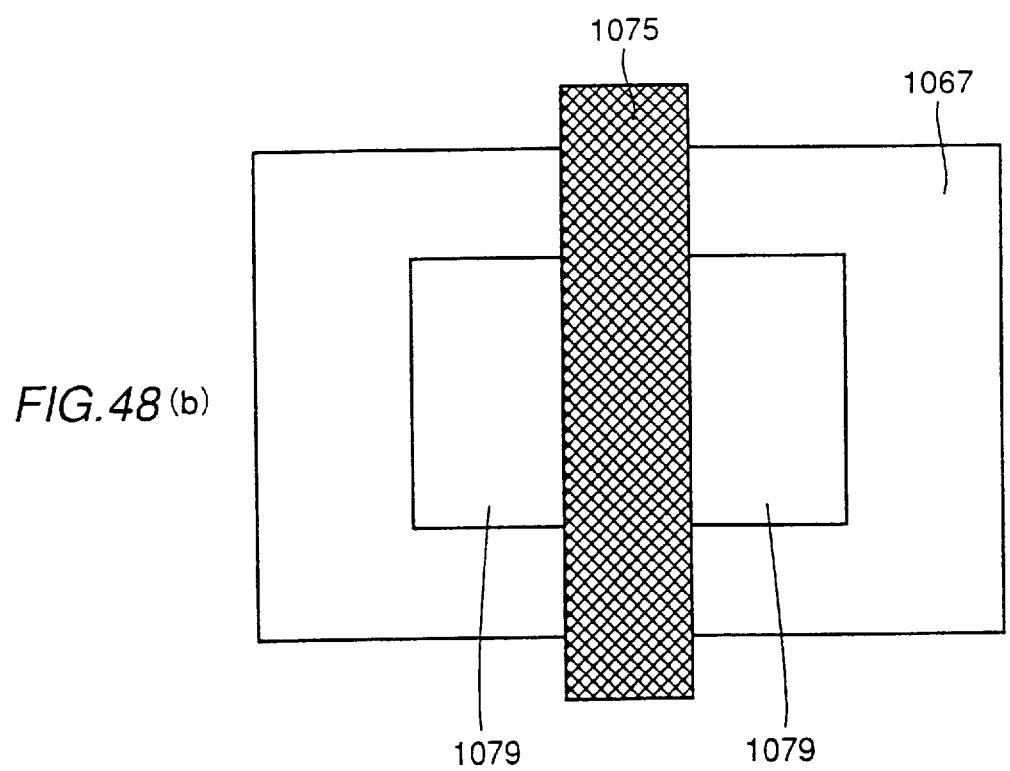
Figure 49A:
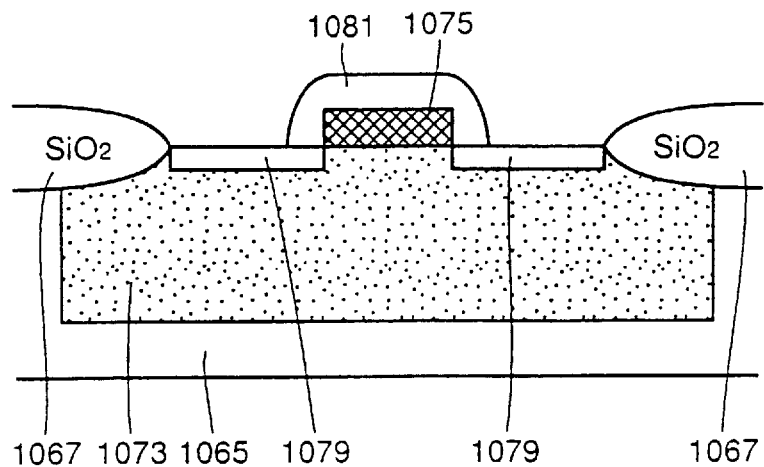
Figure 49B:
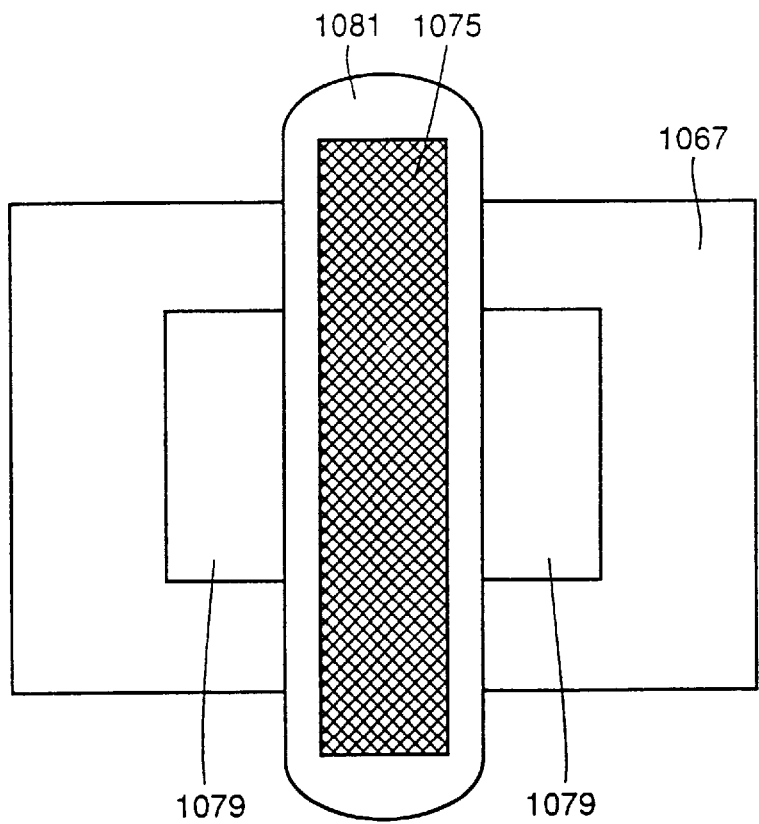

FIG. 43 shows a ninth step of manufacturing a general NMOS transistor.

Referring to (a) of FIG. 43, an insulating film 1091 is formed on silicon oxide film 1067, $n^+$ region 1085, $n^-$ region 1079 and transfer gate 1075. A contact hole 1093 is formed in insulating film 1091. An aluminum interconnection 1089 formed on insulating film 1091 is connected to $n^+$ region 1085 through conductive layer formed in contact hole 1093. In FIG. 43, (b) is a plan view of (a). The aforementioned TEOS may be used as insulating film 1091, for example.

In the general NMOS transistor formed in the above described manner, the distance LLa between an edge of transfer gate 1075 and highly doped $n^+$ region 1085 (that is, length of low concentration $n^-$ region 1079 along the gate length) is defined by the length in the direction of the gate length of high temperature oxide film 1081 formed on the side wall of transfer gate 1075 (FIG. 41). Therefore, the distance between the edge of transfer gate 1075 and the highly doped $n^+$ 1085 becomes shorter. This leads to punch through (that is, punch through voltage is low), and when a high voltage is applied between two $n^+$ regions 1085, the transistor may possibly be broken. The NMOS transistor in accordance with the nineteenth embodiment was made to solve the above described problem, in which the distance between the edge of the transfer gate and the highly doped $n^+$ region is made longer than in a conventional NMOS transistor.

In the following, a method of manufacturing an NMOS transistor used in a semiconductor memory device, for example, a memory cell of a DRAM, will be described.

FIGS. 43 to 51 show the first to eighth steps of manufacturing the NMOS transistor used for the memory cell. In these figures, portions corresponding to those of FIGS. 35 to 42 are denoted by the same reference characters and description thereof is not repeated. The first to sixth steps of manufacturing the transistor used for the memory cell are similar to the first to sixth steps of manufacturing a general NMOS transistor shown in FIGS. 35 to 40.

Figure 50:
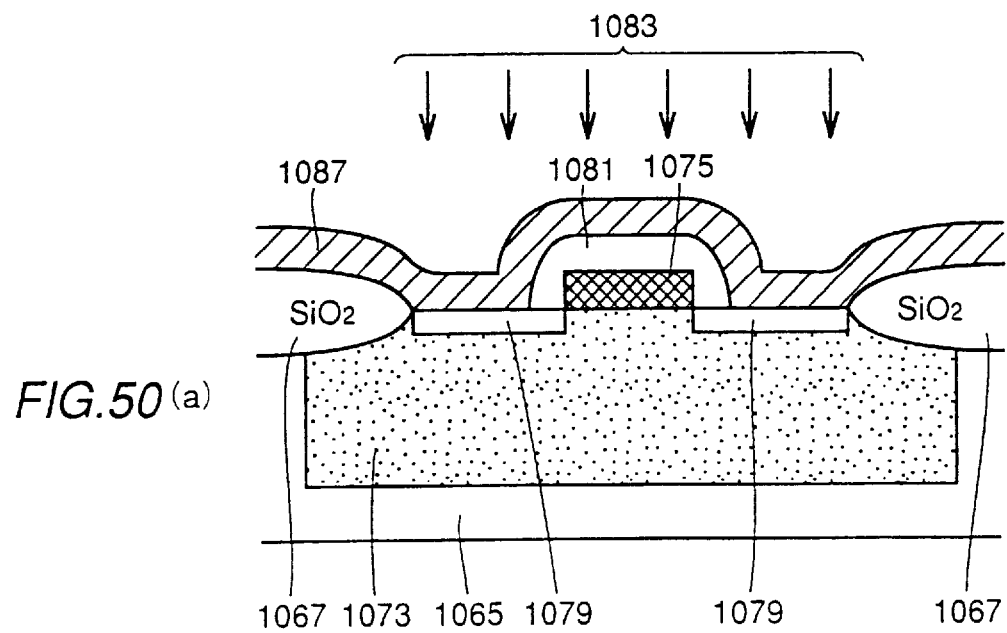
Figure 50:
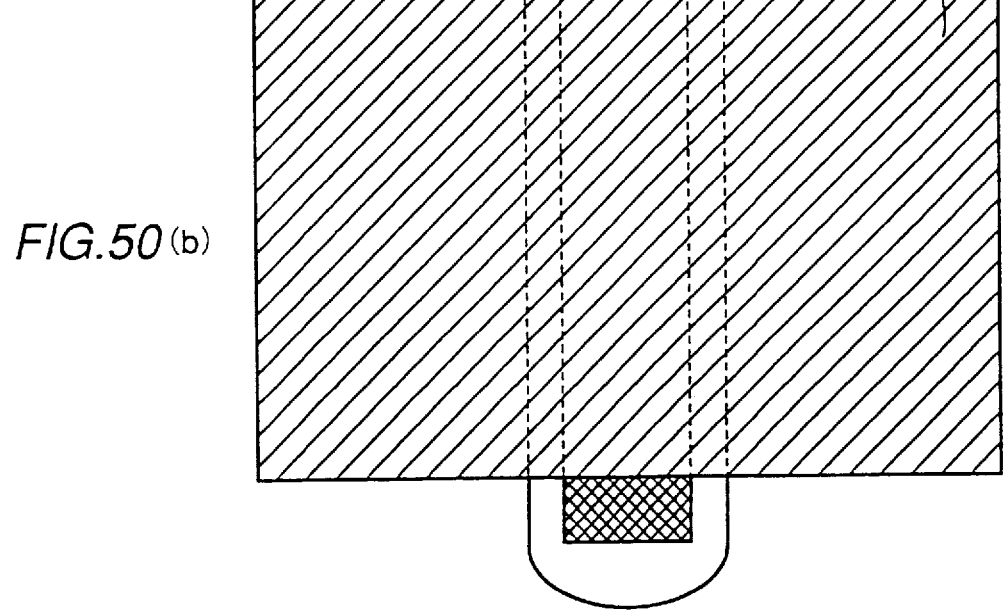

Referring to FIG. 50(a), resist 1087 is formed on silicon oxide film 1067, $n^-$ region 1079 and high temperature oxide film 1081. In other words, the structure is entirely masked by resist 1087 so as to prevent introduction of phosphorus ($n^+$) 1083. Implantation of phosphorus ($n^+$) 1083 is not necessary for the NMOS transistor used for the memory cell. However, there is the step of implantation of phosphorus ($n^+$) 1083, since this method utilizes the common manufacturing steps for the general NMOS transistor shown in FIGS. 35 to 43. In FIG. 50, (b) is a plan view of (a).

Figure 51A:
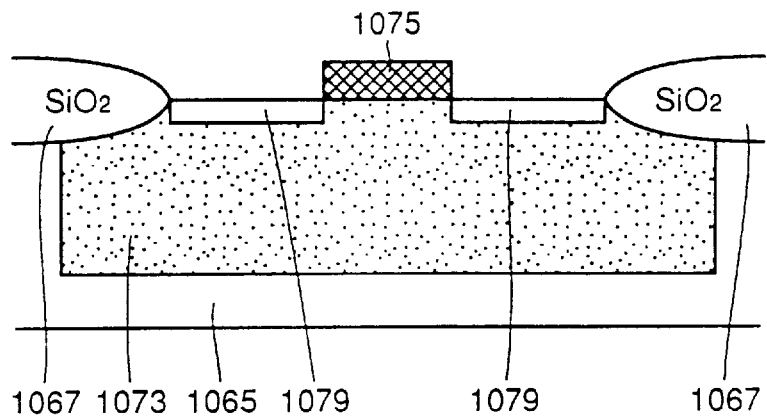
Figure 51B:
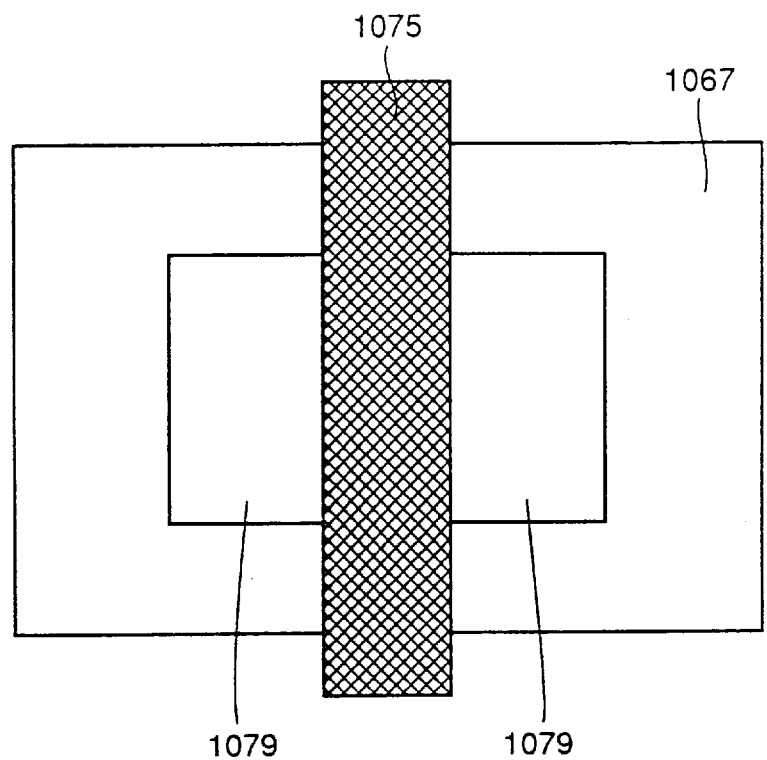

Referring to FIG. 51(a), resist 1087 and high temperature oxide film 1081 are removed.

In each of FIGS. 44 to 51, (b) is a plan view of (a).

As described above, in the NMOS transistor used for the memory cell, a highly doped $n^+$ region 1085 provided in a common NMOS transistor is not formed, and only a lightly doped $n^-$ region 1079 is formed.

The method of manufacturing a substrate transistor will be described. The substrate transistor is of N type.

Figure 52:
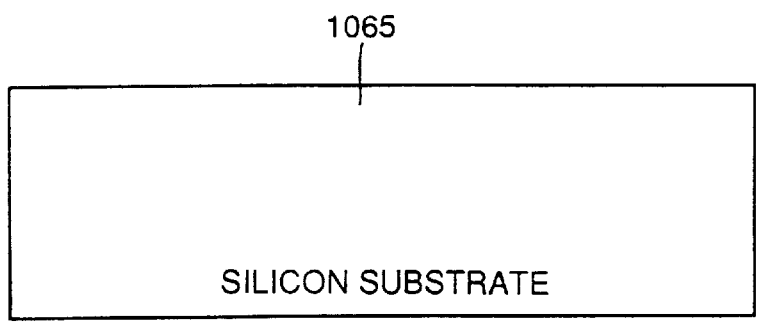
FIGS. 52(*a*)–60(*b*) are illustrations showing first to ninth steps of manufacturing a substrate transistor.
Figure 52:
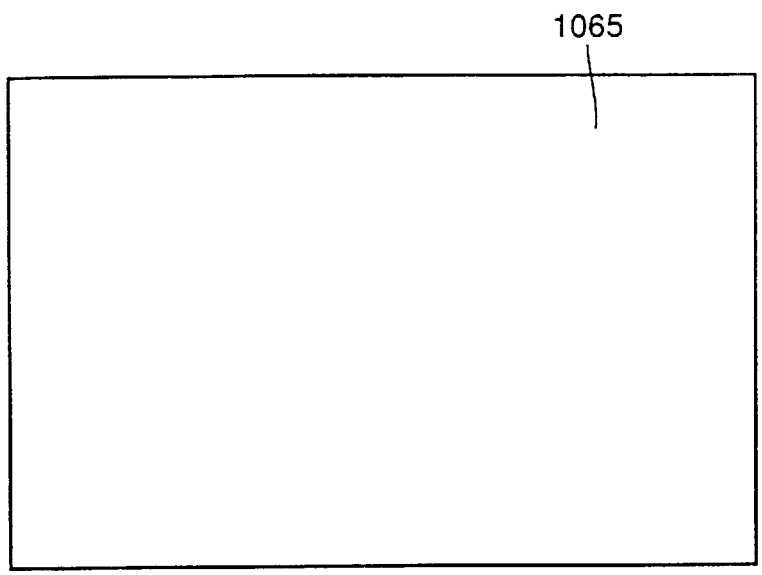
Figure 53A:
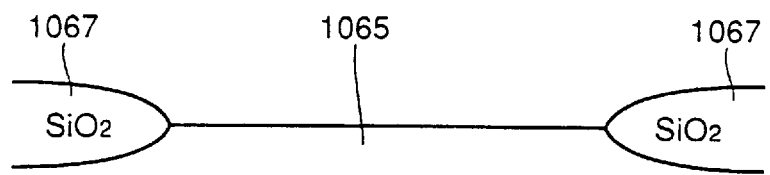
Figure 53B:
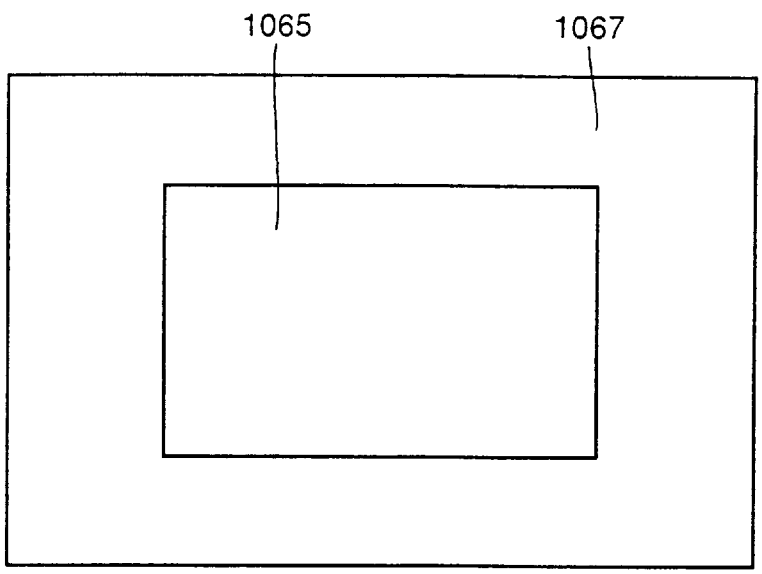

FIGS. 52 to 60 show the first to the ninth steps of manufacturing the substrate transistor. Portions corresponding to those of FIGS. 35 to 43 are denoted by the same reference characters and description thereof is not repeated. The first and second steps of manufacturing the substrate transistor shown in FIGS. 52 and 53 are similar to the first and second steps of manufacturing a common NMOS transistor shown in FIGS. 35 and 36.

Figure 54A:
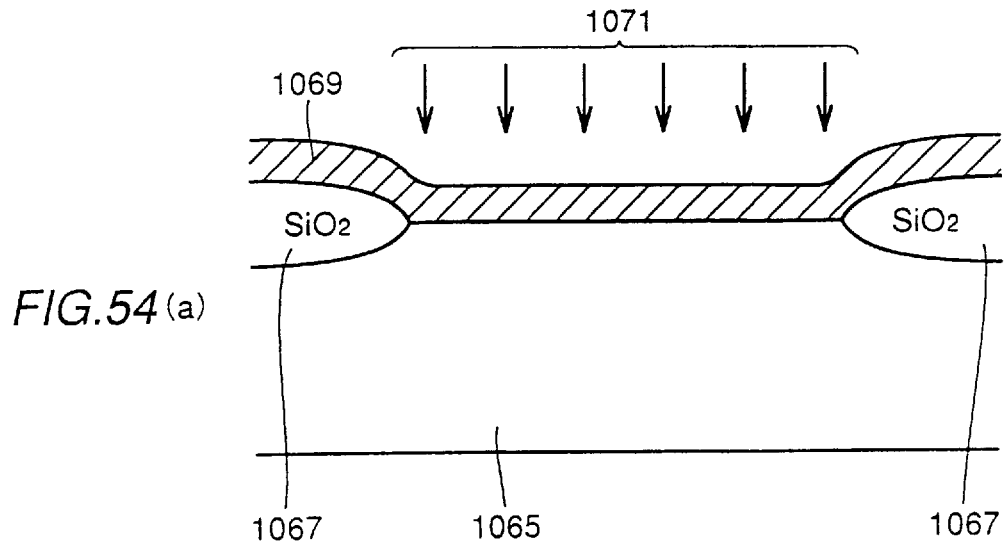
Figure 54B:
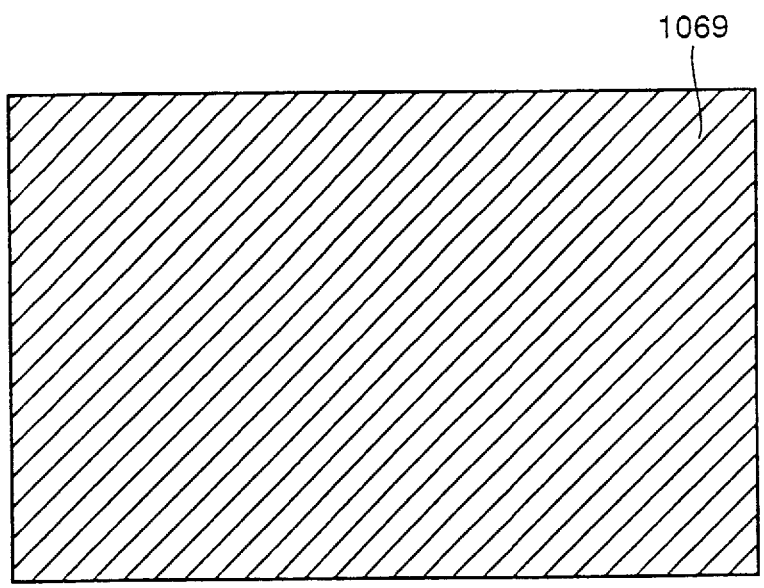

Referring to FIG. 54(a), resist 1069 is formed entirely on silicon oxide film 1067 and silicon substrate 1065. This is to provide a mask by resist 1069, for preventing introduction of boron 1071. It is not necessary to introduce boron 1071 in the substrate transistor. However, such a step of introducing boron 1071 exists, since the substrate transistor is manufactured by utilizing the conventional method of manufacturing a common NMOS transistor shown in FIGS. 35 to 43. In FIG. 54, (b) is a plan view of (a).

Figure 55A:
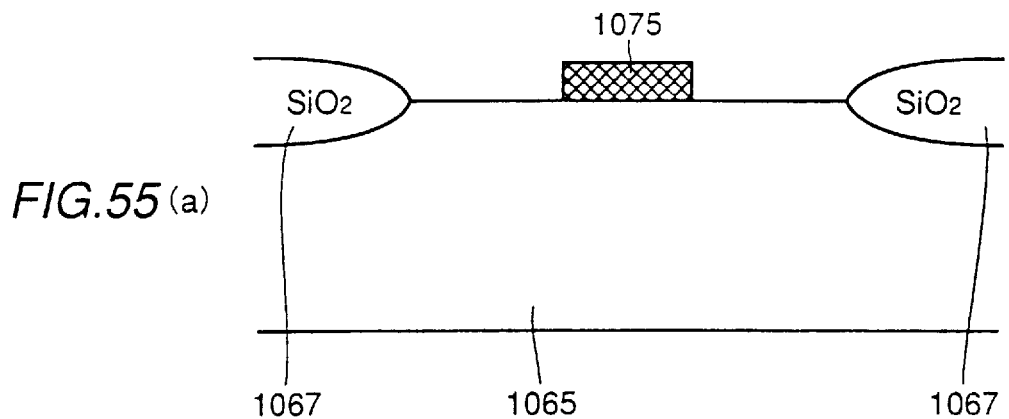
Figure 55B:
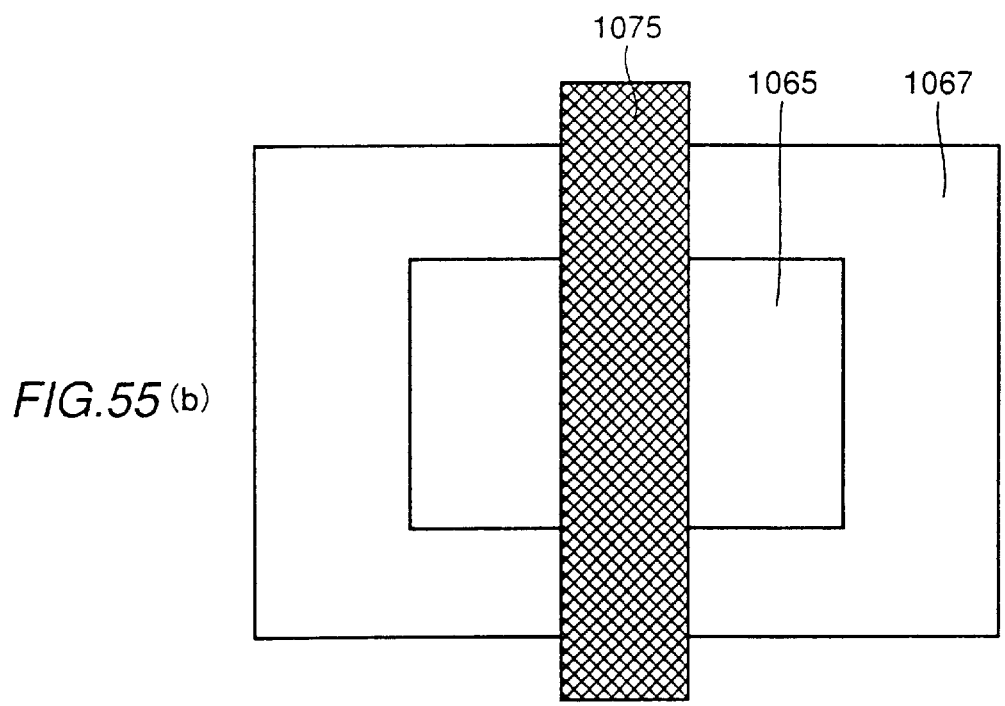

Referring to FIG. 55(a), an insulating film, not shown, is formed on silicon substrate 1065. On the insulating film, not shown, transfer gate 1075 is formed. In FIG. 55, (b) is a plan view of (a).

Figure 56A:
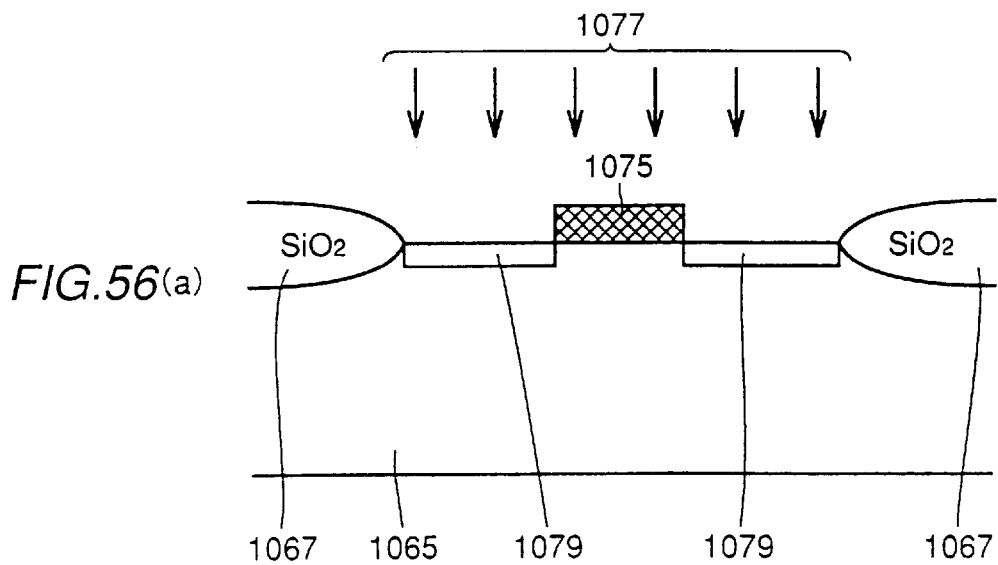
Figure 56B:
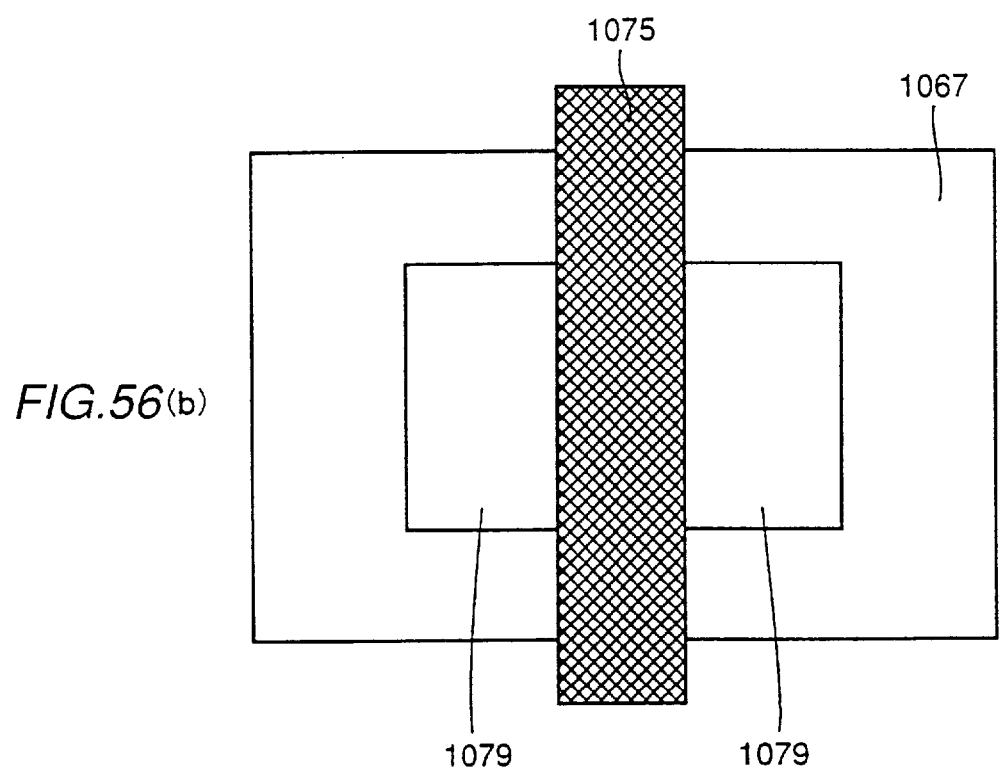

Referring to FIG. 56(a), lightly doped n⁻ region 1079 is formed at silicon substrate 1065 by introducing low concentration phosphorus (n⁻) 1077. This step differs from the step of FIG. 39 in that while n⁻ region 1079 is formed on P well 1073 in the step shown in FIG. 39, n⁻ region 1079 is directly formed on silicon substrate 1065 in the step of FIG. 56. In this figure, (b) is a plan view of (a).

Figure 57:
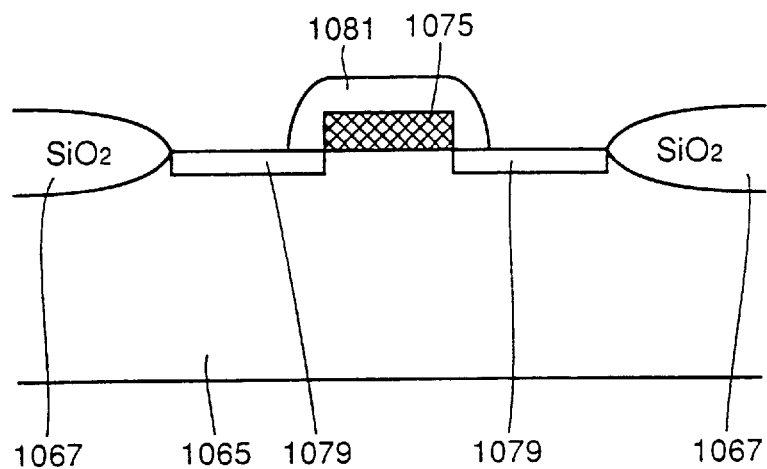
Figure 57:
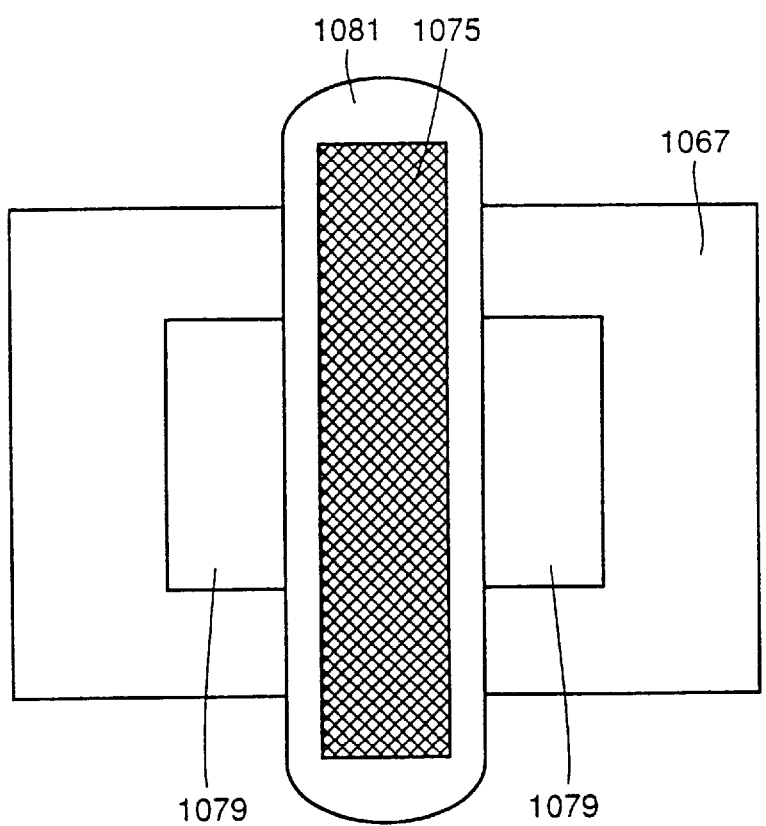

Referring to FIG. 57(a), high temperature oxide film 1081 is formed on the sidewall of transfer gate 1075. In FIG. 57, (b) is a plan view of (a).

Figure 58A:
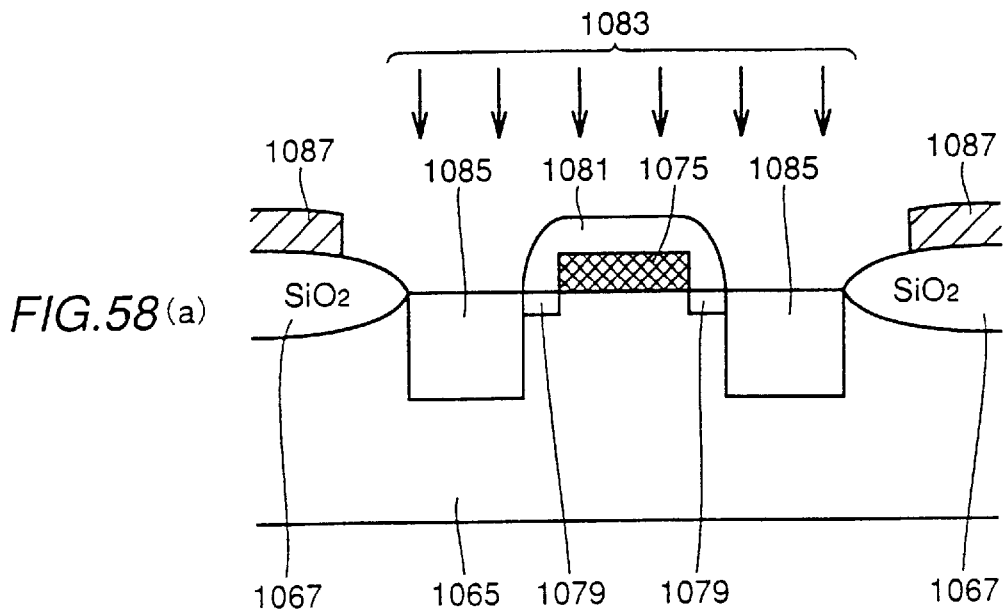
Figure 58B:
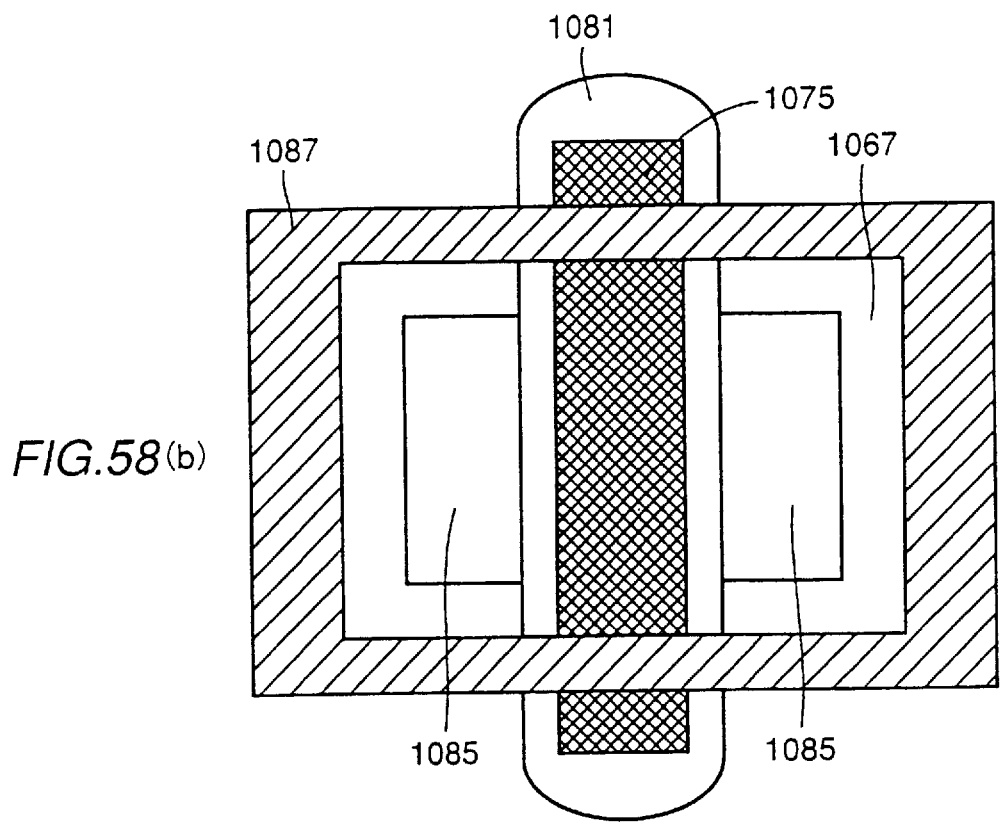

Referring to FIG. 58(a), resist 1087 is formed on silicon oxide film 1067. Then, high concentration phosphorus (n⁺) 1083 is introduced, so as to form highly doped n⁺ region 1085 in silicon substrate 1065. In FIG. 58, (b) is a plan view of (a).

Figure 59A:
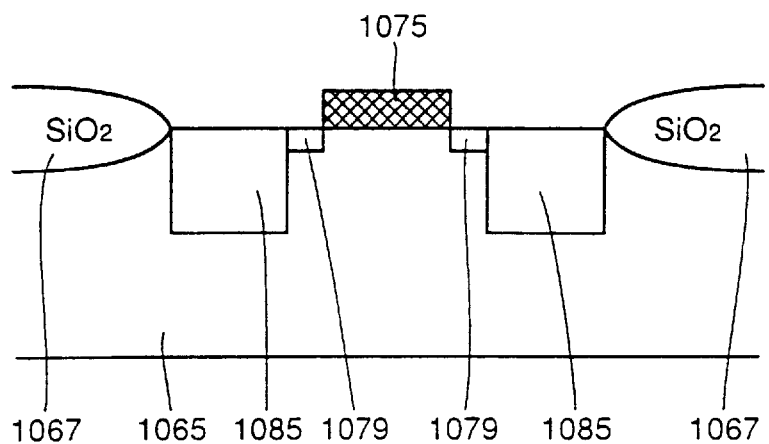
Figure 59B:
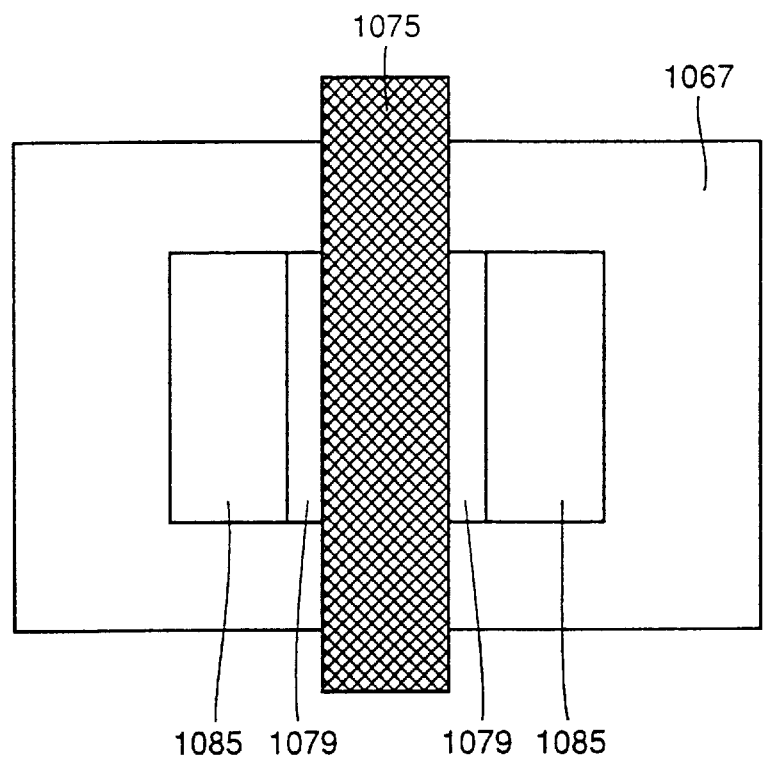

Referring to FIG. 59(a), high temperature oxide film 1081 formed on the sidewall of transfer gate 1075 is removed by etching. In FIG. 59, (b) is a plan view of (a).

Figure 60A:
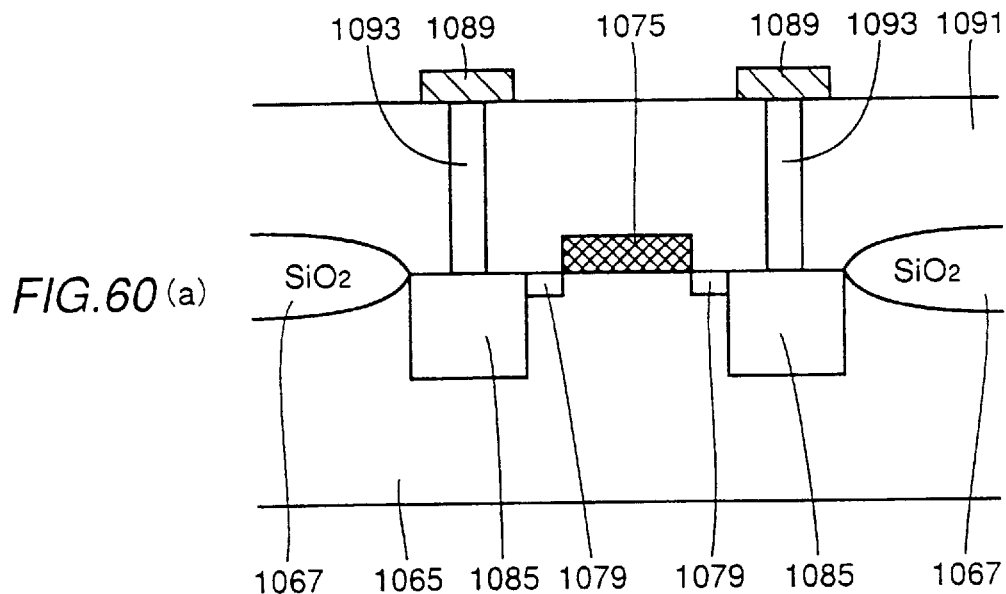
Figure 60B:
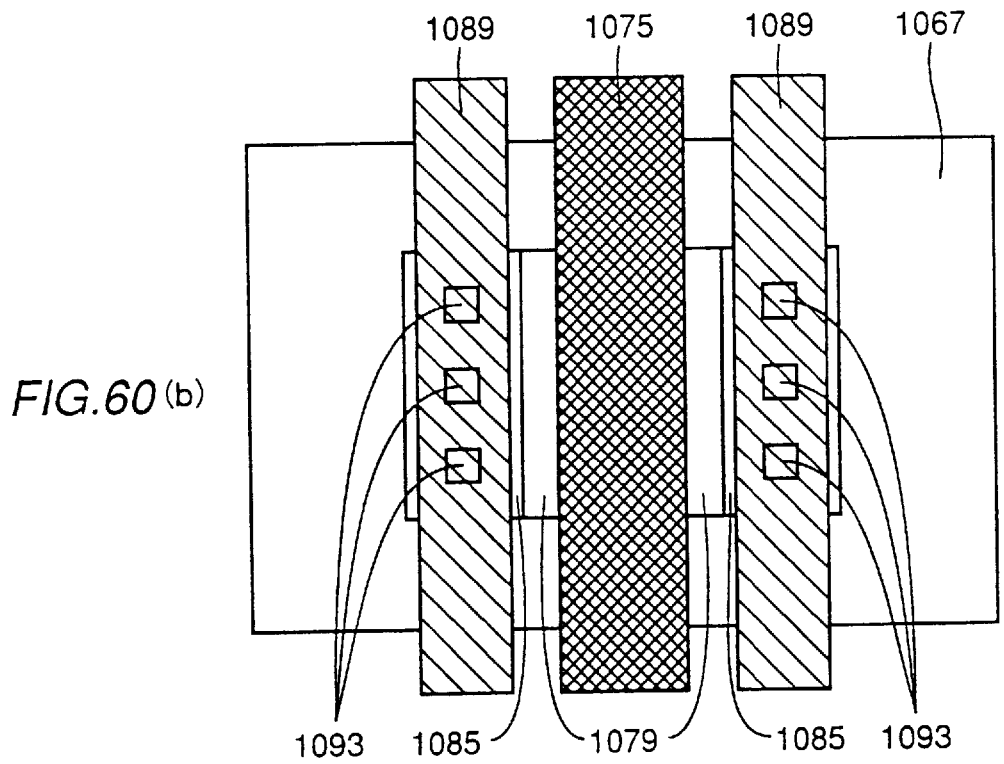
Figure 61A:
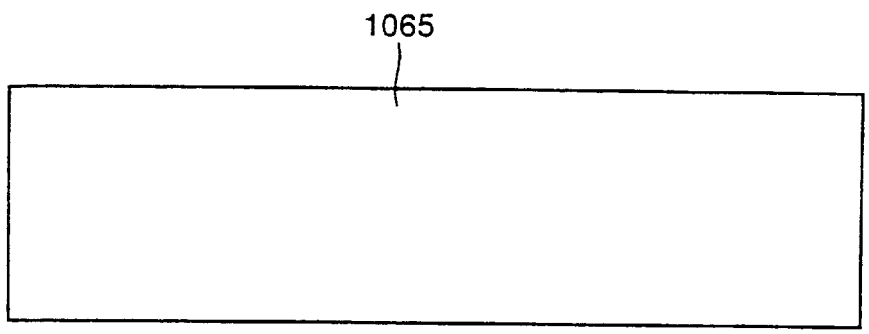
FIGS. 61(*a*)–69(*b*) are illustrations showing first to ninth steps of manufacturing a high breakdown voltage NMOS transistor in accordance with a nineteenth embodiment of the present invention.
Figure 61B:
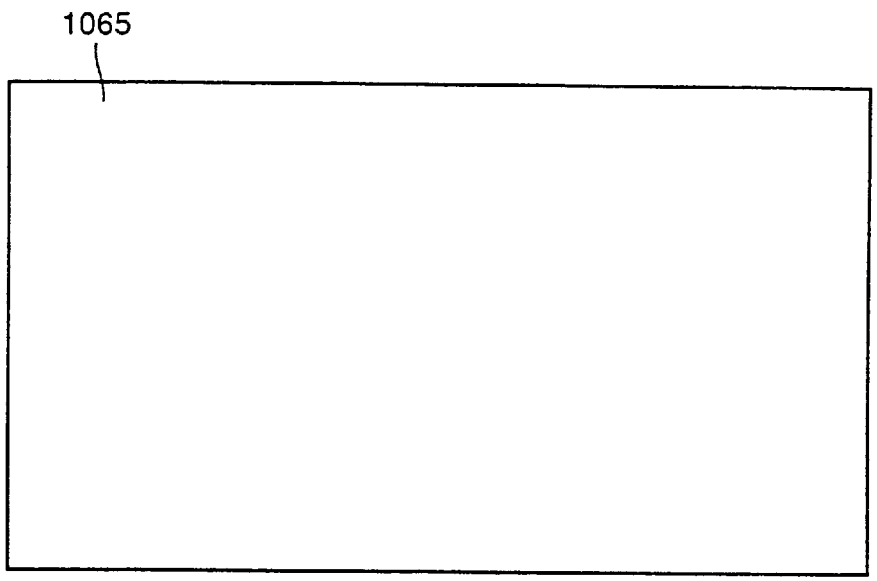
Figure 62:
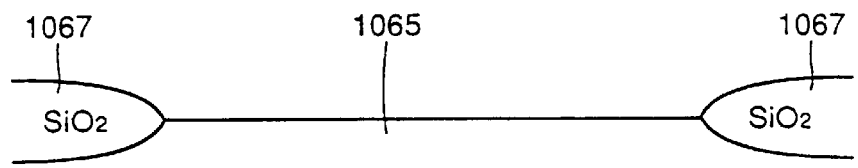
Figure 62:
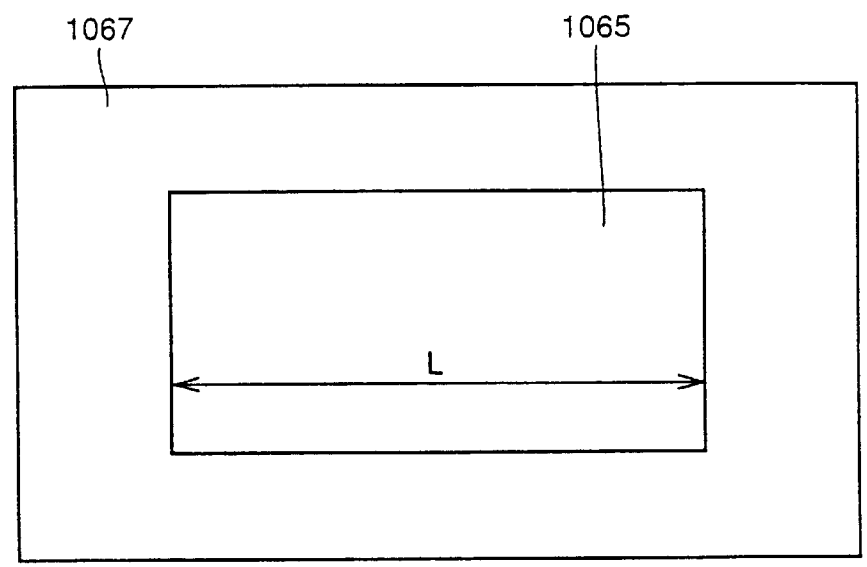

Referring to FIG. 60(a), insulating film 1091 is formed on the upper surface of silicon oxide film 1067, n⁺ region 1085, n⁻ region 1079 and transfer gate 1075. Contact hole 1093 is formed in insulating film 1091. Aluminum interconnection 1089 and n⁺ region 1085 formed on insulating film 1091 are connected by a conducting layer formed in contact hole 1093. In FIG. 60, (b) is a plan view of (a).

The feature of the substrate transistor formed in this manner, is that n⁻ region 1079 and n⁺ region 1085 are directly formed in silicon substrate 1065. By contract, in a common NMOS transistor, n⁺ region 1085 and n⁻ region 1079 are formed in P well 1073 (see FIG. 43).

In each of FIGS. 52 to 60, (b) is a plan view of (a).

In the substrate transistor, n⁺ region 1085 and n⁻ region 1079 are directly formed in silicon substrate 1065, and hence it has lower threshold voltage as compared with the common NMOS transistor. By utilizing this property, the substrate transistor can be used as capacitors 83, 85, 87 and 89 shown in FIG. 10, capacitors 103, 105, 107 and 109 shown in FIG. 12, capacitors 83, 85, 87 and 89 shown in FIG. 14, capacitors 103, 105, 107 and 109 shown in FIG. 15, capacitors 83, 85 and 87 shown in FIG. 27, capacitors 83, 81, 87, 1043 of FIG. 30, capacitors 105, 107 and 109 of FIG. 32, and capacitors 1057, 105, 107, 109 of FIG. 34.

As compared with the common NMOS transistor described with reference to FIGS. 35 to 43, the substrate transistor has lower threshold voltage, which facilitates formation of a channel and therefore it easily functions as a capacitor. In other words, by using a substrate transistor having lower threshold value, performance as a capacitor can be improved.

Such a substrate transistor can also be used as NMOS transistors 91, 93, 94, 95 and 97 shown in FIGS. 10, 14, 27 and 30. In that case, since the substrate transistor has lower threshold voltage than the common NMOS transistor described with reference to FIGS. 35 to 43, positive charges can be transmitted with higher efficiency from the drain to the source as compared with the common NMOS transistor.

Therefore, efficiency of the boosted potential generating circuit as a whole can be improved by using the substrate transistor. The NMOS transistor shown in FIG. 17 with respect to the ninth embodiment is similar to the substrate transistor described with reference with FIGS. 52 to 60.

Further, the substrate transistor may be a depletion type one.

A method of manufacturing an NMOS transistor having high breakdown voltage in accordance with nineteenth embodiment of the present invention will be described.

FIGS. 61 to 69 show the first to ninth steps of manufacturing the NMOS transistor having high breakdown voltage in accordance with the nineteenth embodiment. In these figures, portions corresponding to those of FIGS. 35 to 43 are denoted by the same reference characters and description thereof is not repeated. The first, fourth, sixth, eighth and ninth steps of manufacturing the NMOS transistor having high breakdown voltage in accordance with the nineteenth embodiment are similar to the first, fourth, sixth, eighth and ninth steps of manufacturing a common NMOS transistor described with reference to FIGS. 35, 38, 40, 42 and 43.

Referring to FIG. 62(a), silicon oxide film 1067 is formed on silicon substrate 1065. The width L of a portion of silicon substrate 1065 which is not provided with silicon oxide film 1067 is made longer than the width L of a portion of silicon substrate 1065 shown in FIG. 36 which is not provided with silicon oxide film 1067.

Figure 63A:
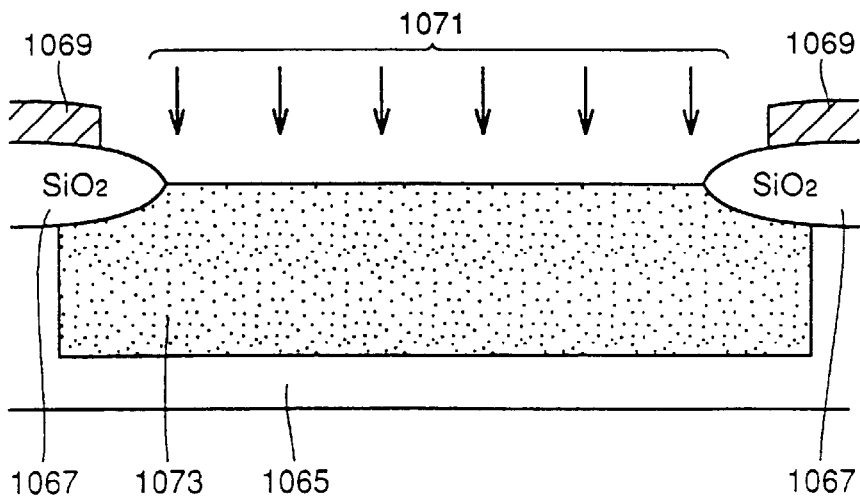
Figure 63B:
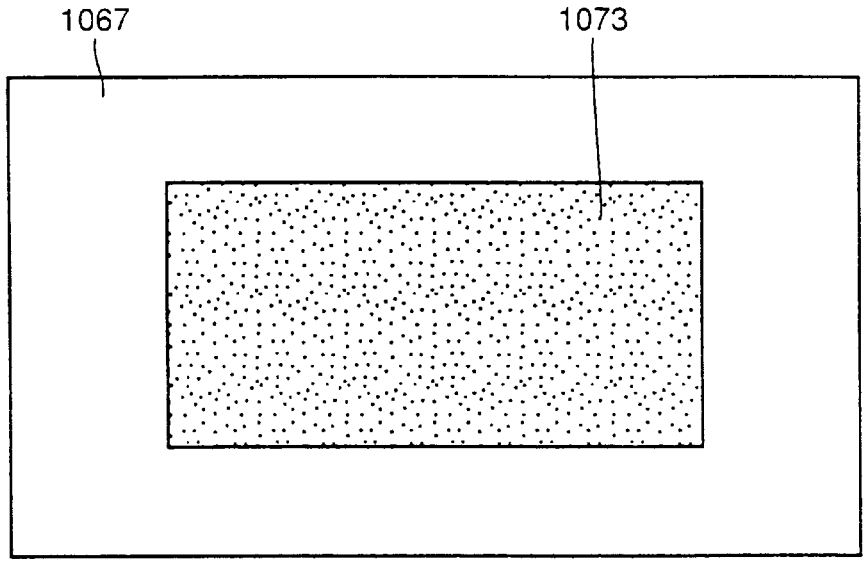
Figure 64A:
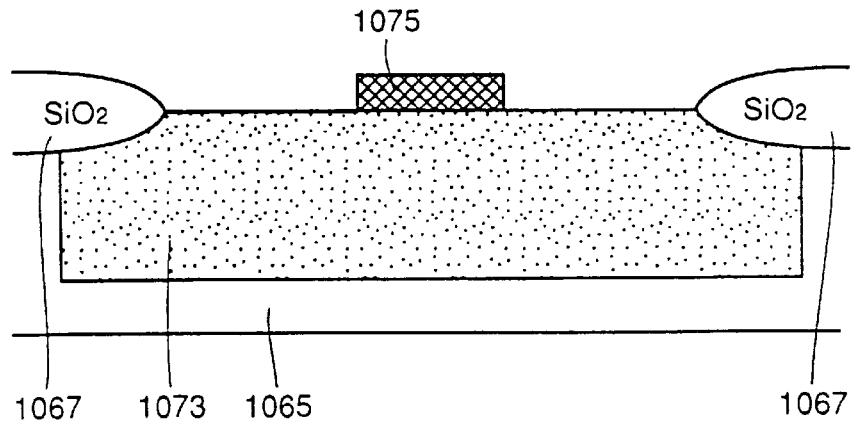
Figure 64B:
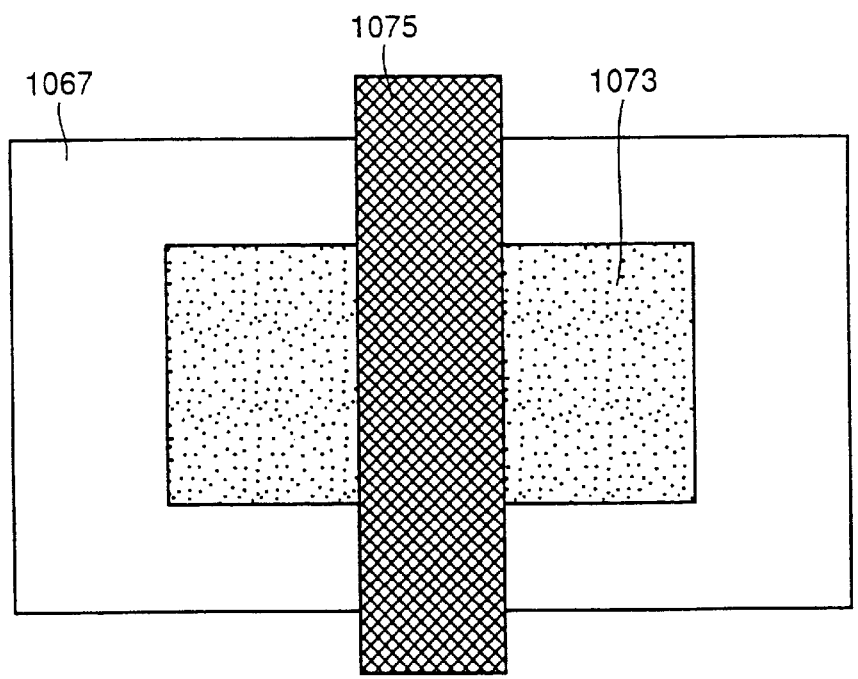

Referring to FIG. 63(a), the width of the portion where P well 1073 is formed is made wider than the width of P well 1073 shown in FIG. 37.

Figure 65A:
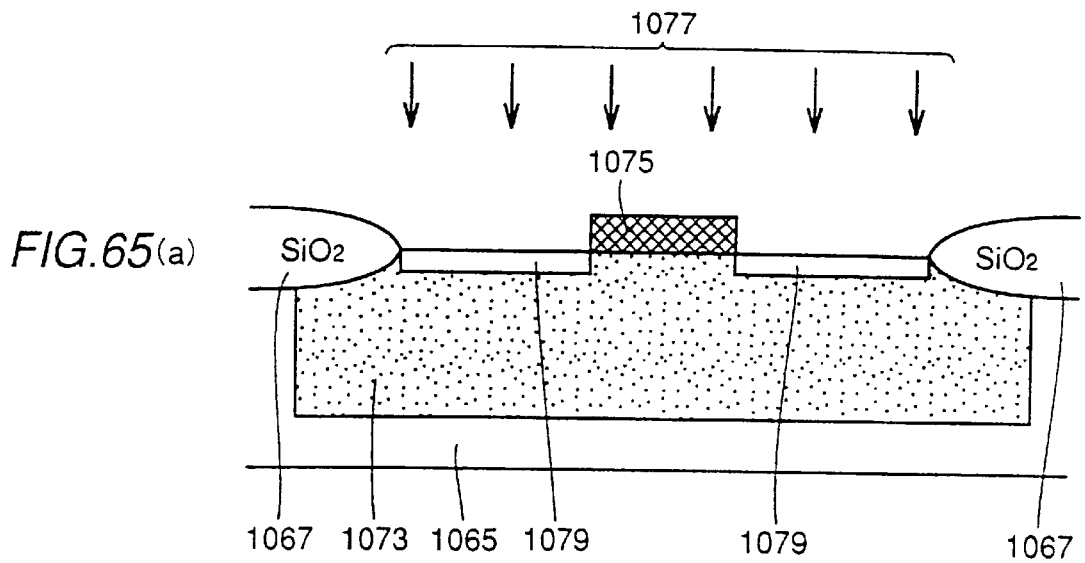
Figure 65B:
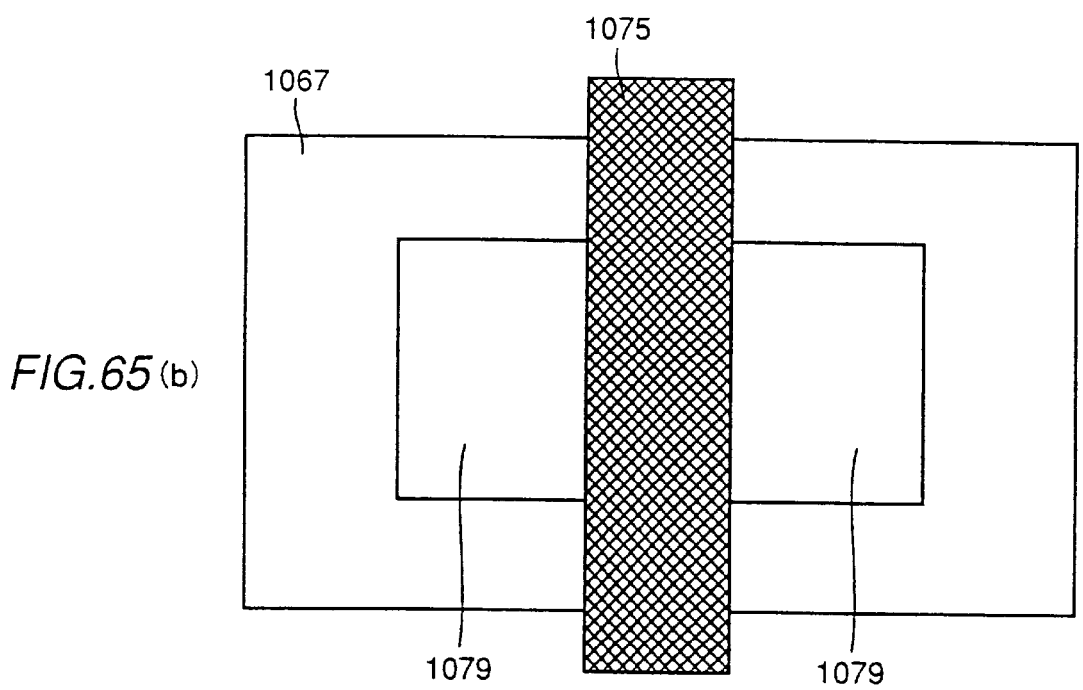
Figure 66:
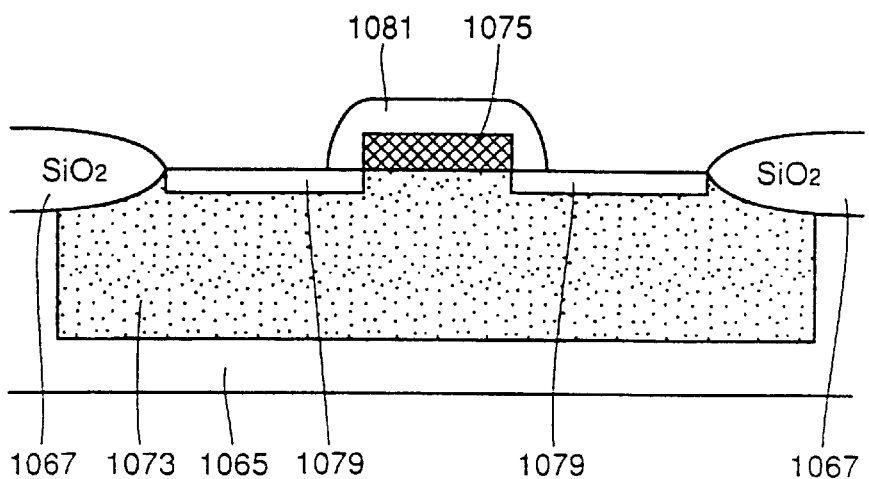
Figure 66:
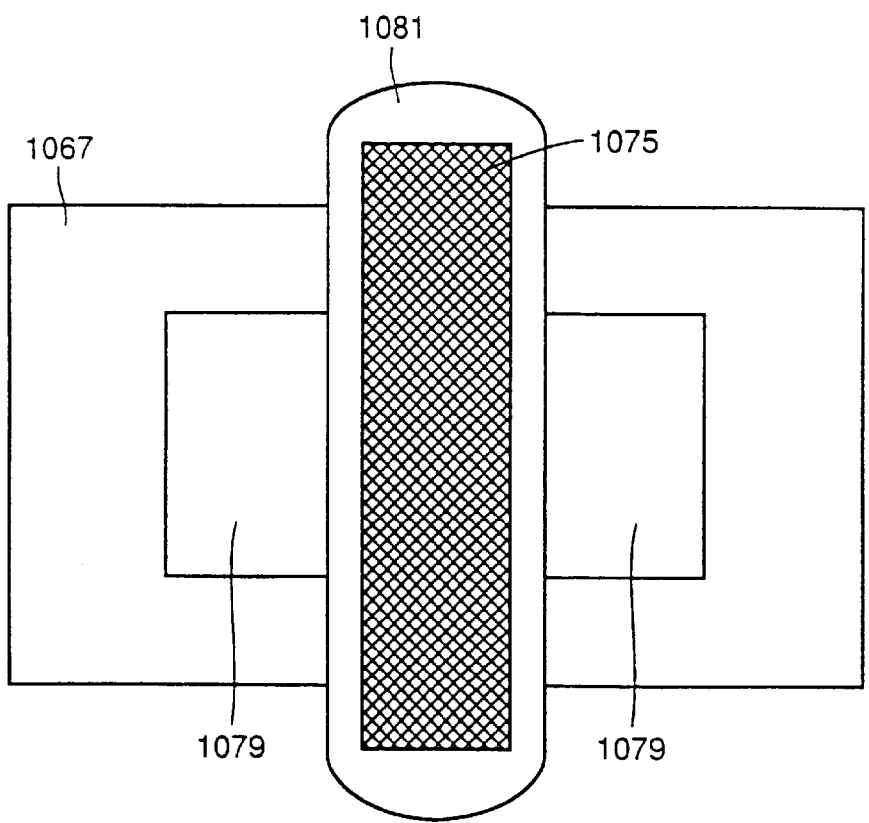

Referring to FIG. 65(a), the length of lightly doped n⁻ region 1079 in the direction of the gate length is made longer than that of n⁻ region 1079 shown in FIG. 39.

Figure 67A:
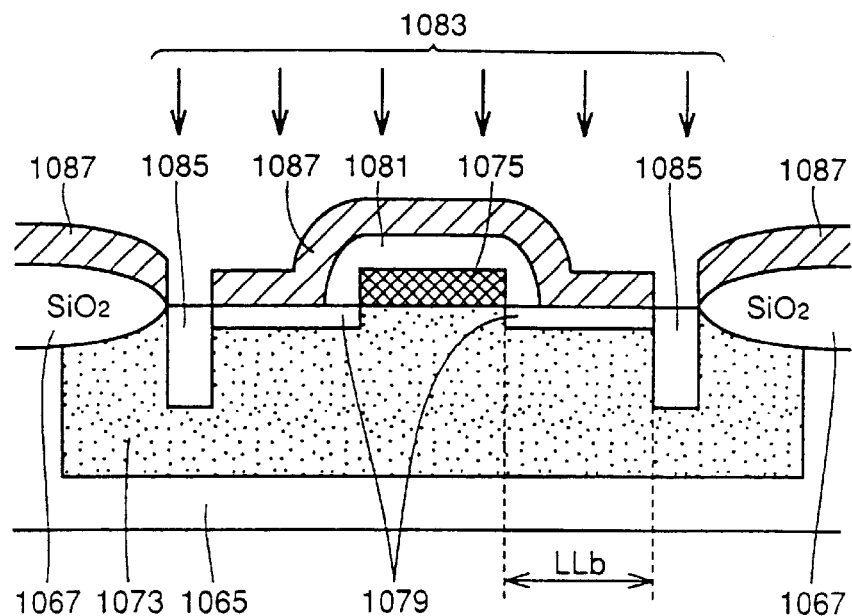

Referring to FIG. 67(a), except the portion on which highly doped n⁺ region 1085 is to be formed, resist 1087 is formed on silicon oxide film 1067, n⁻ region 1079 and high temperature oxide film 1081. By introducing high concentration phosphorus (n⁺) 1083, a highly doped n⁺ region 1085 is formed in P well 1073.

Figure 67B:
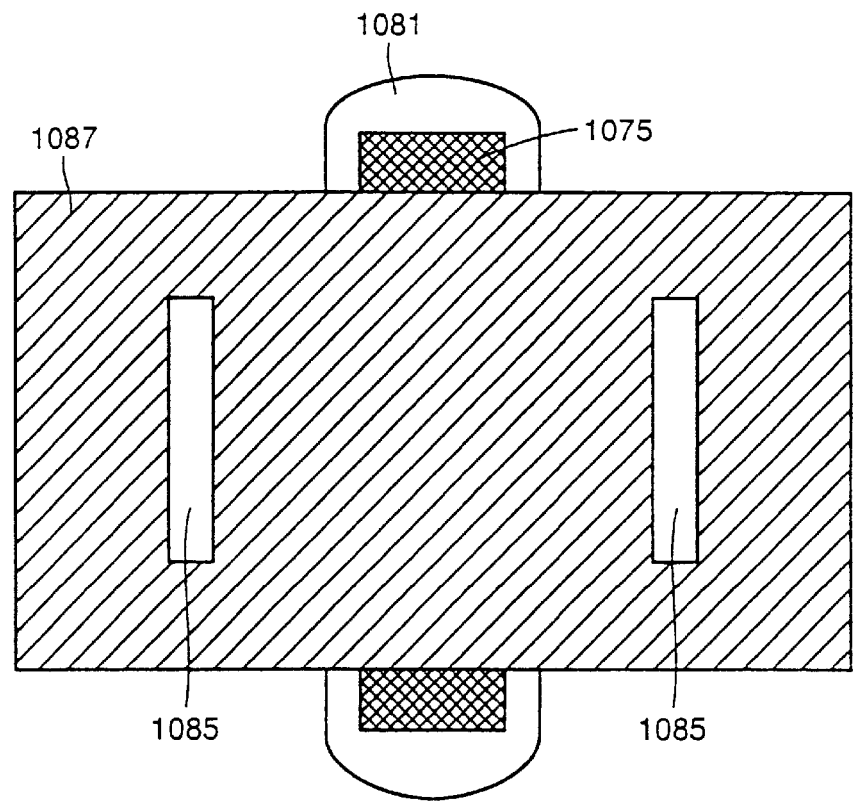
Figure 68A:
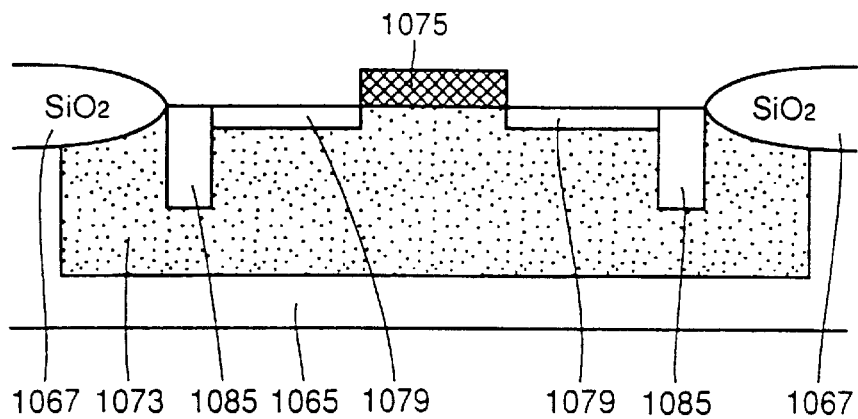
Figure 68B:
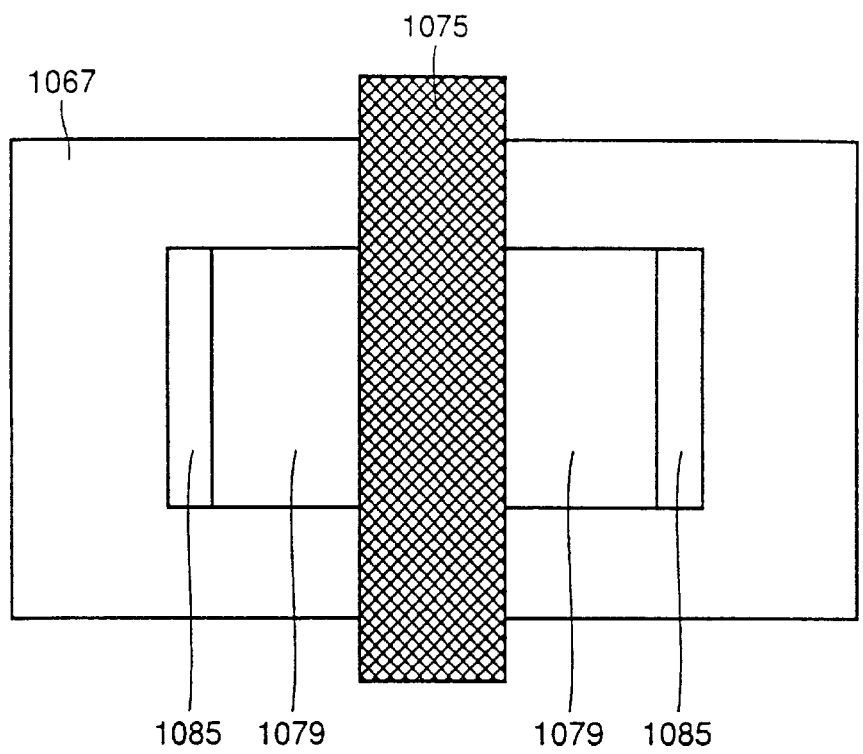
Figure 69:
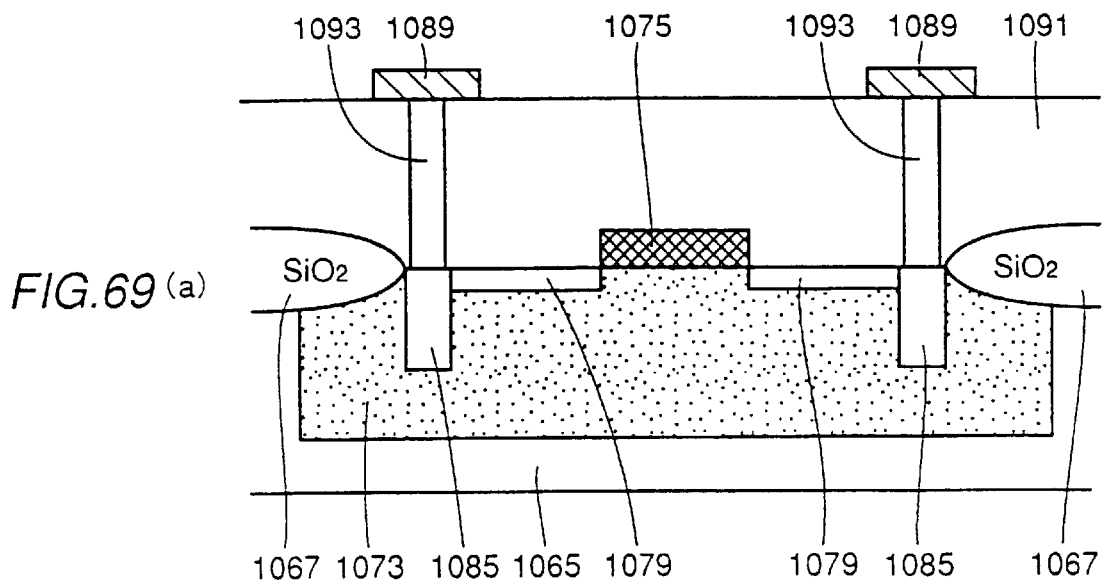
Figure 69:
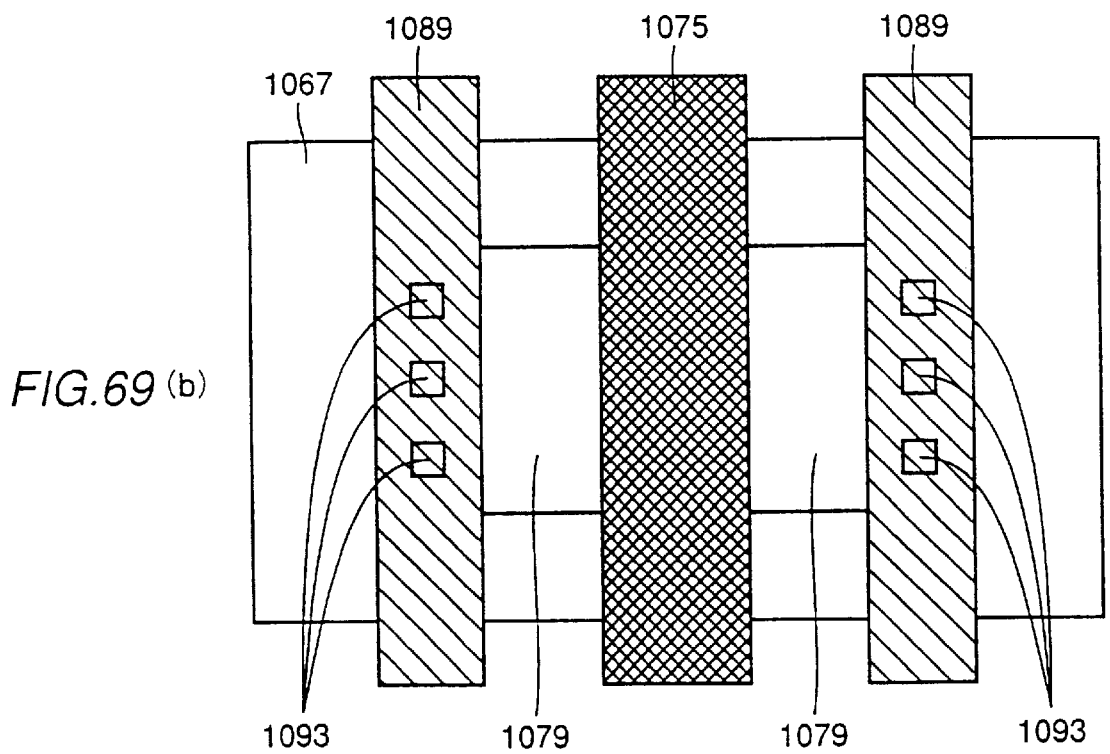

Here, resist 1087 shown in FIG. 67 is formed such that the distance LLb in the direction of the gate length between the edge of transfer gate 1075 and n⁺ region 1085 is made longer than the distance LLa between the edge of transfer gate 1075 and n⁺ region 1085 of the common NMOS transistor shown in FIG. 41. More specifically, the resist 1087 shown in FIG. 67 is formed to satisfy the condition that LLb>LLa. Phosphorus (n⁺) 1083 is not introduced to the portion covered by resist 1087.

In the seventh step of manufacturing the NMOS transistor having high breakdown voltage, the step of forming resist 1087 can be performed utilizing the seventh step of forming resist 1087 of the method of manufacturing the NMOS transistor used for the memory cell shown in FIG. 50. Therefore, when the NMOS transistor having high breakdown voltage in accordance with the nineteenth embodiment is used in a semiconductor memory device having memory cells, it is not necessary to add new steps.

In each of FIGS. 61 to 69, (b) is a plan view (a).

In the NMOS transistor having high breakdown voltage in accordance with the nineteenth embodiment manufactured through the step described with reference to FIGS. 61 to 69 above, the distance LLb (FIG. 67) between the edge of transfer gate 1075 and the highly doped n⁺ region 1085 is made longer than the distance LLa between the edge of the transfer gate 1075 and the highly doped n⁺ region 1085 of a common NMOS transistor manufactured through the steps described with the reference to FIGS. 35 to 43. Therefore, as compared with the conventional NMOS transistor, punch through is less likely in the NMOS transistor having high breakdown voltage in accordance with the nineteenth embodiment. More specifically, the voltage at which punch through occurs becomes higher in the NMOS transistor having high breakdown voltage in accordance with the nineteenth embodiment, as compared with a common NMOS transistor. Therefore, even when a high voltage is applied between two n$^+$ regions 1085, punch through is less likely as compared with the common NMOS transistor and hence breakdown of the transistor can be prevented.

The NMOS transistor having high breakdown voltage in accordance with the nineteenth embodiment may be used as the NMOS transistor having high breakdown voltage used in the tenth embodiment. More specifically, the NMOS transistor having high breakdown voltage in accordance with the nineteenth embodiment may be used as NMOS transistor 93 shown in FIGS. 10 and 14. Further, the NMOS transistor having high breakdown voltage in accordance with the nineteenth embodiment may be used as NMOS transistor 93 shown in FIGS. 27 and 30.

In this manner, by using the NMOS transistor having a high breakdown voltage in accordance with the nineteenth embodiment as that one of the NMOS transistors included in the semiconductor device to the source/drain of which a high voltage is applied, that is, as the transistor in the internal potential generating circuit, punch through is less likely even when a high voltage is applied, and hence breakdown of the transistor can be prevented. Namely, as compared with an example in which the common NMOS transistor manufactured through the steps described with reference to FIGS. 35 to 43 is used at a portion where a high voltage is applied, punch through is less likely when a high voltage is applied if the NMOS transistor having high breakdown voltage in accordance with the nineteenth embodiment is used, and hence breakdown of the transistor can be prevented. This results in improved reliability of the internal potential generating circuit (semiconductor device).

[Twentieth Embodiment]

Figure 70:
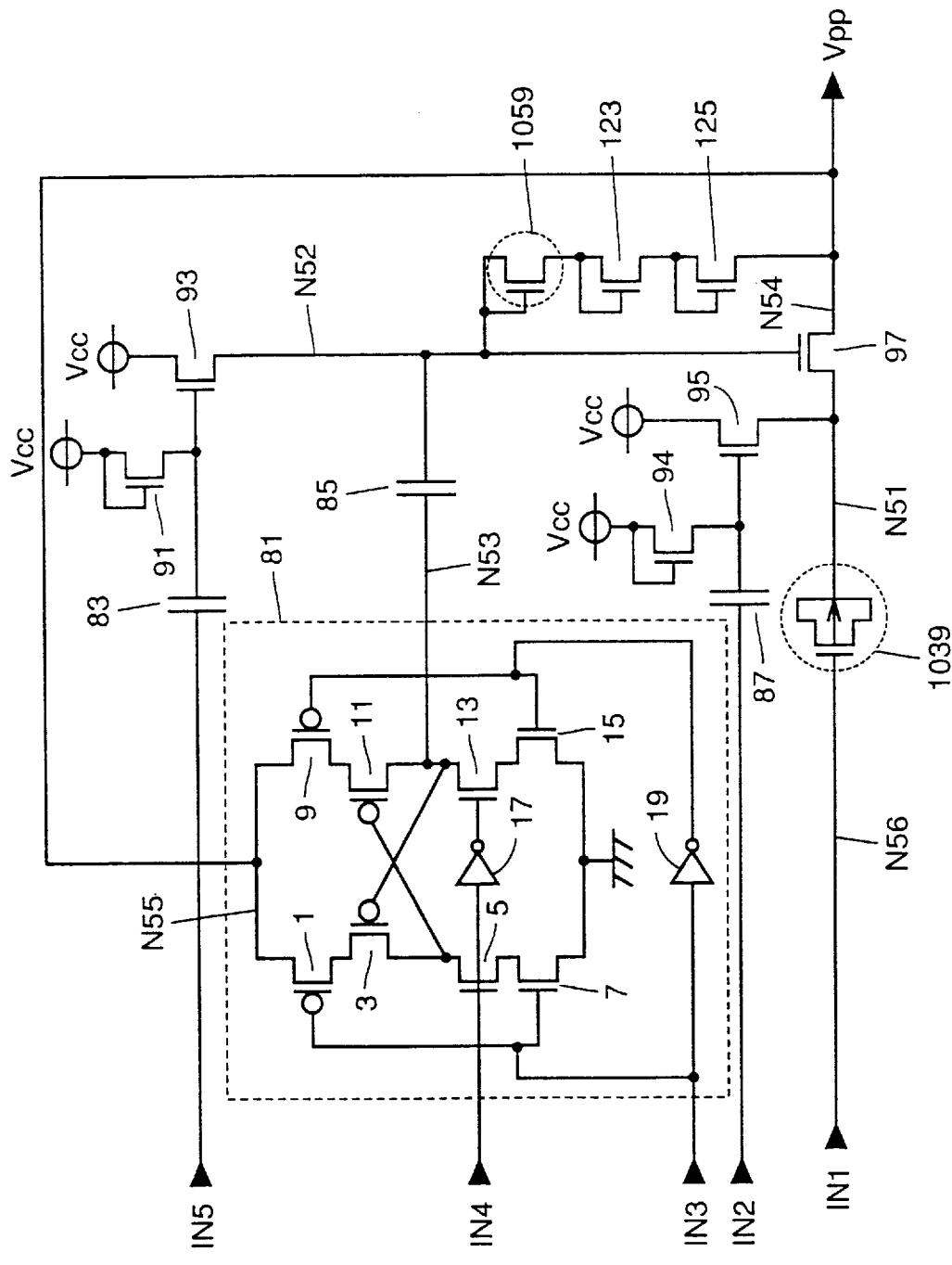
FIG. 70 is a circuit diagram showing a boosted potential generating circuit as an internal potential generating circuit in accordance with a twentieth embodiment of the present invention.

FIG. 70 is a circuit diagram showing details of the boosted potential generating circuit as the internal potential generating circuit in accordance with the twentieth embodiment of the present invention. Portions corresponding to those shown in FIGS. 14 and 27 are denoted by the same reference characters and detailed description thereof is not repeated.

The boosted potential generating circuit in accordance with the twentieth embodiment shown in FIG. 70 includes, in addition to the structure shown in FIG. 27, an NMOS transistor 1059 having high breakdown voltage and NMOS transistors 123 and 125 connected in series between nodes N52 and N54. Other portions are similar to those of the boosted potential generating circuit shown in FIG. 27. The NMOS transistor 1059 having high breakdown voltage and NMOS transistors 123 and 125 shown in FIG. 70 correspond to the NMOS transistors 121, 123 and 125 of FIG. 14, and functions of NMOS transistor 1059 having high breakdown voltage and of NMOS transistors 123 and 125 shown in FIG. 70 are similar to those of NMOS transistors 121, 123 and 125 shown in FIG. 14. The only difference is that an NMOS transistor 121 is connected to node N52 in FIG. 14, while NMOS transistor 1059 having high breakdown voltage is connected to node N52 in FIG. 70. The NMOS transistor 1059 having high breakdown voltage is the same as the NMOS transistor having high breakdown voltage in accordance with the nineteenth embodiment.

The NMOS transistor connected to node N52 is replaced by NMOS transistor 1059 having high breakdown voltage from the following reasons. First, in the common NMOS transistor manufactured through the steps described with reference to FIGS. 35 to 43, the maximum voltage which can be applied to the junction portion (FIG. 43) between n$^+$ region 1085 and P well 1073 is 7 to 8 V. In other words, if a higher voltage is applied to the junction portion, there is a high possibility of punch through, that is, high possibility of breakdown of the transistor. Here, the potential at node N52 is, at the highest, about 8.6 V in such a boosted potential generating circuit as shown in FIG. 70. Namely, boosted potential Vpp+power supply potential Vcc=5 V+3.6 V=8.6 V. Meanwhile, substrate potential Vbb is −1 V. Therefore, a voltage of about 10 V would be applied to the junction portion between n$^+$ source/drain electrode and the substrate, not shown, of NMOS transistor 1059 having high breakdown voltage connected to node N52. Namely, the voltage applied to the junction portion is Vpp+Vcc+|Vbb|≈10 V. Therefore, if a common NMOS transistor is used at a portion where NMOS transistor 1059 having high breakdown voltage is used, punch through is likely, resulting in breakdown of the transistor.

NMOS transistor 1059 having high breakdown voltage is used as the NMOS transistor connected to node N52 from the above described reasons. If the NMOS transistor having high breakdown voltage in accordance with the nineteenth embodiment is used as NMOS transistor 1059 having high breakdown voltage, maximum voltage of 12 to 13 V may be applied to the junction portion. Therefore, even when boosted potential of Vpp+Vcc=5 V+3.6 V is applied to node N52 and the substrate potential Vbb=−1 V, punch through is less likely in the NMOS transistor 1059 having high breakdown voltage, and hence breakdown can be prevented.

As described above, in the boosted potential generating circuit in accordance with the twentieth embodiment, NMOS transistor 1059 having high breakdown voltage (NMOS transistor having high breakdown voltage in accordance with the nineteenth embodiment) is used as that one of the three NMOS transistors connected in series between nodes N52 and N54 to which a high voltage is applied, that is, the transistor connected to node N52, in the boosted potential generating circuit in accordance with the twentieth embodiment. Therefore, even when a high voltage is applied to node N52, punch through is less likely in the NMOS transistor 1059 having high breakdown voltage, and thus it is less likely be broken. In other words, as the NMOS transistor 1059 having high breakdown voltage is used in the boosted potential generating circuit in accordance with the twentieth embodiment, reliability of the circuit can be improved.

The boosted potential generating circuit in accordance with the twentieth embodiment includes the structure of the boosted potential generating circuit shown in FIG. 14 and of the boosted potential generating circuit shown in FIG. 27. Therefore, the boosted potential generating circuit in accordance with the twentieth embodiment provides similar effects as the boosted potential generating circuits in accordance with the seventh and fifteenth embodiments.

The level converting circuit shown in FIG. 22 may be used as the level converting circuit 81 of FIG. 14. Further, the NMOS transistor having high breakdown voltage in accordance with the nineteenth embodiment is used as NMOS transistor 121 shown in FIG. 14. Further, capacitor 1039 of FIG. 27 or capacitor 1043 of FIG. 30 may be used as capacitor 89 shown in FIG. 14.

Figure 71:
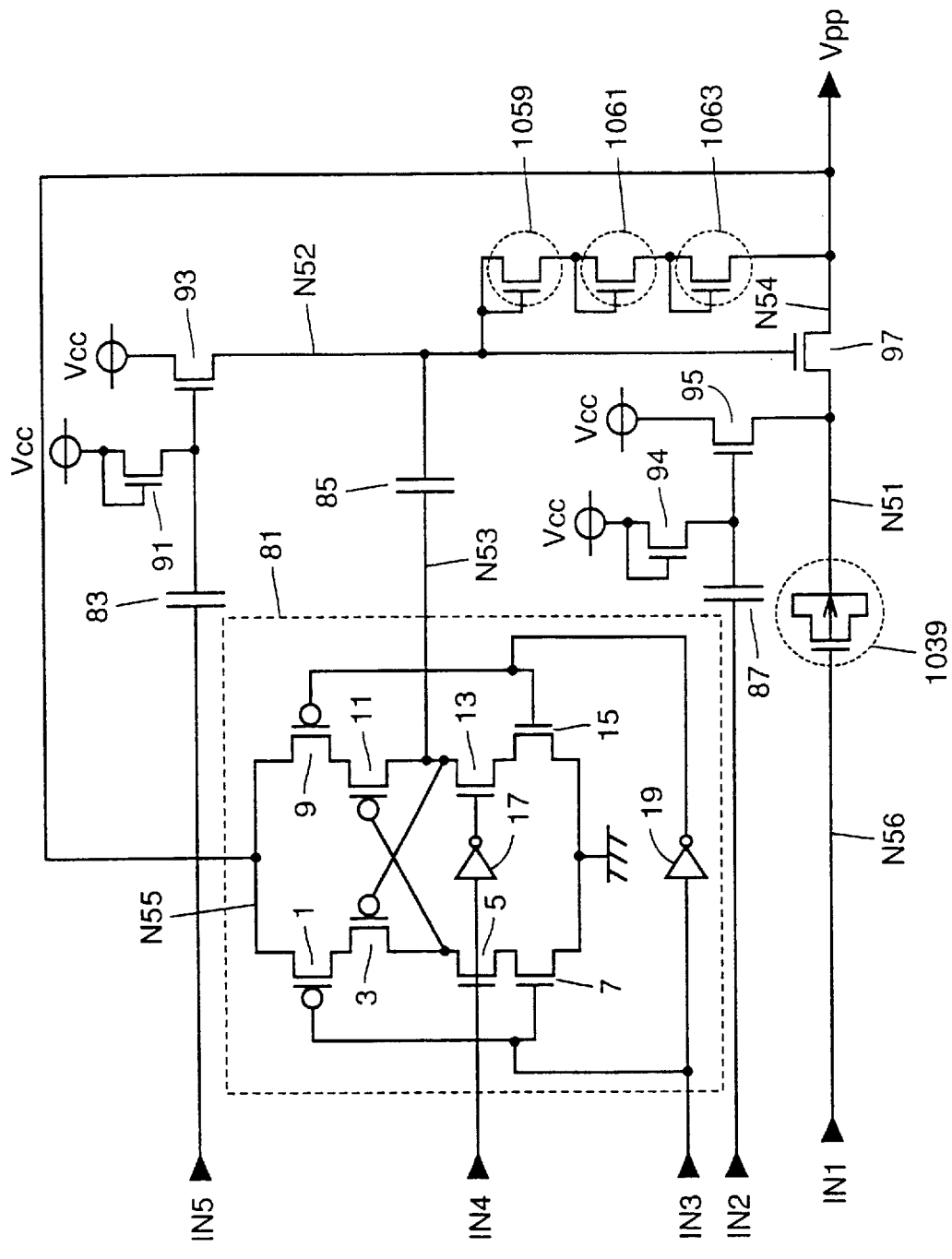
FIG. 71 is a circuit diagram showing a modification of the boosted potential generating circuit as the internal potential generating circuit in accordance with the twentieth embodiment of the present invention.

FIG. 71 shows, in detail, a modification of the boosted potential generating circuit as the internal potential generating circuit in accordance with the twentieth embodiment.

Portions corresponding to those of FIG. 70 are denoted by the same reference characters and description thereof is not repeated.

The boosted potential generating circuit shown in FIG. 71 employs, as NMOS transistors 123 and 125 of the boosted potential generating circuit shown in FIG. 70, NMOS transistors 1061 and 1063 having high breakdown voltage. NMOS transistors 1061 and 1063 having high breakdown voltage are the same as the NMOS transistor having high breakdown voltage in accordance with the nineteenth embodiment.

As described above, in the modification of the boosted potential generating circuit in accordance with the twentieth embodiment, all three NMOS transistors connected in series between nodes N52 and N54 are replaced by NMOS transistors 1059, 1061, 1063 having high breakdown voltage, respectively. Thus, the modification of the boosted potential generating circuit in accordance with the twentieth embodiment provides similar effects as the boosted potential generating circuit in accordance with the twentieth embodiment shown in FIG. 70.

Here, the level converting circuit shown in FIG. 22 may be used as level converting circuit 81 of FIG. 14. Further, NMOS transistors 121, 123 and 125 shown in FIG. 14 may be all replaced by NMOS transistors having high breakdown voltage in accordance with the nineteenth embodiment. Capacitor 1039 shown in FIG. 27 or capacitor 1043 of FIG. 30 may be used as capacitor 89 shown in FIG. 14.

[Twenty-First Embodiment]

Figure 72:
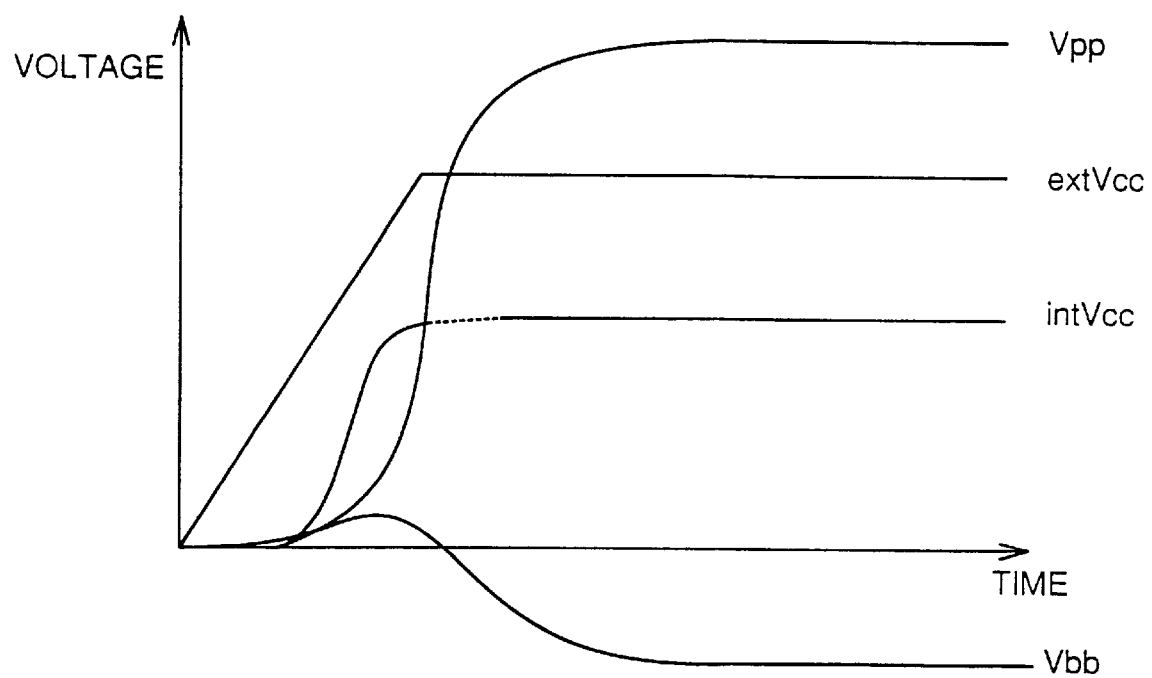
FIG. 72 shows timings at which boosted potential generating circuit, internal power supply potential generating circuit and substrate potential generating circuit start operation in a general semiconductor device having a boosted potential generating circuit, an internal power supply potential generating circuit and a substrate potential generating circuit.

FIG. 72 is a timing chart showing the start of operation of boosted potential generating circuit, internal power supply potential generating circuit and substrate potential generating circuit in a general semiconductor device including the boosted potential generating circuit, the internal power supply potential generating circuit and the substrate potential generating circuit. In FIG. 72, the ordinate represents voltage and the abscissa represents time.

Referring to FIG. 72, in a common semiconductor device, first, an external power supply potential extVcc is input. Upon reception of the external power supply potential extVcc, internal power supply potential generating circuit starts its operation, and generates an internal power supply potential intVcc. Upon reception of the internal power supply potential intvcc, the boosted potential generating circuit starts its operation, and start to generate the boosted potential Vpp. Meanwhile, the substrate potential generating circuit also starts its operation in response to the internal power supply potential intVcc, to generate substrate potential Vpp.

Here, when the external power supply potential extVcc is input, the substrate potential Vbb increases in response, though the operation of the substrate potential generating circuit is not started yet. Therefore, if the boosted potential generating circuit starts its operation and generates the boosted potential Vpp at the time point when the substrate potential Vbb has already increased (at which the substrate potential Vbb is positive), it is possible that the transistor constituting the semiconductor substrate is broken. The semiconductor device in accordance with the twenty-first embodiment was made to solve such a problem.

Figure 73:
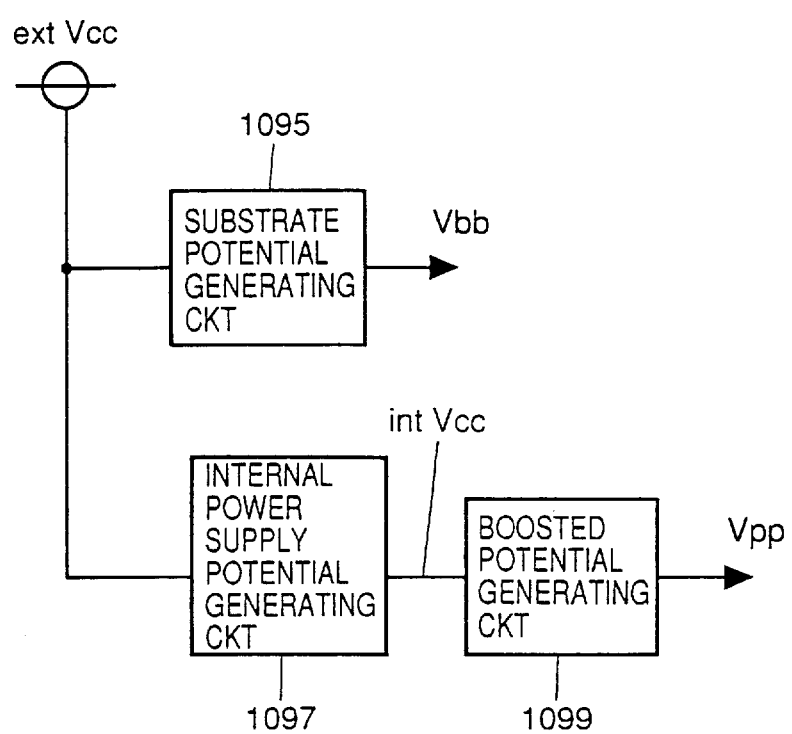
FIG. 73 is a schematic block diagram showing a semiconductor device in accordance with a twenty-first embodiment of the present invention.

FIG. 73 is a block diagram schematically showing the semiconductor device in accordance with the twenty-first embodiment.

Referring to FIG. 73, the semiconductor device in accordance with the twenty-first embodiment includes substrate potential generating circuit 1095, internal power supply potential generating circuit 1097, and boosted potential generating circuit 1099.

Substrate potential generating circuit 1095 starts its operation upon reception of external power supply potential extVcc, and generates the substrate potential Vbb. Internal power supply potential generating circuit 1097 starts its operation upon reception of external power supply potential extVcc, and generates internal power supply potential intVcc. The boosted potential generating circuit 1099 starts its operation upon reception of internal power supply potential intVcc, and generates the boosted potential Vpp.

Figure 74:
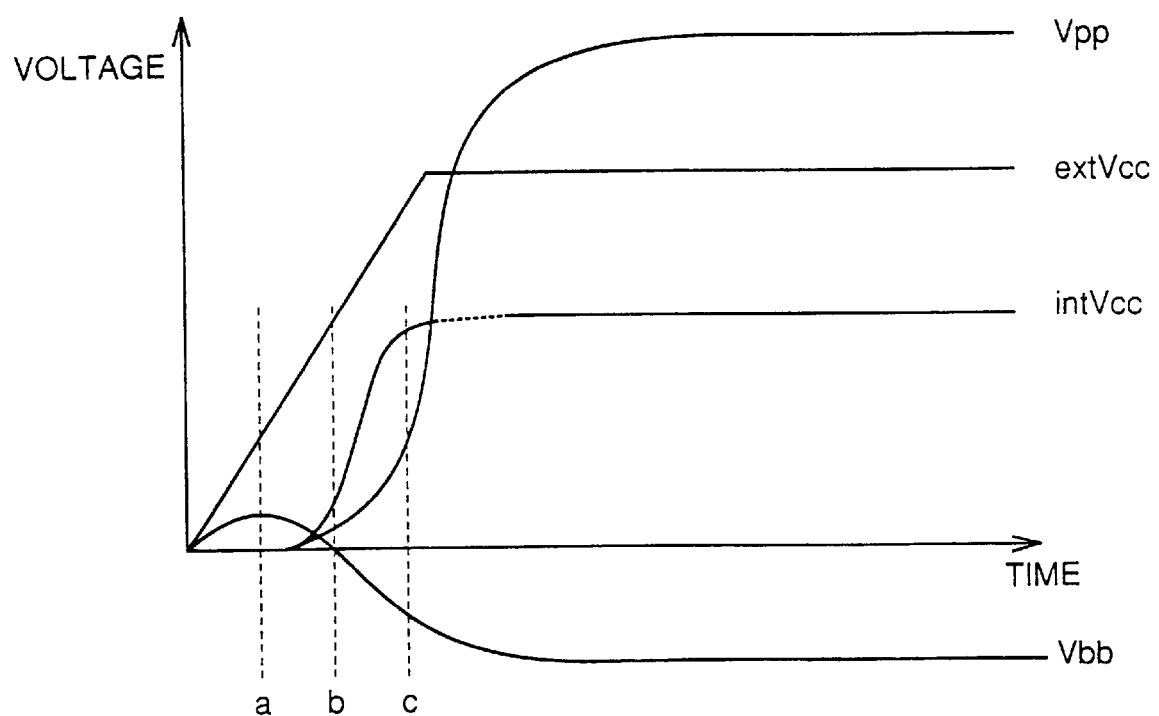
FIG. 74 shows timings when substrate potential generating circuit, internal power supply potential generating circuit and boosted potential generating circuit included in the semiconductor device of FIG. 73 start operation.

FIG. 74 is a timing chart showing the timings at which substrate potential generating circuit 1095, internal power supply potential generating circuit 1097 and boosted potential generating circuit 1099 constituting the semiconductor substrate of FIG. 73 start their operation. Referring to FIG. 74, the ordinate represents voltage and abscissa represents time.

First, external power supply potential extVcc is input to the semiconductor device. In response, the substrate potential of the semiconductor device increases. At time a, the substrate potential generating circuit starts its operation based on the external power supply potential extVcc. Then, it generates substrate potential Vbb and, with time, the substrate potential Vbb becomes negative.

After the start of operation of substrate potential generating circuit 1095, internal power supply potential generating circuit 1097 starts its operation, and at time b, internal power supply potential intVcc starts to increase rapidly.

Then, the boosted potential generating circuit 1099 starts its operation upon reception of the internal power supply potential intVcc from internal power supply potential generating circuit 1097, and at time c, the boosted potential Vpp starts to increase rapidly.

As described above, in the semiconductor device in accordance with the twenty-first embodiment, the substrate potential generating circuit 1095 is operated based on the external power supply potential extVcc, and the boosted potential generating circuit 1099 is operated based on the internal power supply potential intVcc from internal power supply potential generating circuit 1097. Therefore, boosted potential generating circuit 1099 operates following the substrate potential generating circuit 1095. Therefore, a large boosted potential Vpp is never applied to the semiconductor device while the substrate potential Vbb is positive. In other words, large boosted potential Vpp is not applied to the semiconductor device until the substrate potential Vbb attains sufficiently negative. Therefore, breakdown of the transistor constituting the semiconductor device can be prevented. Therefore, reliability of the semiconductor device can be improved in accordance with the twenty-first embodiment.

The lowered potential generating circuit shown in FIGS. 12, 15, 32 and 34 may be used as the substrate potential generating circuit 1095 of FIG. 73. Further, the boosted potential generating circuit shown in FIGS. 10, 14, 27, 30, 70 and 71 may be used as a boosted potential generating circuit 1099 of FIG. 73.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level converting circuit, comprising:
   (a) level shift means responsive to a signal at a first level for outputting a signal at a second level, including
      an input portion connected between a first node supplying a potential of said second level and a second node supplying a potential of a third level, to which the signal at said first level is input, and an output portion connected between said first node and said second node, responsive to the input of said signal at said first level to said input portion for outputting the signal at said second level, said input portion or said output portion being rendered to a state in which a through current flows, in response to transition of the signal at said first level;

(b) first current turn off means connected between said level shift means and said first node; and (c) second current turn off means connected between said level shift means and said second node; wherein said first current turn off means opens a current path between said first node and said input portion before said signal at said first level is input, and opens a current path between said first node and said output portion before the input of the signal at said first level is stopped, and said second current turn off means opens a current path between said second node and said output portion before the signal at said first level is input and opens a current path between said second node and said input portion before the input of the signal at said first level is stopped.

2. The level converting circuit according to claim 1, wherein said input portion includes a transistor of a first conductivity type for the input portion, and a transistor of a second conductivity type for the input portion connected in series to the transistor of the first conductivity type for the input portion and receiving at its control electrode said signal at said first level, the transistor of the first conductivity type for the input portion and the transistor of the second conductivity type for the input portion turning simultaneously on at a transistion of said signal at the first level;

said output portion includes a transistor of the first conductivity type for the output portion, and a transistor of the second conductivity type for the output portion connected in series to the transistor of the first conductivity type for the output portion and receiving at its control electrode a signal obtained by inverting said signal at the first level, said transistor of the first conductivity type for the output portion and said transistor of the second conductivity type for the output portion turning simultaneously on at a transition of said signal at the first level;

said first current turn off means includes a transistor of the first conductivity type for turning off current at the input portion connected between said first node and one electrode of said transistor of the first conductivity type for the input portion, and a transistor of the first conductivity type for turning off current at the output portion connected between said first node and one electrode of said transistor of the first conductivity type for the output portion;

said second current turn off means includes a transistor of the second conductivity type for turning off current at the input portion connected between said second node and one electrode of said transistor of the second conductivity type for the input portion, and a transistor of the second conductivity type for turning off current at the output portion connected between said second node and one electrode of said transistor of the second conductivity type for the output portion;

said transistor of the first conductivity type for turning off current at the input portion and said transistor of the second conductivity type for turning off current at the output portion are turned off before said signal at the first level is input to said transistor of the second conductivity type for the input portion; and said transistor of the first conductivity type for turning off current at the output portion and said transistor of the second conductivity type for turning off current at the input portion are turned off before the input of said signal at the first level to the transistor of the second conductivity type for the input portion is stopped.

3. The level converting circuit according to claim 2, wherein said first current turn off means further includes first input portion potential setting means for setting potential at a node between said transistor of the first conductivity type for turning off current at the input portion and said transistor of the first conductivity type for the input portion, and first output portion potential setting means for setting a potential at a node between said transistor of the first conductivity type for turning off current at the output portion and said transistor of the first conductivity type for the output portion; and said second current turn off means includes second input portion potential setting means for setting a potential at a node between said transistor of the second conductivity type for turning off current at the input portion and said transistor of the second conductivity type for the input portion, and second output portion potential setting means for setting potential at a node between said transistor of the second conductivity type for turning off current at the output portion and said transistor of the second conductivity type for the output portion.

4. The level converting circuit according to claim 3, wherein said first input portion potential setting means is a first resistor for the input portion connected parallel to said transistor of the first conductivity type for turning off current at the input portion;

said first output portion potential setting means is a first resistor for the output portion connected parallel to said transistor of the first conductivity type for turning off current at the output portion;

said second input portion potential setting means is a second resistor for the input portion connected parallel to said transistor of the second conductivity type for turning off current at the input portion; and said second output portion potential setting means is a second resistor for the output portion connected parallel to said transistor of the second conductivity type for turning off current at the output portion.

5. The level converting circuit according to claim 3, wherein said first input portion potential setting means is a transistor of the first conductivity type connected parallel to said transistor of the first conductivity type for turning off current at the input portion;

said first output portion potential setting means is a transistor of the first conductivity type connected parallel to said transistor of the first conductivity type for turning off current at the output portion;

said second input portion potential setting means is a transistor of the second conductivity type connected parallel to said transistor of the second conductivity type for turning off current at the input portion; and said second output portion potential setting means is a transistor of the second conductivity type connected parallel to said transistor of the second conductivity type for turning off current at the output portion.

6. The level converting circuit according to claim 1, further comprising:

delay means for inputting said signal at the first level with a delay to said input portion; wherein said first current turn off means opens a current path between said first node and said input portion in response to input of said signal at the first level without delay to said first current turn off means, and opens a current path between said first node and said output portion in response to stop of the input of said signal at the first level without delay to said first current turn off means; and said second current turn off means opens a current path between said second node and said output portion in response to input of said signal at the first level without delay to said second current turn off means, and opens a current path between said second node and said input portion in response to stop of the input of said signal at the first level without delay to said second current turn off means.

7. The level converting circuit according to claim 6, wherein said input portion includes
a transistor of a first conductivity type for the input portion, and
a transistor of a second conductivity type for the input portion connected in series to said transistor of the first conductivity type for the input portion and receiving at its control electrode said delayed signal at the first level,
said transistor of the first conductivity type for the input portion and said transistor of the second conductivity type for the input portion turning simultaneously on at a transition of said signal at the first level;

said output portion includes
a transistor of the first conductivity type for the output portion, and
a transistor of the second conductivity type for the output portion connected in series to said transistor of the first conductivity type for the output portion and receiving at its control electrode a signal obtained by inverting said delayed signal at the first level,
said transistor of the first conductivity type for the output portion and said transistor of the second conductivity type for the output portion turning simultaneously on at a transition of said signal at the first level;

said first current turn off means includes
a transistor of the first conductivity type for turning off current at the input portion connected between said first node and one electrode of said transistor of the first conductivity type for the input portion, and
a transistor of the first conductivity type for turning off current at the output portion connected between said first node and one electrode of said transistor of the first conductivity type for the output portion;

said second current turn off means includes
a transistor of the second conductivity type for turning off current at the input portion connected between said second node and one electrode of said transistor of the second conductivity type for the input portion, and
a transistor of the second conductivity type for turning off current at the output portion connected between said second node and one electrode of said transistor of the second conductivity type for the output portion;

said transistor of the first conductivity type for turning off current at the input portion and said transistor of the second conductivity type for turning off current at the output portion are turned off in response to said signal at the first level without delay, and said transistor of the first conductivity type for turning off current at the output portion and said transistor of the second conductivity type for turning off current at the input portion are turned off in response to stop of input of said signal at the first level without delay.

8. A level converting circuit, comprising:

(a) level shift means responsive to a signal at a first level for outputting a signal at a second level, including
an input portion connected between a first node supplying a potential of said second level and a second node supplying a potential of a third level, to which said signal at the first level is input, and
an output portion connected between said first node and said second node, for outputting said signal at the second level in response to input of said signal at the first level to said input portion,
said input portion or said output portion being rendered to a state in which a through current flows in response to transition of said signal at the first level;

(b) first current turn off means connected between said level shift means and said first node; and (c) second current turn off means connected between said level shift means and said second node; wherein said first current turn off means opens a current path between said first node and said input portion when said signal at the first level is input, and opens a current path between said first node and said output portion when input of said signal at the first level is stopped, and said second current turn off means opens a current path between said second node and said output portion when said signal at the first level is input, and opens a current path between said second node and said input portion when input of said signal at the first level is stopped.

9. The level converting circuit according to claim 8, wherein said input portion includes
a transistor of a first conductivity type for the input portion,
and a transistor of a second conductivity type for the input portion connected in series to the transistor of the first conductivity type for the input portion and receiving at its control electrode said signal at said first level,
the transistor of the first conductivity type for the input portion and the transistor of the second conductivity type for the input portion turning simultaneously on at a transition of said signal at the first level;

said output portion includes
a transistor of the first conductivity type for the output portion, and a transistor of the second conductivity type for the output portion connected in series to the transistor of the first conductivity type for the output portion and receiving at its control electrode a signal obtained by inverting said signal at the first level, said transistor of the first conductivity type for the output portion and said transistor of the second conductivity type for the output portion turning simultaneously on at a transition of said signal at the first level;

said first current turn off means includes a transistor of the first conductivity type for turning off current at the input portion connected between said first node and one electrode of said transistor of the first conductivity type for the input portion, and a transistor of the first conductivity type for turning off current at the output portion connected between said first node and one electrode of said transistor of the first conductivity type for the output portion;

said second current turn off means includes a transistor of the second conductivity type for turning off current at the input portion connected between said second node and one electrode of said transistor of the second conductivity type for the input portion, and a transistor of the second conductivity type for turning off current at the output portion connected between said second node and one electrode of said transistor of the second conductivity type for the output portion;

said transistor of the first conductivity type for turning off current at the input portion and said transistor of the second conductivity type for turning off current at the output portion are turned off when said signal at the first level is input to said transistor of the second conductivity type for the input portion; and said transistor of the first conductivity type for turning off current at the output portion and said transistor of the second conductivity type for turning off current at the input portion are turned off when the input of said signal at the first level to the transistor of the second conductivity type for the input portion is stopped.

10. The level converting circuit according to claim 9, wherein said first current turn off means further includes first input portion potential setting means for setting potential at a node between said transistor of the first conductivity type for turning off current at the input portion and said transistor of the first conductivity type for the input portion, and first output portion potential setting means for setting a potential at a node between said transistor of the first conductivity type for turning off current at the output portion and said transistor of the first conductivity type for the output portion; and said second current turn off means includes second input portion potential setting means for setting a potential at a node between said transistor of the second conductivity type for turning off current at the input portion and said transistor of the second conductivity type for the input portion, and second output portion potential setting means for setting potential at a node between said transistor of the second conductivity type for turning off current at the output portion and said transistor of the second conductivity type for the output portion.

11. The level converting circuit according to claim 10, wherein said first input portion potential setting means is a first resistor for the input portion connected parallel to said transistor of the first conductivity type for turning off current at the input portion;

said first output portion potential setting means is a first resistor for the output portion connected parallel to said transistor of the first conductivity type for turning off current at the output portion;

said second input portion potential setting means is a second resistor for the input portion connected parallel to said transistor of the second conductivity type for turning off current at the input portion; and said second output portion potential setting means is a second resistor for the output portion connected parallel to said transistor of the second conductivity type for turning off current at the output portion.

12. The level converting circuit according to claim 10, wherein said first input portion potential setting means is a transistor of the first conductivity type connected parallel to said transistor of the first conductivity type for turning off current at the input portion;

said first output portion potential setting means is a transistor of the first conductivity type connected parallel to said transistor of the first conductivity type for turning off current at the output portion;

said second input portion potential setting means is a transistor of the second conductivity type connected parallel to said transistor of the second conductivity type for turning off current at the input portion; and said second output portion potential setting means is a transistor of the second conductivity type connected parallel to said transistor of the second conductivity type for turning off current at the output portion.

13. An internal potential generating circuit, comprising:

(a) level converting means responsive to a signal at a first level input as a pulse for outputting a signal at a second level as a pulse, said level converting means being connected between a first node having a potential at the second level serving as a supply source of said signal at the second level output therefrom and a second node having a potential at a third level and including level shift means for outputting said signal at the second level in response to said signal at the first level, said level shift means including an input portion to which said signal at the first level is input, and an output portion for outputting said signal at the second level in response to input of said signal at the first level to said input portion, said input portion or said output portion being rendered to a state in which a through current flows in response to transition of said signal at the first level, said level converting means further including first current turn off means connected between said level shift means and said first node, and second current turn off means connected between said level shift means and said second node, wherein said first current turn off means opens a current path between said first node and said input portion before input of said signal at the first level, and opens a current path between said first node and said output portion before input of said signal at the first level is stopped, and said second current turn off means opens a current path between said second node and said output portion before input of said signal at the first level, and opens a current path between said second node and said input portion before input of said signal at the first level is stopped;

said internal potential generating circuit further comprising:

(b) pumping means for intermittently outputting charges in response to said signal at the second level output as a pulse from said level converting means, a third node, which is an output node of said pumping means, being set to said second level as an internal potential by said charges output intermittently, said first node and said third node being connected to each other, said pumping means including a charge transmitting transistor having its control electrode connected to a fourth node of which potential changes in response to said signal at the second level output as a pulse from said level converting means, said charge transmitting transistor being turned on when the potential at said fourth node attains to a fourth level in response to an output of said signal at the second level., for outputting said charges to said third node, absolute value of difference between said fourth level potential and said second level potential being greater than absolute value of threshold voltage of said charge transmitting transistor.

14. The internal potential generating circuit according to claim 13, wherein said pumping means includes at least one capacitor for charge pumping, and at least one potential fixing MOS transistor for fixing at least one node at a prescribed potential, wherein said capacitor is an MOS transistor, and said capacitor, said potential fixing MOS transistor or said charge transmitting transistor has first and second electrodes formed directly at a semiconductor substrate without forming a well.

15. The internal potential generating circuit according to claim 13, wherein said pumping means includes a capacitor for charge pumping, and said capacitor is a depletion transistor.

16. The internal potential generating circuit according to claim 15, wherein said depletion transistor has first and second electrodes formed directly at a semiconductor substrate without forming a well.

17. The internal potential generating circuit according to claim 13, wherein said pumping means includes potential determining means for determining potential at said fourth node such that absolute value of potential change at said fourth node, of which potential changes in response to said signal at the second level output as a pulse from said level converting means, is smaller than a prescribed value.

18. The internal potential generating circuit according to claim 17, wherein said potential determining means is at least one transistor connected in series between said third node and said fourth node, said at least one transistor being diode connected.

19. The internal potential generating circuit according to claim 18, wherein said transistor includes a highly doped portion in a region containing impurity, formed through the steps of forming an insulating film on a sidewall of its control electrode by anisotropic etching, forming a resist on a surface of the region containing impurity not covered by the insulating film, and introducing said impurity having higher concentration than said region containing the impurity, to said region containing impurity not provided with said resist.

20. The internal potential generating circuit according to claim 13, wherein said pumping means includes a transistor having one electrode connected to a fourth node of which potential changes in response to said signal at the second level output as a pulse from said level converting means, and said transistor withstands repeated application of the potential at said fourth level to said one electrode connected to said fourth node.

21. The internal potential generating circuit according to claim 20, wherein said transistor includes a highly doped portion in a region containing impurity, formed through the steps of forming an insulating film on a sidewall of its control electrode by anisotropic etching, forming a resist on a surface of the region containing impurity not covered by the insulating film, and introducing said impurity having higher concentration than said region containing the impurity, to said region containing impurity not provided with said resist.

22. An internal potential generating circuit, comprising:

(a) level converting means responsive to a signal at a first level input as a pulse for outputting a signal at a second level as a pulse, said level converting means being connected between a first node having a potential at the second level serving as a supply source of said signal at the second level output therefrom and a second node having a potential at a third level, and including level shift means for outputting said signal at the second level in response to said signal at the first level, said level shift means including an input portion to which said signal at the first level is input, and an output portion for outputting said signal at the second level in response to input of said signal at the first level to said input portion, said input portion or said output portion being rendered to a state in which a through current flows in response to transition of said signal at the first level, said level converting means further including first current turn off means connected between said level shift means and said first node, and second current turn off means connected between said level shift means and said second node, wherein said first current turn off means opens a current path between said first node and said input portion when said signal at the first level is input, and opens a current path between said first node and said output portion when input of said signal at the first level is stopped, and said second current turn off means opens a current path between said second node and said output portion when said signal at the first level is input, and opens a current path between said second node and said input portion before input of said signal at the first level is stopped;

said internal potential generating circuit further comprising:

(b) pumping means for intermittently outputting charges in response to said signal at the second level output as a pulse from said level converting means, a third node, which is an output node of said pumping, means being set to said second level as an internal potential by said charges output intermittently, said first node and said third node being connected to each other, said pumping means including a charge transmitting transistor having its control electrode connected to a fourth node of which potential changes in response to said signal at the second level output as a pulse from said level converting means, said charge transmitting transistor being turned on when the potential at said fourth node attains to a fourth level in response to an output of said signal at the second level, for outputting said charges to said third node, absolute value of difference between said fourth level potential and said second level potential being greater than absolute value of threshold voltage of said charge transmitting transistor.

23. The internal potential generating circuit according to claim 22, wherein said pumping means includes potential determining means for determining potential at said fourth node such that absolute value of potential change at said fourth node, of which potential changes in response to said signal at the second level output as a pulse from said level converting means, is smaller than a prescribed value.

24. The internal potential generating circuit according to claim 23, wherein said potential determining means is at least one transistor connected in series between said third node and said fourth node, said at least one transistor being diode connected.

25. The internal potential generating circuit according to claim 24, wherein said transistor includes a highly doped portion in a region containing impurity, formed through the steps of forming an insulating film on a sidewall of its control electrode by anisotropic etching, forming a resist on a surface of the region containing impurity not covered by the insulating film, and introducing said impurity having higher concentration than said region containing the impurity, to said region containing impurity not provided with said resist.

26. The internal potential generating circuit according to claim 22, wherein said pumping means includes a transistor having one electrode connected to a fourth node of which potential changes in response to said signal at the second level output as a pulse from said level converting means, and said transistor withstands repeated application of the potential at said fourth level to said one electrode connected to said fourth node.

27. The internal potential generating circuit according to claim 26, wherein said transistor includes a highly doped portion in a region containing impurity, formed through the steps of forming an insulating film on a sidewall of its control electrode by anisotropic etching, forming a resist on a surface of the region containing impurity not covered by the insulating film, and introducing said impurity having higher concentration than said region containing the impurity, to said region containing impurity not provided with said resist.

28. The internal potential generating circuit according to claim 22, wherein said pumping means includes at least one capacitor for charge pumping, and at least one potential fixing MOS transistor for fixing at least one node at a prescribed potential, wherein said capacitor is an MOS transistor, and said capacitor, said potential fixing MOS transistor or said charge transmitting transistor has first and second electrodes formed directly at a semiconductor substrate without forming a well.

29. The internal potential generating circuit according to claim 22, wherein said pumping means includes a capacitor for charge pumping, and said capacitor is a depletion transistor.

30. The internal potential generating circuit according to claim 29, wherein said depletion transistor has first and second electrodes formed directly at a semiconductor substrate without forming a well.

31. An internal potential generating circuit, comprising:

(a) level converting means responsive to a signal at a first level input as a pulse for outputting a signal at a second level as a pulse, connected between a first node having a potential at said second level serving as a supply source of said signal at the second level output therefrom, and a second node having a potential at a third level, said level converting means including an input portion connected between said first node and said second node, to which said signal at the first level is input, and an output portion connected between said first node and said second node, for outputting said signal at the second level in response to input of said signal at the first level to said input portion, said input portion including a transistor of a first conductivity type for the input portion having one electrode connected to said first node, a transistor of a second conductivity type for the input portion having one electrode connected to said second node and receiving at its control electrode said signal at the first level, first current turn off means for the input portion connected between another electrode of said transistor of the first conductivity type for the input portion and a third node, and second current turn off means for the input portion connected between another electrode of said transistor of the second conductivity type for the input portion and said third node, wherein said first current turn off means for the input portion opens a current path between said transistor of first conductivity type for the input portion and said third node before said signal at the first level is input, and conducts said transistor of the first conductivity type for the input portion and said third node before input of said signal at the first level is stopped, and said second current turn off means for the input portion opens a current path between said transistor of the second conductivity type for the input portion and said third node before input of said signal at the first level is stopped, and conducts said transistor of the second conductivity type for the input portion and said third node before said signal at the first level is input, said output portion including
a transistor of the first conductivity type for the output portion having one electrode connected to said first node,
a transistor of the second conductivity type for the output portion having one electrode connected to said second node and receiving at its control electrode, a signal obtained by inverting said signal at the first level,
first current turn off means for the output portion connected between another electrode of said transistor of the first conductivity type for the output portion and a fourth node, and
second current turn off means for the output portion connected between another electrode of said transistor of the second conductivity type for the output portion and said fourth node, wherein
said first current turn off means for the output portion opens a current path between said transistor of a first conductivity type for the output portion and said fourth node before input of said signal at the first level is stopped, and conducts said transistor of the first conductivity type for the output portion and said fourth node before said signal at the first level is input,
said second current turn off means for the output portion opens a current path between said transistor of the second conductivity type for the output portion and the fourth node before said signal at the first level is input and conducts said transistor of the second conductivity type for the output portion and said fourth node before input of said signal at the first level is stopped,
said transistor of the first conductivity type for the input portion having its control electrode connected to said fourth node,
said transistor of the first conductivity type for the output portion having its control electrode connected to said third node, said internal potential generating circuit further comprising:
(b) pumping means responsive to said signal at the second level output as a pulse from said level converting means, for intermittently outputting charges,
a fifth node, which is an output node of said pumping means, being set to said second level as an internal potential by said charge intermittently output,
said first node and said fifth node being connected to each other,
said pumping means including
a charge transmitting transistor having its control electrode connected to a sixth node of which potential changes in response to said signal at the second level output as a pulse from said level converting means,
said charge transmitting transistor turning on when potential at said sixth node attains to a fourth level in response to the output of said signal at the second level, for outputting said charges to said fifth node,
absolute value of difference between said fourth level potential and said second level potential being greater than absolute value of threshold voltage of said charge transmitting transistor.

32. The internal potential generating circuit according to claim 31, wherein
said pumping means includes potential determining means for determining potential at said sixth node such that absolute value of potential change of said sixth node, of which potential changes in response to said signal at the second level output as a pulse from said level converting means, is smaller than a prescribed value.

33. The internal potential generating circuit according to claim 32, wherein
said potential determining means is at least one transistor connected in series between said fifth and sixth nodes, said at least one transistor being diode connected.

34. The internal potential generating circuit according to claim 33, wherein
said transistor includes a highly doped portion in a region containing impurity, formed through the steps of
forming an insulating film on a sidewall of its control electrode by anisotropic etching, forming a resist on a surface of the region containing impurity not covered by the insulating film, and introducing said impurity having higher concentration than said region containing the impurity, to said region containing impurity not provided with said resist.

35. The internal potential generating circuit according to claim 31, wherein
said pumping means includes a transistor having one electrode connected to a sixth node of which potential changes in response to said signal at the second level output as a pulse from said level converting means, and
said transistor withstands repeated application of a potential at said fourth level to said one electrode connected to said sixth node.

36. The internal potential generating circuit according to claim 35, wherein
said transistor includes a highly doped portion in a region containing impurity, formed through the steps of
forming an insulating film on a sidewall of its control electrode by anisotropic etching, forming a resist on a surface of the region containing impurity not covered by the insulating film, and introducing said impurity having higher concentration than said region containing the impurity, to said region containing impurity not provided with said resist.

37. The internal potential generating circuit according to claim 31, wherein
said pumping means includes
at least one capacitor for charge pumping, and
at least one potential fixing MOS transistor for fixing at least one node at a prescribed potential, wherein
said capacitor is an MOS transistor, and
said capacitor, said potential fixing MOS transistor or said charge transmitting transistor has first and second electrodes formed directly at a semiconductor substrate without forming a well.

38. The internal potential generating circuit according to claim 31, wherein said pumping means includes a capacitor for charge pumping, and said capacitor is a depletion transistor.

39. The internal potential generating circuit according to claim 38, wherein said depletion transistor has first and second electrodes formed directly at a semiconductor substrate without forming a well.

40. An internal potential generating circuit, comprising:

(a) level converting means responsive to a signal at a first level input as a pulse for outputting a signal at a second level as a pulse, connected between a first node having a potential at said second level serving as a supply source of said signal at the second level output therefrom, and a second node having a potential at a third level, said level converting means including an input portion connected between said first node and said second node, to which said signal at the first level is input, and an output portion connected between said first node and said second node, for outputting said signal at the second level in response to input of said signal at the first level to said input portion, said input portion including a transistor of a first conductivity type for the input portion having one electrode connected to said first node, a transistor of a second conductivity type for the input portion having one electrode connected to said second node and receiving at its control electrode said signal at the first level, first current turn off means for the input portion connected between another electrode of said transistor of the first conductivity type for the input portion and a third node, and second current turn off means for the input portion connected between another electrode of said transistor of the second conductivity type for the input portion and said third node, wherein said first current turn off means for the input portion opens a current path between said transistor of the first conductivity type for the input portion and said third node when said signal at the first level is input, and conducts said transistor of the first conductivity type for the input portion and said third node when input of said signal at the first level is stopped, and said second current turn off means for the input portion opens a current path between said transistor of the second conductivity type for the input portion and said third node when input of said signal at the first level is stopped, and conducts said a transistor of the second conductivity type for the input portion and said third node when said signal at the first level is input, said output portion including a transistor of the first conductivity type for the output portion having one electrode connected to said first node, a transistor of the second conductivity type for the output portion having one electrode connected to said second node and receiving at its control electrode, a signal obtained by inverting said signal at the first level, first current turn off means for the output portion connected between another electrode of said transistor of the first conductivity type for the output portion and a fourth node, and second current turn off means for the output portion connected between another electrode of said transistor of the second conductivity type for the output portion and said fourth node, wherein said first current turn off means for the output portion opens a current path between said transistor of the first conductivity type for the output portion and said fourth node when input of said signal at the first level is stopped, and conducts said transistor of the first conductivity type for the output portion and said fourth node when said signal at the first level is input, said second current turn off means for the output portion opens a current path between said transistor of the second conductivity type for the output portion and the fourth node when said signal at the first level is input and conducts said transistor of the second conductivity type for the output portion and said fourth node when input of said signal at the first level is stopped, said transistor of the first conductivity type for the input portion having its control electrode connected to said fourth node, said transistor of the first conductivity type for the output portion having its control electrode connected to said third node;

said internal potential generating circuit further comprising:

(b) pumping means responsive to said signal at the second level output as a pulse from said level converting means, for intermittently outputting charges, a fifth node, which is an output node of said pumping means, being set to said second level as an internal potential by said charge intermittently output, said first node and said fifth node being connected to each other, said pumping means including a charge transmitting transistor having its control electrode connected to a sixth node of which potential changes in response to said signal at the second level output as a pulse from said level converting means, said charge transmitting transistor turning on when potential at said sixth node attains to a fourth level in response to the output of said signal at the second level, for outputting said charges to said fifth node, absolute value of difference between said fourth level potential and said second level potential being greater than absolute value of threshold voltage of said charge transmitting transistor.

41. The internal potential generating circuit according to claim 40, wherein said pumping means includes potential determining means for determining potential at said sixth node such that absolute value of potential change of said sixth node, of which potential changes in response to said signal at the second level output as a pulse from said level converting means, is smaller than a prescribed value.

42. The internal potential generating circuit according to claim 41, wherein
said potential determining means is at least one transistor connected in series between said fifth and sixth nodes, said at least one transistor being diode connected.

43. The internal potential generating circuit according to claim 42, wherein
said transistor includes a highly doped portion in a region containing impurity, formed through the steps of
forming an insulating film on a sidewall of its control electrode by anisotropic etching, forming a resist on a surface of the region containing impurity not covered by the insulating film, and introducing said impurity having higher concentration than said region containing the impurity, to said region containing impurity not provided with said resist.

44. The internal potential generating circuit according to claim 40, wherein
said pumping means includes a transistor having one electrode connected to a sixth node of which potential changes in response to said signal at the second level output as a pulse from said level converting means, and
said transistor withstands repeated application of a potential at said fourth level to said one electrode connected to said sixth node.

45. The internal potential generating circuit according to claim 44, wherein
said transistor includes a highly doped portion in a region containing impurity, formed through the steps of
forming an insulating film on a sidewall of its control electrode by anisotropic etching, forming a resist on a surface of the region containing impurity not covered by the insulating film, and introducing said impurity having higher concentration than said region containing the impurity, to said region containing impurity not provided with said resist.

46. The internal potential generating circuit according to claim 40, wherein
said pumping means includes
at least one capacitor for charge pumping, and
at least one potential fixing MOS transistor for fixing at least one node at a prescribed potential, wherein
said capacitor is an MOS transistor, and
said capacitor, said potential fixing MOS transistor or said charge transmitting transistor has first and second electrodes formed directly at a semiconductor substrate without forming a well.

47. The internal potential generating circuit according to claim 40, wherein
said pumping means includes a capacitor for charge pumping, and
said capacitor is a depletion transistor.

48. The internal potential generating circuit according to claim 47, wherein
said depletion transistor has first and second electrodes formed directly at a semiconductor substrate without forming a well.

49. An internal potential generating unit, comprising:
first internal potential generating means for outputting a first internal potential at a first node;
second internal potential generating means for outputting a second internal potential at said first node;
first driving signal generating means for generating, as a pulse, a first driving signal for driving said first internal potential generating means;
second driving signal generating means for generating, as a pulse, a second driving signal for driving said second internal potential generating means; and
control signal generating means for generating a control signal for controlling said second driving signal generating means; wherein
said second driving signal generating means controls generation of said second driving signal in accordance with said control signal.

50. An internal potential generating unit, comprising:
first internal potential generating means for outputting a first internal potential at a first node;
second internal potential generating means for outputting a second internal potential at said first node;
driving signal generating means for generating a driving signal for driving said first and second internal potential generating means; and
control means for controlling driving of said second internal potential generating means by generating a control signal controlling input of said driving signal to said second internal potential generating means.

51. A level converting circuit responsive to a signal at a first level for outputting a signal at a second level, comprising:
an input portion connected between a first node supplying a potential at said second level and a second node supplying a potential at a third level to which said signal at the first level is input;
an output portion connected between said first node and said second node, for outputting said signal at the second level in response to input of said signal at the first level to said input portion; wherein
said input portion includes
a transistor of a first conductivity type for the input portion having one electrode connected to said first node,
a transistor of a second conductivity type for the input portion having one electrode connected to said second node and receiving at its control electrode said signal at the first level,
first current turn off means connected between another electrode of said transistor of the first conductivity type for the input portion and a third node, and
second current turn off means connected between another electrode of said transistor of the second conductivity type for the input portion and said third node,
said first current turn off means for the input portion turning off a current path between said transistor of the first conductivity type for the input portion and said third node before said signal at the first level is input, and conducting said transistor of the first conductivity type for the input portion and said third node before input of said signal at the first level is stopped,
said second current turn off means for the input portion turning off a current path between said transistor of the second conductivity type for the input portion and said third node before input of said signal at the first level is stopped and conducting said transistor of the second conductivity type for the input portion and said third node before said signal at the first level is input;
said output portion includes
a transistor of the first conductivity type for the output portion having one electrode connected to said first node, a transistor of the second conductivity type for the output portion having one electrode connected to said second node and receiving at its control electrode a signal obtained by inverting said signal at the first level, first current turn off means connected between another electrode of said transistor of the first conductivity type for the output portion and a fourth node, and second current turn off means connected between another electrode of said transistor of the second conductivity type for the output portion and said fourth node, said first current turn off means for the output portion turning off a current path between said transistor of the first conductivity type for the output portion and said fourth node before input of said signal at the first level is stopped, and conducting said transistor of the first conductivity type for the output portion and said fourth node before said signal at the first level is input, said second current turn off means for the output portion turning off a current path between said transistor of the second conductivity type for the output portion and said fourth node before said signal at the first level is input, and conducting said transistor of the second conductivity type for the output portion and said fourth node before input of said signal at the first level is stopped; and wherein said transistor of the first conductivity type for the input portion has its control electrode connected to said fourth node, and said transistor of the first conductivity type for the output portion has its control electrode connected to said third node.

52. The level converting circuit according to claim 51, wherein said first current turn off means for the input portion and said first current turn off means for the output portion are each a transistor of the first conductivity type, which turns off when a signal at the fourth level is input to its control electrode and turns on when input of said signal at the fourth level is stopped;

said second current turn off means for the input portion and said second current turn off means for the output portion are each a transistor of the second conductivity type, which turns on when a signal at the fourth level is input to its control electrode and turns off when input of said signal at the fourth level is stopped; and said fourth level signal is input or stopped at an earlier timing than that of said signal at the first level.

53. A level converting circuit responsive to a signal at a first level for outputting a signal at a second level, comprising:

an input portion connected between a first node supplying a potential at said second level and a second node supplying a potential at a third level to which said signal at the first level is input;

an output portion connected between said first node and said second node, for outputting said signal at the second level in response to input of said signal at the first level to said input portion; wherein said input portion includes a transistor of a first conductivity type for the input portion having one electrode connected to said first node, a transistor of a second conductivity type for the input portion having one electrode connected to said second node and receiving at its control electrode said signal at the first level, first current turn off means connected between another electrode of said transistor of the first conductivity type for the input portion and a third node, and second current turn off means connected between another electrode of said transistor of the second conductivity type for the input portion and said third node, said first current turn off means for the input portion turning off a current path between said transistor of the first conductivity type for the input portion and said third node when said signal at the first level is input, and conducting said transistor of the first conductivity type for the input portion and said third node when input of said signal at the first level is stopped, said second current turn off means for the input portion turning off a current path between said transistor of the second conductivity type for the input portion and said third node when input of said signal at the first level is stopped and conducting said transistor of the second conductivity type for the input portion and said third node when said signal at the first level is input;

said output portion includes a transistor of the first conductivity type for the output portion having one electrode connected to said first node, a transistor of the second conductivity type for the output portion having one electrode connected to said second node and receiving at its control electrode a signal obtained by inverting said signal at the first level, first current turn off means for the output portion connected between another electrode of said transistor of the first conductivity type for the output portion and a fourth node, and second current turn off means connected between another electrode of said transistor of the second conductivity type for the output portion and said fourth node, said first current turn off means for the output portion turning off a current path between said transistor of the first conductivity type for the output portion and said fourth node when input of a signal at the first level is stopped, and conducting said transistor of the first conductivity type for the output portion and said fourth node when said signal at the first level is input, said second current turn off means for the output portion turning off a current path between said transistor of the second conductivity type for the output portion and said fourth node when a signal at the first level is input, and conducting said transistor of the second conductivity type for the output portion and said fourth node when input of a signal at the first level is stopped;

and wherein said transistor of the first conductivity type for the input portion has its control electrode connected to said fourth node, and said transistor of the first conductivity type for the output portion has its control electrode connected to said third node.

54. The level converting circuit according to claim 53, wherein said first current turn off means for the input portion and said first current turn off means for the output portion are each a transistor of the first conductivity type, which turns off when a signal at a fourth level is input to its control electrode, and turns on when input of said signal at the fourth level is stopped;

said second current turn off means for the input portion and said second current turn off means for the output portion are each a transistor of the second conductivity type, which turns on when said signal at the fourth level is input to its control electrode and turns off when input of said signal at the fourth level is stopped; and said signal at the fourth level is input or stopped at same timing as said signal at the first level.

* * * * *

UNITED STATES PATENT AND TRADEMARK OFFICE
CERTIFICATE OF CORRECTION

PATENT NO. : 5,844,767
DATED : December 1, 1998
INVENTOR(S) : Komiya et al.

It is certified that error appears in the above-identified patent and that said Letter Patent is hereby corrected as shown below:

On the title page, [54], and Column 1, the title should read -- LEVEL CONVERTING CIRCUIT FOR CONVERTING LEVEL OF AN INPUT SIGNAL, INTERNAL POTENTIAL GENERATING CIRCUIT FOR GENERATING INTERNAL POTENTIAL, INTERNAL POTENTIAL GENERATING UNIT GENERATING INTERNAL POTENTIAL, HIGHLY RELIABLE SEMICONDUCTOR DEVICE AND METHOD OF MANUFACTURING TRANSISTOR HAVING HIGH BREAKDOWN VOLTAGE --.

Claim 22, column 49, lines 14 and 15, change "pumping, means" to -- pumping means, --.

Claim 31, column 50, line 67, after "of", insert -- the --.

Claim 51, col. 56, line 42, delete "turn off" and after "means" insert -- for the output portion --.

Signed and Sealed this

Twenty-ninth Day of June, 1999

Attest:

Q. TODD DICKINSON

*Attesting Officer*   *Acting Commissioner of Patents and Trademarks*